United States Patent
Okazaki et al.

(10) Patent No.: US 8,241,699 B2
(45) Date of Patent: Aug. 14, 2012

(54) DEPOSITION APPARATUS AND METHOD FOR MANUFACTURING FILM BY USING DEPOSITION APPARATUS

(75) Inventors: Sadayuki Okazaki, Osaka (JP); Kazuyoshi Honda, Osaka (JP); Tomofumi Yanagi, Osaka (JP); Shoichi Imashiku, Osaka (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 12/516,328

(22) PCT Filed: Mar. 10, 2008

(86) PCT No.: PCT/JP2008/000519
§ 371 (c)(1),
(2), (4) Date: May 26, 2009

(87) PCT Pub. No.: WO2008/111306
PCT Pub. Date: Sep. 18, 2008

(65) Prior Publication Data
US 2010/0075036 A1    Mar. 25, 2010

(30) Foreign Application Priority Data

| Mar. 9, 2007 | (JP) | 2007-059442 |
| Apr. 11, 2007 | (JP) | 2007-103621 |
| Apr. 11, 2007 | (JP) | 2007-103622 |
| Oct. 22, 2007 | (JP) | 2007-273922 |

(51) Int. Cl.
C23C 16/52 (2006.01)

(52) U.S. Cl. ............... 427/8; 427/9; 427/10; 427/427.2

(58) Field of Classification Search ............... 427/255.5, 427/8, 9, 10, 427.2; 118/718
See application file for complete search history.

(56) References Cited

U.S. PATENT DOCUMENTS

| 4,220,117 A | 9/1980 | Shinohara |
| 7,407,727 B2 | 8/2008 | Sugiyama et al. |
| 2004/0205959 A1* | 10/2004 | Honda et al. ................. 29/623.5 |
| 2007/0031733 A1 | 2/2007 | Kogetsu et al. |
| 2009/0104528 A1 | 4/2009 | Takahashi et al. |

FOREIGN PATENT DOCUMENTS

JP    53-083709    7/1978

(Continued)

*Primary Examiner* — George Koch
(74) *Attorney, Agent, or Firm* — McDermott Will & Emery LLP

(57) ABSTRACT

A vapor deposition device 100 for moving a sheet-like substrate 4 in a roll-to-roll system in a chamber 2 to continuously form a vapor deposition film on the substrate 4. The vapor deposition device 100 comprises an evaporation source 9 for evaporating a vapor-depositing material; a transportation section including first and second rolls 3 and 8 for holding the substrate 4 in the state of being wound therearound and a guide section for guiding the substrate 4; and a shielding section, located in a vapor deposition possible zone, for forming a shielded zone which is not reachable by the vapor-depositing material from the evaporation source 9. Vapor deposition zones 60a through 60d include a planar transportation zone for transporting the substrate 4 such that the surface of the substrate 4 to be subjected to the vapor-depositing material is planar; and the transportation section is located with respect to the evaporation source 9 such that the vapor-depositing material is not incident on the substrate 4 in a direction of the normal to the substrate in the vapor deposition possible zone excluding the shielded zone.

25 Claims, 25 Drawing Sheets

FOREIGN PATENT DOCUMENTS

| | | |
|---|---|---|
| JP | 53-087706 | 8/1978 |
| JP | 58-091533 | 5/1983 |
| JP | 60-113330 | 6/1985 |
| JP | 61-61445 | 12/1986 |
| JP | 62-043837 | 2/1987 |
| JP | 63-113928 | 5/1988 |
| JP | 02-280310 | 11/1990 |
| JP | 03-263312 | 11/1991 |
| JP | 5-004724 | 1/1993 |
| JP | 05-059549 | 3/1993 |
| JP | 06-111310 | 4/1994 |
| JP | 06-111311 | 4/1994 |
| JP | 06-231457 | 8/1994 |
| JP | 06-330292 | 11/1994 |
| JP | 07-109570 | 4/1995 |
| JP | 2704023 | 10/1997 |
| JP | 10-081966 | 3/1998 |
| JP | 10-105964 | 4/1998 |
| JP | 10-130815 | 5/1998 |
| JP | 11-135115 | 5/1999 |
| JP | 2000-195045 | 7/2000 |
| JP | 2002-289180 | 10/2002 |
| JP | 2003-303586 | 10/2003 |
| JP | 2004-127561 | 4/2004 |
| JP | 2005-196970 | 7/2005 |
| JP | 2005-293899 | 10/2005 |
| JP | 2006-073212 | 3/2006 |
| JP | 2007-128659 | 5/2007 |
| JP | 2008-111160 | 5/2008 |
| WO | WO 2007/015419 A1 | 2/2007 |
| WO | WO 2007/052803 A1 | 5/2007 |

\* cited by examiner (a)

(b)

(c)

(a)

(b)

(a)

(b)

(a)

(b)

(a)

(b)

DEPOSITION APPARATUS AND METHOD FOR MANUFACTURING FILM BY USING DEPOSITION APPARATUS

RELATED APPLICATIONS

This application is the U.S. National Phase under 35 U.S.C. §371 of International Application No. PCT/JP2008/000519, filed on Mar. 10, 2008, which in turn claims the benefit of Japanese Application Nos. 2007-059442, filed on Mar. 9, 2007; 2007-103621, filed on Apr. 11, 2007; 2007-103622, filed on Apr. 11, 2007 and 2007-273922, filed on Oct. 22, 2007, the disclosures of which Applications are incorporated by reference herein.

TECHNICAL FIELD

The present invention relates to a vapor deposition device and a method for producing a film using the vapor deposition device.

BACKGROUND ART

Recently, as the mobile devices provide higher and higher level of performances and a wide and wider variety of functions, it has been desired that cells used as power supplies of mobile devices have larger capacities. As a secondary cell fulfilling such a requirement, a nonaqueous electrolytic secondary cell is a target of attention. In order to increase the capacitance of the nonaqueous electrolytic secondary cell, it is proposed to use silicon (Si), germanium (Ge), tin (Sn) or the like as an electrolytic active material (hereinafter, referred to simply as the "active material"). An electrode for a nonaqueous electrolytic secondary cell using such an active material (hereinafter, referred to simply as the "electrode") is generally formed by applying a slurry containing an electrode active material, a binder and the like to a current collector (hereinafter, an electrode thus obtained will be referred to as the "application type electrode"). However, as the charge/discharge operation is repeated, the active material drastically expands or contracts, and as a result, may be pulverized or divided into tiny particles. When the active material is pulverized or divided into tiny particles, the current collectability of the electrode is decreased and also the contact area of the active material and the electrolytic solution is increased. Such an increase of the contact area promotes the decomposition reaction of the electrolytic solution by the active material, which results in a problem that a sufficient charge/discharge cycle characteristic is not obtained. An application type electrode contains a conductor, a binder and the like therein and so it is difficult to increase the capacitance of the electrode.

Under the circumstances, it has been studied to produce an electrode by forming an active material layer on a current collector using a vacuum process such as a vapor deposition method, a sputtering method, a CVD method or the like, instead of the application type electrode. As compared with the application type electrode, an electrode formed by the vapor deposition method can suppress the active material layer from being divided into tiny particles and also can increase the adhesiveness between the current collector and the active material layer. This improves the electron conductivity in the electrode and also improves the electrode capacitance and the charge/discharge cycle characteristic. Whereas the application type electrode contains a conductor, a binder and the like therein, formation of an active material layer using the vapor deposition method can reduce the amount of, or eliminate, the conductor or the binder present in the electrode. Therefore, the capacitance of the electrode can be essentially increased.

However, even when the vapor deposition method is used, the current collector and the active material layer may be detached from each other, or the current collector may be subjected to a stress to possibly generate wrinkles, due to the expansion and contraction of the active material at the time of charge/discharge. These phenomena reduce the charge/discharge characteristic.

By contrast, Patent Documents 1 and 2 filed by the applicant of the present application propose forming an active material layer by vapor-depositing silicon particles in a direction inclined with respect to the normal to the current collector (oblique vapor deposition). Such an active material layer is formed using the shadowing effect described later, and has a structure in which column-like active material bodies inclined in one direction with respect to the normal to the surface of the current collector are located on the surface of the current collector. According to this structure, a space for alleviating the expansion stress on silicon can be secured between the active material bodies. Therefore, the active material bodies can be suppressed from being detached from the current collector, and the current collector can be suppressed from being wrinkled. As a result, the charge/discharge characteristic can be improved than by the conventional art.

Patent Document 2 proposes forming an active material body grown zigzag by performing a plurality of stages of oblique vapor deposition while switching the vapor deposition direction in order to more efficiently alleviate the expansion stress applied on the current collector. The zigzag active material body is formed as follows, for example.

First, vapor deposition is performed in a first direction inclined with respect to the normal to the current collector to form a first part on the current collector (first stage vapor deposition step). Then, vapor deposition is performed in a second direction inclined oppositely to the first direction with respect to the normal to the current collector to form a second part on the first part (second stage vapor deposition step). Then, vapor deposition is performed further in the first direction to form a third part (third stage vapor deposition step). In this manner, the vapor deposition step is repeated while switching the vapor deposition direction until a desired stacking number is obtained. Thus, an active material body is obtained.

Such an active material body can be formed using, for example, a vapor deposition device described in Patent Document 2. In the vapor deposition device described in Patent Document 2, a fixing table for fixing the current collector is located above an evaporation source. The fixing table is located such that a surface thereof is inclined with respect to a plane parallel to the vapor-depositing surface of the evaporation source (top surface of the vapor-depositing material). Owing to such an arrangement, the vapor-depositing material can be incident on the surface of the current collector in a direction inclined by an arbitrary angle with respect to the normal to the current collector. By switching the inclination direction of the fixing table, the incidence direction of the vapor-depositing material (vapor deposition direction) can be switched. Accordingly, by repeating a plurality of stages of vapor deposition while switching the inclination direction of the fixing table, a zigzag active material body as described above is obtained. It is also described that the incidence direction of the vapor-depositing material is switched by moving the evaporation source or using a plurality of evaporation sources alternately, instead of switching the inclination direction of the fixing table.

However, where the vapor deposition device described in Patent Document 2 is used, vapor deposition is performed on a current collector which is cut in advance into a prescribed size, which decreases the productivity. Accordingly, it is difficult to apply such a vapor deposition device to mass production processes.

Patent Documents 3 through 6 disclose roll-to-roll system vapor deposition devices preferably usable for mass production processes.

Patent Document 3 proposes forming an active material layer by oblique vapor deposition using a roll-to-roll system vapor deposition device. With this vapor deposition device, a sheet-like current collector runs from a supply roll to a take-up roll in a chamber, and a vapor deposition film (active material film) can be continuously formed on the running current collector in a prescribed vapor deposition zone. In this vapor deposition zone, the vapor-depositing material is incident on the surface of the current collector in one direction inclined with respect to the normal to the current collector. Therefore, column-like active material bodies inclined in a particular direction with respect to the normal to the current collector can be formed.

Patent Document 4 discloses various types of roll-to-roll system vapor deposition devices as vapor deposition devices for continuously producing an electrode material for electrolytic capacitors. For example, in one of the disclosed structures, two vapor deposition rolls are provided for one evaporation source, and metal particles evaporated from the evaporation source are vapor-deposited on the surface of the substrate on each vapor deposition roll. Thus, two vapor deposition zones are provided for one evaporation source.

However, it is difficult to continuously form active material bodies grown zigzag as described in Patent Document 2 using the conventional roll-to-roll vapor deposition device described in Patent Document 3 or 4.

As described above, the active material bodies described in Patent Document 2 are formed by performing a plurality of stages of vapor deposition while switching the incidence direction of the vapor-depositing material (vapor deposition direction) to the current collector. With the vapor deposition device described in Patent Document 3, in order to switch the incidence direction of the vapor-depositing material (vapor deposition direction) to the current collector, the location of the vapor deposition zone with respect to the evaporation source needs to be changed. Accordingly, it is difficult to switch the vapor deposition direction in the state where the chamber is kept vacuum. Therefore, a vapor deposition film containing the active material bodies as described above cannot be continuously formed.

The vapor deposition device described in Patent Document 4 is not structured so as to perform oblique vapor deposition from the beginning. It is difficult to control the incidence direction or the vapor deposition direction of the vapor-depositing material with respect to the normal to the current collector. Therefore, it is impossible form active material bodies grown zigzag by controlling the vapor deposition direction thereof.

In addition, according to the conventional vapor deposition devices described above, the vapor deposition zone is formed in only a part of the zone in which the evaporated vapor-depositing material is scattered (vapor deposition possible zone) in the chamber. Therefore, the majority of the vapor-depositing material scattered in the vapor deposition possible zone is not used for vapor deposition. This presents a problem that the utilization factor of the material is very low.

By contrast, Patent Documents 5 and 6 disclose a structure of a roll-to-roll system vapor deposition device having a plurality of vapor deposition zones with different vapor deposition directions. Such a deposition device is provided for the purpose of producing a magnetic tape. Using such a vapor deposition device, a film including layers formed with different vapor deposition directions can be produced.

According to the vapor deposition device shown in FIG. 4 of Patent Document 5, a material substrate formed of a polymer material is transported along three cylindrical rotatable cans controlled to have a temperature of, for example, $-10°$ C. to $-15°$ C. and vapor deposition is performed in two zones (vapor deposition zones) on each rotatable can. In each vapor deposition zone, vapor deposition is performed while a surface of the material substrate opposite to the surface subjected to vapor deposition is cooled by the rotatable can. Therefore, the phenomenon that the material substrate is melted by the heat of the vapor-depositing material can be prevented.

Patent Document 6 discloses a structure of a vapor deposition device including a cooling device for directly cooling a surface of the substrate on which vapor deposition is to be performed. This cooling device is provided for the purpose of preventing the material substrate of a magnetic tape (for example, PET) from being melted.

Hereinafter, the structure of the vapor deposition device disclosed in Patent Document 6 will be described in detail with reference to the figure. FIG. 34 is a cross-sectional view showing a conventional vapor deposition device disclosed in Patent Document 6.

A vapor deposition device 2000 includes rollers 1010 and 1012 for feeding out and taking in a material substrate, a cooling device 1016 and a cooling support 1018 for cooling a material substrate 1014 moving between the rollers 1010 and 1012, an evaporation source 1020 located below a transportation path of the material substrate 1014, and mask shielding plates 1022, 1024 and 1026 for defining a range in which vapor deposition is to be performed on the material substrate 1014. In the vapor deposition device 2000, the material substrate 1014 is fed out from the roller 1010 and cooled by the cooling device 1016. Then, the material substrate 1014 is transported so as to be convexed toward the evaporation source 1020 and is taken up by the roller 1012. The cooling support 1018 is in contact with a rear surface (opposite to a vapor deposition surface) of the material substrate 1014 transported as described above. In such a transportation path of the material substrate 1014, oblique vapor deposition is performed on the material substrate 1014 in a zone 1030 upstream to a part of the material substrate 1014 closest to the evaporation source (the apex of the convexed part) (such a zone will be referred to as the "upstream vapor deposition zone") and a zone 1032 downstream to the part (such a zone will be referred to as the "downstream vapor deposition zone"). In the upstream vapor deposition zone 1030 and the downstream vapor deposition zone 1032, the vapor-depositing material is incident in directions different from each other with respect to the normal to the material substrate 1014. Therefore, by allowing the material substrate 1014 to pass through these zones, two layers different in the vapor deposition directions can be continuously formed on the material substrate 1014. A bottom end of the vapor deposition zone 1030 (end on the evaporation source side) is defined by the mask shielding plate 1022, and a top end thereof (end on the roller 1010 side) is defined by the mask shielding plate 1024. Similarly, a bottom end of the vapor deposition zone 1032 (end on the evaporation source side) is defined by the mask shielding plate 1022, and a top end thereof (end on the roller 1010 side) is defined by the mask shielding plate 1026.

Patent Document 1: Pamphlet of International Publication WO2007/015419

Patent Document 2: Pamphlet of International Publication WO2007/052803

Patent Document 3: Japanese Laid-Open Patent Publication No. 2007-128659

Patent Document 4: Japanese Patent No. 2704023

Patent Document 5: Japanese Laid-Open Patent Publication No. 53-87706

Patent Document 6: Japanese Laid-Open Patent Publication No. 10-130815

DISCLOSURE OF THE INVENTION

Problems to be Solved by the Invention

As described above, the vapor deposition devices disclosed in Patent Documents 5 and 6 each have a plurality of vapor deposition zones with different vapor deposition directions, and so are capable of continuously performing a plurality of stages of vapor deposition with different vapor deposition directions.

However, the vapor deposition device of Patent Document 5 has a problem that each vapor deposition zone is formed on a rotatable can and so cannot have a sufficient size. For this reason, the ratio of the zone (including all the vapor deposition zones) in which vapor deposition is performed with respect to a vapor deposition possible zone in which the evaporated vapor-depositing material is scattered is not sufficient. Therefore, it is difficult to effectively improve the utilization factor of the vapor-depositing material. There is another problem that the vapor deposition angle in each vapor deposition zone cannot be easily controlled. These problems will be described later in detail with reference to figures.

As shown in FIG. 34, the vapor deposition device 2000 of Patent Document 6 is capable of performing vapor deposition to the material substrate 1014 transported in a V shape. Therefore, as compared with the vapor deposition device of Patent Document 5, the vapor deposition device 2000 increases the ratio of the zone in which vapor deposition is performed with respect to the vapor deposition possible zone and so has a higher possibility of improving the utilization factor of the material. However, the vapor deposition device 2000 performs vapor deposition on the cooling support 1018 and so has the following problems.

The material substrate 1014 running between the vapor deposition zones 1030 and 1032 is bent at an acute angle at a part closest to the evaporation source. At this point, the rear surface of the material substrate 1014 (surface opposite to the surface subjected to vapor deposition) is rubbed by the cooling support 1018, which may damage the rear surface of the material substrate 1014 or wrinkle the material substrate 1014 during the transportation. In addition, when being bent, the material substrate 1014 may float from the cooling support 1018 and may not be sufficiently cooled. As a result, the material substrate 1014 may be damaged, for example, may be ruptured. Furthermore, since the vapor deposition is performed while the material substrate 1014 is transported such that the material substrate 1014 is in contact with the cooling support 1018, the transportation path of the material substrate 1014 is determined by the shape of the cooling support 1018. This may reduce the freedom of selection regarding the vapor deposition angle to the material substrate 1014.

The vapor deposition device 2000 has only two vapor deposition zones 1030 and 1032 between the rollers 1010 and 1012. Therefore, it is difficult to form a vapor deposition film having a large stacking number efficiently.

The present invention made in light of the above-described circumstances has an object of providing a vapor deposition device which is capable of continuously performing oblique vapor deposition while switching the vapor deposition direction with respect to the normal to the substrate, does not damage the substrate transported, is superb in utilization factor of the vapor-depositing material and mass productivity, and is capable of easily controlling the vapor deposition angle.

Means for Solving the Problems

A vapor deposition device according to the present invention is for moving a sheet-like substrate in a roll-to-roll system in a chamber to continuously form a vapor deposition film on the substrate. The vapor deposition device comprising an evaporation source for evaporating a vapor-depositing material; a transportation section including first and second rolls for holding the substrate in the state of being wound therearound and a guide section for guiding the substrate, wherein one of the first and second rolls supplies the substrate, the guide section guides the supplied substrate, and the other of the first and second rolls takes up the substrate, and thus the substrate is transported so as to pass through a vapor deposition possible zone to which the evaporated vapor-depositing material reaches; and a shielding section, located in the vapor deposition possible zone, for forming a shielded zone which is not reachable by the vapor-depositing material from the evaporation source. The guide section includes a first guide member for guiding the substrate in the vapor deposition possible zone such that a surface of the substrate to be subjected to the vapor-depositing material is convexed toward the evaporation source, and a second guide member, located on the second roll side with respect to the first guide member on a substrate transportation path, for guiding the substrate such that the surface of the substrate to be subjected to the vapor-depositing material is convexed toward the evaporation source. The shielding section includes first and second shielding members respectively located between the first and second guide members and the evaporation source. The first guide member forms a first vapor deposition zone located on the first roll side with respect to the first shielding member on the substrate transportation path, and a second vapor deposition zone located on the second roll side with respect to the first shielding member on the substrate transportation path. The second guide member forms a third vapor deposition zone located on the first roll side with respect to the second shielding member on the substrate transportation path, and a fourth vapor deposition zone located on the second roll side with respect to the second shielding member on the substrate transportation path. The first through fourth vapor deposition zones include a planar transportation zone for transporting the substrate such that the surface of the substrate to be subjected to the vapor-depositing material is planar. The transportation section is located with respect to the evaporation source such that the vapor-depositing material is not incident on the substrate in a direction of the normal to the substrate in the vapor deposition possible zone excluding the shielded zone.

According to a vapor deposition device of the present invention, a plurality of stages of vapor deposition steps can be performed continuously while switching the vapor deposition direction. Specifically, first and second vapor deposition zones having different vapor deposition directions to each other are formed in the chamber by the transportation section including the first guide member and the first shielding member. In the first vapor deposition zone, the vapor-depositing material can be incident on the surface of the substrate in a direction inclined with respect to the direction of the normal to the substrate; and in the second vapor deposition zone, the vapor-depositing material can be incident on the surface of the substrate in a direction inclined oppositely to the inclination direction in the first vapor deposition zone with respect to the direction of the normal to the substrate. Thus, two layers having different growth directions are formed on the surface of the substrate. After this, also in the third and fourth vapor deposition zones formed by the second guide member and the second shielding member, two layers having different growth directions can be similarly formed. In this manner, during the time in which the substrate is transported between the first roll and the second roll, four stages of vapor deposition steps with different vapor deposition directions can be continuously performed. By repeating the vapor deposition while switching the transportation direction of the substrate, a vapor deposition film having a larger stacking number can be formed.

Accordingly, using the vapor deposition device of the present invention, a plurality of active material bodies can be grown zigzag on the surface of the substrate. As compared with an electrode produced using a conventional roll-to-roll system vapor deposition device described in each of Patent Document 3 and 4, an electrode produced using the vapor deposition device according to the present invention causes an expansion stress on the active material bodies to be effectively alleviated. The vapor deposition device according to the present invention can continuously form the above-described active material bodies on the surface of a sheet-like substrate. Therefore, as compared with the process of controlling the vapor deposition direction by switching the inclination direction of a table for fixing the current collector as described in Patent Document 2, the process realized by the vapor deposition device according to the present invention is superb in mass productivity.

In the vapor deposition device according to the present invention, the first and second vapor deposition zones include a planar transportation zone for transporting the substrate such that the surface of the substrate to be subjected to the vapor-depositing material (hereinafter, referred to as the "vapor deposition surface") is planar. As compared with the vapor deposition device for performing vapor deposition only on a rotatable can (roller) (for example, Patent Document 5), the vapor deposition device according to the present invention can increase the ratio of a zone in which vapor deposition is performed with respect to the vapor deposition possible zone in which the vapor-depositing material evaporated from the evaporation source is scattered, and thus improves the utilization factor of the vapor-depositing material.

In addition, the substrate is guided by a guide member to two vapor deposition zones located on both sides of the guide member. Therefore, the vapor deposition steps can be continuously performed without damaging the substrate. Furthermore, the vapor deposition angle in each vapor deposition zone can be easily controlled with a higher degree of freedom than by the conventional art.

Effects of the Invention

According to the present invention, in a substrate path defined by the guide member to be convexed toward the evaporation source, vapor deposition zones having different vapor deposition directions can be formed on both sides of the guide member. Accordingly, a vapor deposition device having superb mass productivity which is capable of continuously performing a plurality of vapor deposition steps with different vapor deposition directions is provided. In addition, the utilization factor of the vapor-depositing material can be improved as compared with by the conventional art.

Using the vapor deposition device according to the present invention, an electrode having a superb charge/discharge cycle characteristic can be produced by a process having a superb productivity.

BRIEF DESCRIPTION OF THE DRAWINGS

FIG. 13($a$) is a cross-sectional view of an example of film (active material body) formed by a vapor deposition device having a V-shaped path, and FIGS. 13($b$) and ($c$) are each a cross-sectional views showing an example of film (active material body) formed by a vapor deposition device having a W-shaped path.

FIG. 15(b) is a schematic cross-sectional view of a vapor deposition film formed using the vapor deposition device shown in FIG. 15(a).

DESCRIPTION OF THE REFERENCE NUMERALS

Figure 1:
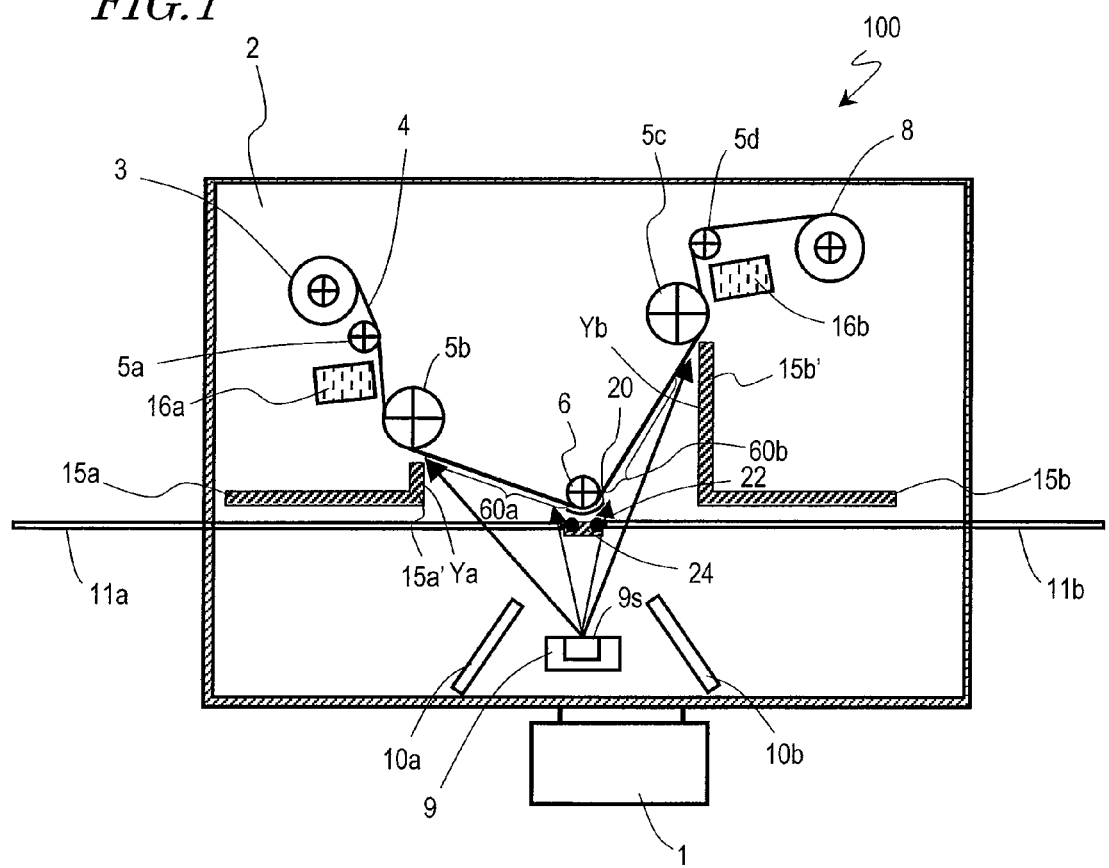
FIG. 1 is a schematic cross-sectional view of a vapor deposition device according to Embodiment 1 of the present invention.

1 Exhaust pump
2 Chamber
3, 8 Supply or take-up roll
4 Substrate
5a-5m Transportation roller
6a-6d Guide member
9 Evaporation source
9s Evaporation surface
10a, 10b Shielding plate
11a, 11b Gas introduction pipe
15a, 15b, 15c Shielding plate
20a-20d Shielding member
22 Nozzle section
24 Nozzle section shielding plate
28 Shutter
60a-60h Vapor deposition zone
100, 200, 300, 400, 500, 600, 700, 800 Vapor deposition device

BEST MODE FOR CARRYING OUT THE INVENTION

Hereinafter, vapor deposition devices according to embodiments of the present invention will be described with reference to the figures.

Embodiment 1

In the Vapor Deposition Device in this Embodiment, a sheet-like substrate is transported so as to be convexed toward an evaporation source and vapor deposition is performed in zones on both sides of the apex of the convexed part in the chamber.

<Structure of the Vapor Deposition Device>

First, FIG. 1 will be referred. FIG. 1 is a cross-sectional view schematically showing a vapor deposition device according to Embodiment 1 of the present invention. A vapor deposition device 100 includes a chamber (vacuum tank) 2, an exhaust pump 1 provided outside the chamber 2 for exhausting the chamber 2, and gas introduction pipes 11a and 11b for introducing gas such as oxygen gas or the like from outside the chamber 2. The chamber 2 accommodates an evaporation source 9 for evaporating a vapor-depositing material, a transportation section for transporting a sheet-like substrate 4, a shielding section for forming a shielded zone which is not reachable by the vapor-depositing material evaporated from the evaporation source 9, heating sections 16a and 16b for heating the substrate 4, and a nozzle section 22 connected to the gas introduction pipes 11a and 11b for supplying gas to a surface of the substrate 4.

The evaporation source 9 includes a container such as, for example, a crucible for accommodating a vapor deposition material and a heating device for evaporating the vapor-depositing material. The vapor-depositing material and the container are appropriately attachable or detachable. Devices usable as the heating device include, for example, a resistance heating device, an induction heating device, an electronic beam heating device and the like. For performing vapor deposition, the vapor-depositing material accommodated in the crucible is heated by the heating device to be evaporated from a top surface (evaporation source) 9s thereof and is supplied to the surface of the substrate 4.

The transportation section includes first and second rolls 3 and 8 capable of holding the substrate 4 in the state where the substrate 4 is wound therearound, and a guide section for guiding the substrate 4. The guide section includes a first guide member (here, a transportation roller) 6 and other transportation rollers 5a through 5d, and thus defines the transportation path of the substrate 4 such that the substrate 4 passes through a zone reached by the vapor-depositing material evaporated from the evaporation surface 9a (such a zone will be referred to as the "vapor deposition possible zone").

The first and second rolls 3 and 8, the transportation rollers 5a through 5d and the first guide member 6 are cylindrical with a length of, for example, 600 mm, and are located in the chamber so as to be parallel to one another in a length direction thereof (namely, a width direction of the substrate 4 to be transported). FIG. 1 only shows the cross-sections of these cylindrical members which are parallel to bottom surfaces thereof.

The evaporation source 9 may also be formed such that, for example, the evaporation surface 9s of the vapor-depositing material has a sufficient length (for example, 600 mm or greater) parallel to the width direction of the substrate 4 transported by the transportation section. This allows vapor deposition to be performed substantially uniformly in the width direction of the substrate 4. The evaporation source 9 may include a plurality of crucibles arranged in the width direction of the substrate 4 to be transported.

In this embodiment, one of the first and second rolls 3 and 8 supplies the substrate 4, the transportation rollers 5a through 5d and the first guide member 6 guides the supplied substrate 4 along the transportation path, and the other of the first and second rolls 3 and 8 takes up the substrate 4. When necessary, the substrate 4 which is taken up is again supplied by the other roll and transported along the transportation path in the opposite direction. In this manner, the first and second rolls 3 and 8 in this embodiment can act either as the supply roll or the take-up roll depending on the transportation direction. By inverting the transportation direction in repetition, the number of times the substrate 4 passes through the vapor deposition zone can be adjusted. Therefore, a prescribed number of vapor deposition steps can be continuously carried out.

The transportation rollers 5a and 5b, the first guide member 6, and the transportation rollers 5c and 5d are sequentially located in this order from the first roll side on the transportation path of the substrate 4. In this specification, the expression "the first roll side on the transportation path" means the side of the first roll of the transportation path having the first and second rolls 3 and 8 at both ends regardless of the transportation direction of the substrate 4 or the spatial location of the first roll. The first guide member 6 is located below the transportation rollers 5b and 5c adjacent thereto, and guides the substrate 4 such that the surface of the substrate 4 to be subjected to the vapor-depositing material is convexed toward the evaporation source 9. The expression "guide the substrate 4 such that the substrate 4 is convexed toward the evaporation source 9" means guiding the substrate 4 such that the substrate 4 is convexed toward the evaporation surface 9s. Owing to this structure, the path of the substrate 4 has the direction thereof changed by the first guide member and has a V-shaped or U-shaped cross-section as shown in the figure. In this specification, the V-shaped or U-shaped path defined by the first guide member 6 will be referred to as the "V-shaped path".

Between the first guide member 6 and the evaporation source 9 (evaporation surface 9s), a first shielding member 20 is located, which prevents the vapor-depositing material evaporated from the evaporation surface 9s from being incident in the direction of the normal to the substrate 4 and also separates the vapor deposition zone of the V-shaped path into two. Owing to such a structure, on the transportation path of the substrate 4, a first vapor deposition zone 60a located on the first roll side with respect to the first shielding member 20 and a second vapor deposition zone 60b located on the second roll side with respect to the first shielding member 20 are formed. In this specification, how each vapor deposition zone is called does not depend on the positions of the first and second rolls 3 and 8 in the chamber 2 or the transportation direction of the substrate 4. A vapor deposition zone which is on the first roll side with respect to the first guide member 6 in the V-shaped path defined by the first guide member 6 is called the "first vapor deposition zone 60a", and a vapor deposition zone which is on the second roll side with respect to the first guide member 6 in the V-shaped path is called the "second vapor deposition zone 60b". Accordingly, the "first vapor deposition zone 60a" only needs to be located on the first roll side with respect to the first shielding member 20 on the transportation path of the substrate 4. It does not matter even if, for example, the distance in a straight line between the first roll 3 and the first vapor deposition zone 60a is longer than the distance in a straight line between the first roll 3 and the first guide member 6.

The shielding section is located in the vapor deposition possible zone, and includes, in addition to the first shielding member 20, shielding plates 10a and 10b located so as to cover the evaporation source 9 and an exhaust opening (not shown) connected to the exhaust pump 1, a nozzle section shielding plate 24 located so as to cover the nozzle section 22, and shielding plates 15a and 15b respectively extending from a side wall of the chamber 2 toward top ends of the first and second vapor deposition zones 60a and 60b. The shielding plates 15a and 15b are located so as to cover the substrate 4 running in a vapor deposition possible zone on the transportation path of the substrate 4 other than the vapor deposition zones 60a and 60b, the first and second rolls 3 and 8, the heating sections 16a and 16b, and the like, and prevents the vapor-depositing material from reaching these elements.

In this embodiment, the shielding plates 15a and 15b respectively include walls 15a' and 15b', which respectively have surfaces (facing surfaces) Ya and Yb facing the vapor deposition surface of the substrate 4 passing through the corresponding vapor deposition zones 60a and 60b. As described below, since the facing surfaces Ya and Yb facing the vapor deposition surface of the substrate 4 are provided in the first and second vapor deposition zones 60a and 60b, the difference in the amount of heat received by the substrate 4 in the vapor deposition zones 60a and 60b can be alleviated. This allows a vapor deposition film to be formed more uniformly. In the case where the vapor deposition is performed while gas is introduced from the nozzle section 22, the facing surfaces Ya and Yb also provide an effect of efficiently causing gas, emitted from a plurality of emission openings provided in side surfaces of the nozzle section 22, to reside in the vapor deposition zones 60a and 60b.

In this embodiment, the transportation section and the shielding section are located with respect to the evaporation source 9 so as to prevent the vapor-depositing material evaporated from the evaporation surface 9s from being incident on the substrate 4 in the normal direction to the substrate 4 running along the transportation path. This allows vapor deposition to be performed in a direction inclined with respect to the normal direction to the substrate 4 (oblique vapor deposition). In the vapor deposition device 100 shown in FIG. 1, the first shielding member 20 and the nozzle section shielding plate 24 prevent the vapor-depositing material from being incident on the substrate 4 in the normal direction to the substrate 4. With another structure, another shielding plate (for example, the shielding plate 15a, 15b, etc.) may have substantially the same function.

In this embodiment, the nozzle section 22 is located between the shielding plate 15b and the first guide member 15c. The nozzle section 22 extends, for example, in the width direction of the substrate 4 to be transported (the direction vertical to the cross-section shown in FIG. 1), and may have a plurality of emission openings on the side surfaces thereof for ejecting gas toward the corresponding vapor deposition zones 60a and 60b. This allows the gas to be supplied in the vapor deposition zones 60a and 60b substantially uniformly in the width direction of the substrate 4. The nozzle section 22 is preferably structured so as to eject gas in parallel in the first and third vapor deposition zones 60a and 60b. Owing to such a structure, the reaction ratio of oxygen gas emitted from the nozzle section 22 and a vapor deposition particles can be improved, and thus a vapor deposition film having a high acidity can be formed without deteriorating the vacuum pressure in the chamber 2.

The heating sections 16a and 16b are respectively located on the first roll side and the second roll side of the V-shaped path. Owing to such a structure, when the substrate 4 is transported from the first roll 3 to the V-shaped path, the substrate 4 before passing through the V-shaped path can be heated to 200° C. to 400° C. (for example, 300° C.) by the heating section 16a; and when the substrate 4 is transported from the second roll 8 to the V-shaped path, the substrate 4 before passing through the V-shaped path can be heated to 200° C. to 400° C. (for example, 300° C.) by the heating section 16b. By heating the substrate 4 to the above-described temperature, organic substances adhering to the surface of the substrate 4 to be subjected to vapor deposition can be removed and thus the adhesive force between the substrate 4 and the vapor-depositing material (for example, silicon particles) and the adhesive force of the vapor-depositing material (among silicon particles) can be improved.

<Operation of the Vapor Deposition Device>

Now, an operation of the vapor deposition device 100 will be described. Here, an operation for forming a plurality of active material bodies containing an oxide of silicon on the surface of the substrate 4 using the vapor deposition device 100 will be described.

First, the substrate 4 of a long strip type is wound around one of the first and second rolls 3 and 8 (here, the first roll 3). As the substrate 4, a metal foil such as a copper foil, a nickel foil or the like is usable. As described later in more detail, in order to provide a plurality of active material bodies with a prescribed space therebetween on the surface of the substrate 4, the shadowing effect provided by oblique vapor deposition needs to be used. For this purpose, it is preferable that the surface of the metal foil has a concave and convex pattern. According to the concave and convex pattern used in this embodiment, quadrangular prism-like projections having a diamond-shaped top surface (diagonal lines: 20 μm×10 μm) and a height of 10 μm are regularly arranged. A distance between adjacent projections along the longer diagonal line of the diamond shape is 20 μm, a distance between adjacent projections along the shorter diagonal line of the diamond shape is 10 μm, and a distance between adjacent projections along the direction parallel to the sides of the diamond shape is 10 μm. The surface roughness Ra of the top surface of each projection is, for example, 2.0 μm.

A vapor-depositing material (for example, silicon) is accommodated in the crucible in the evaporation source 9, and the gas introduction pipes 11a and 11b are connected to an oxygen gas tank or the like provided outside the vapor deposition device 100. In this state, the chamber 2 is exhausted using the exhaust pump 1.

Next, the substrate 4 wound around the first roll 3 is fed out and is transported toward the second roll 8. The substrate 4 is first heated to a temperature of 200° C. to 300° C. by the heating section 16a and then passes through the V-shaped path including the first and second vapor deposition zones 60a and 60b. At this point, the silicon in the crucible in the evaporation source 9 is evaporated by a heating device (not shown) such as an electron beam heating device and supplied to the surface of the substrate 4 passing through the first and second vapor deposition zones 60a and 60b. At the same time, oxygen gas is supplied to the surface of the substrate 4 from the nozzle section 22 via the gas introduction pipes 11a and 11b. Thus, a compound containing silicon and oxygen (an oxide of silicon) can be grown on the surface of the substrate 4 by reactive vapor deposition. After the oxide of silicon is vapor-deposited on the surface of the substrate 4 in the vapor deposition zones 60a and 60b, the substrate 4 is taken up by the second roll 8.

<Incidence Angle in the Vapor Deposition Zones>

Here, with reference to FIG. 2, an angle θ at which the vapor-depositing material is incident on the substrate 4 (incidence angle) in the first and second vapor deposition zones 60a and 60b will be described. Herein, the "incidence angle θ" means an angle made by the normal to the substrate 4 and the incidence direction of the vapor-depositing material.

Figure 2:
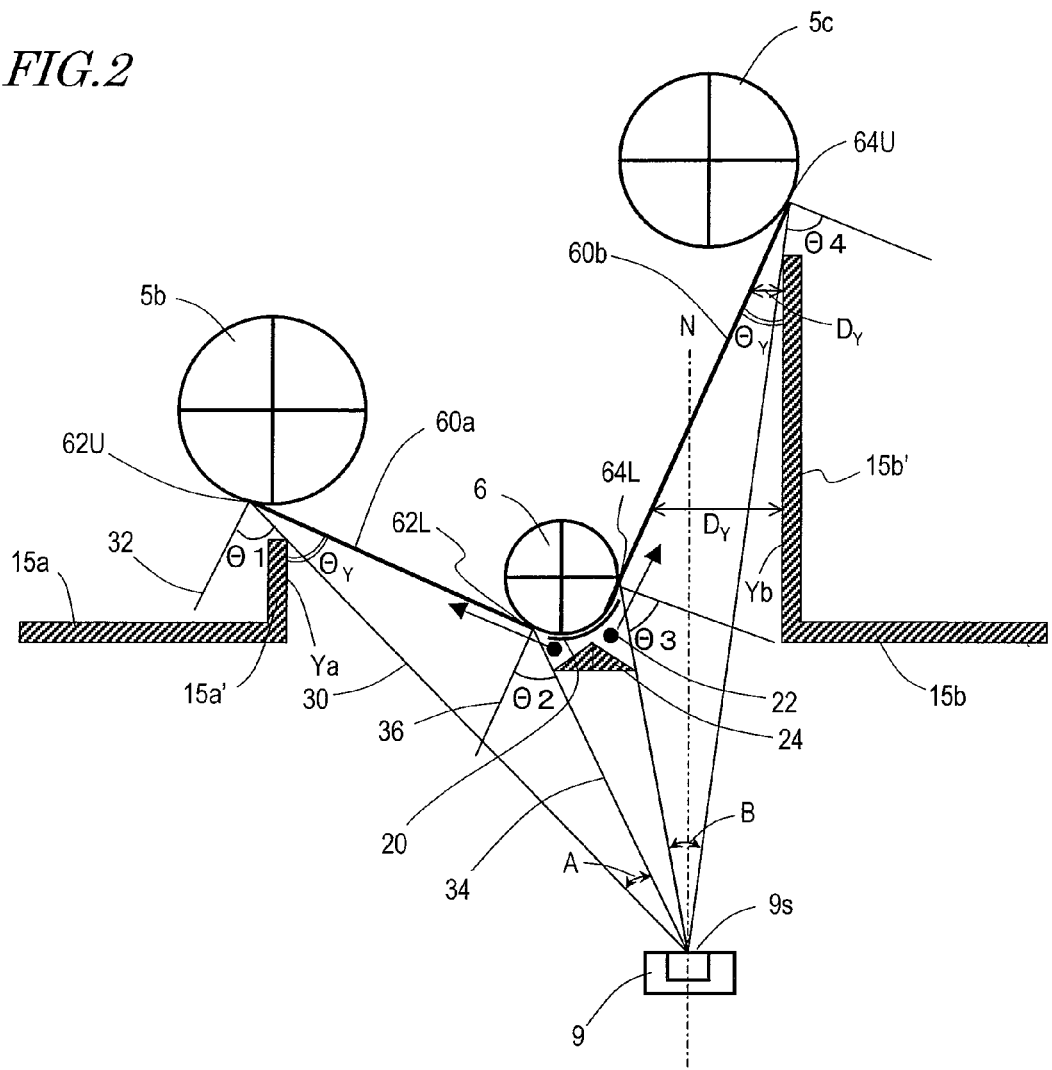
FIG. 2 is a cross-sectional view provided to explain an angle at which a vapor-depositing material is incident on a substrate (incidence angle) in the vapor deposition device in Embodiment 1 of the present invention.

FIG. 2 is a cross-sectional view schematically showing the positional relationship between the first and second vapor deposition zones 60a and 60b and the evaporation source 9 in the chamber 2. For simplicity, identical elements with those in FIG. 1 bear identical reference numerals therewith, and descriptions thereof will be omitted.

As shown in FIG. 2, the first and second vapor deposition zones 60a and 60b are located on both sides of the first guide member 6 in the V-shaped path described above. At this point, the incidence angle θ of the vapor-depositing material in the first vapor deposition zone 60a is in the range of equal to or greater than an incidence angle θ2 of the vapor-depositing material at a bottom end 62L of the first vapor deposition zone 60a (end on the side of the first guide member 6) and equal to or smaller than an incidence angle θ1 of the vapor-depositing material at a top end 62U of the first vapor deposition zone 60a. The incidence angle θ1 at the top end 62U is an angle made by a straight line 32 vertical to the first vapor deposition zone 60a and a straight line 30 connecting the top end 62U of the first vapor deposition zone 60a and the center of the evaporation surface 9s. The incidence angle θ2 at the bottom end 62L is an angle made by a straight line 36 vertical to the first vapor deposition zone 60a and a straight line 34 connecting the bottom end 62L of the first vapor deposition zone 60a and the center of the evaporation surface 9s. Similarly, the incidence angle θ of the vapor-depositing material in the second vapor deposition zone 60b is in the range of equal to or greater than an incidence angle θ3 of the vapor-depositing material at a bottom end 64L of the second vapor deposition zone 60b and equal to or smaller than an incidence angle θ4 of the vapor-depositing material at a top end 64U of the second vapor deposition zone 60b.

In this embodiment, it is preferable that the first guide member 6, the transportation rollers 5b and 5c, the shielding plates 15a and 15b, the shielding member 20 and the nozzle section shielding plate 24 are located with respect to the evaporation source 9 such that the incidence angles θ1 through θ4 are all 45° or greater and 75° or smaller. The reason will be described below.

Where the incidence angles θ1 through θ4 are all controlled to be 45° or greater and 75° or smaller, the range of the incidence angle θ of silicon in both of the first and second vapor deposition zones 60a and 60b is 45° or greater and 75° or smaller. Where the incidence angle θ of silicon is smaller than 45°, it is difficult to allow the silicon to be incident on only projections 71 on the substrate 4 using the shadowing effect. As a result, a sufficient space may not be provided between the active material bodies. When such active material bodies are used for a negative electrode of a lithium secondary cell, the substrate 4 is likely to be wrinkled by the expansion of each active material body during the charge of the lithium secondary cell. By contrast, where the incidence angle θ of silicon is larger than 75°, the growth direction of the active material bodies is largely inclined toward the surface of the substrate 4. As a result, the attaching force between the surface of the substrate 4 and the active material bodies is reduced, and thus the adhesiveness between the substrate 4 and the active material bodies is decreased. When such active material bodies are used for a negative electrode of a lithium secondary cell, the active material bodies are likely to be detached from the substrate 4 as the charge/discharge of the lithium secondary cell proceeds.

The incidence directions of the vapor-depositing material in the first and second vapor deposition zones 60a and 60b are inclined in opposite directions to each other with respect to the normal to the substrate 4. Owing to this, the active material bodies can be grown alternately in opposite inclination directions with respect to the normal to the substrate 4. Therefore, the zigzag active material bodies can be obtained as described above.

In this embodiment, the incidence angle θ of the vapor-depositing material (for example, silicon) in the first and second vapor deposition zones 60a and 60b is controlled as follows. The transportation rollers 5b and 5c and the first guide member 6 are located with respect to the evaporation source 9 such than the incidence angle θ of silicon is in a desired range (for example, 45° or greater and 75° or smaller, preferably 60° or greater and 75° or smaller) in at least a part of an area between the transportation roller 5b and the first guide member 6 in the V-shaped path and at least a part of an area between the first guide member 6 and the transportation roller 5c in the V-shaped path. The shielding plates 15a and 15b, the shielding member 20 and the nozzle section shielding plate 24 are located so as to shield silicon from being incident in an area of the V-shaped path where the incidence angle θ is outside the above-described range. This will be described specifically. In the example shown in FIG. 2, the incidence angles θ1 and θ3 at the top ends 62U and 64U in the first and second vapor deposition zones 60a and 60b are respectively adjusted by the shielding plates 15a and 15b. The incidence angles θ2 and θ4 at the bottom ends 62L and 64L are respectively adjusted by the shielding member 20 and the nozzle section shielding plate 24. The nozzle section shielding plate 24 may act as the shielding member without providing the shielding member 20. Here, the incidence angles θ1 through θ4 are respectively 75°, 60°, 60°, and 75° (θ1=75°, θ2=60°, θ3=60°, θ4=75°).

As described above, according to this embodiment, the incidence angle θ can be easily controlled by the positional relationship among the transportation rollers 5b and 5c and the guide member 6. In addition, in the planar transportation zones of the vapor deposition zones 60a and 60b, a rear surface of the substrate 4 (surface opposite to the vapor deposition surface) is not in contact with any member such as a transportation section or a cooling support. Therefore, the vapor deposition angle can be selected at a higher degree of freedom than in the vapor deposition device described in Patent Document 5 or 6.

<Facing Surfaces in the Vapor Deposition Device 100>

Now, advantages of providing the facing surfaces Ya and Yb facing the vapor deposition surface of the substrate 4 passing through the first and second vapor deposition zones 60a and 60b will be described.

Figure 34:
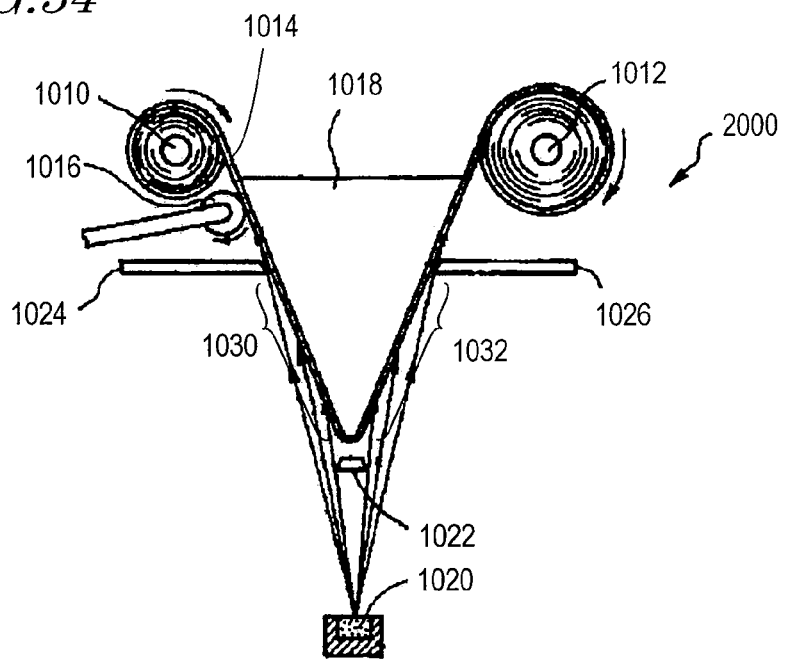
FIG. 34 is a cross-sectional view showing a conventional vapor deposition device.

In the conventional vapor deposition device 2000 shown in FIG. 34, at the bottom ends, of the vapor deposition zones 1030 and 1032, close to the evaporation source 1020, the material substrate 1014 receives a large amount of heat from the evaporation source 1020 and the vapor deposition particles. The amount of received heat decreases as the material substrate 1014 is moved farther from the evaporation source 1020, and is minimum at the top ends of the vapor deposition zones 1030 and 1032. Therefore, a temperature gradient is generated on the surface of the material substrate 1014 moving in the vapor deposition zones 1030 and 1032. This makes it difficult to provide a film uniform in the thickness direction. The rear surface of the material substrate 1014 moving in the vapor deposition zones 1030 and 1032 is in contact with the cooling support 1018. However, the cooling support 1018 becomes smaller as approaching the evaporation source 1020, and it is difficult to sufficiently alleviate, by the cooling support 1018, the difference in the amount of heat received by the material substrate 1014 between the top ends and the bottom ends of the vapor deposition zones 1030 and 1032.

By contrast, according to this embodiment, the amount of heat received by the substrate 4 passing through the vapor deposition zones 60a and 60b can be more averaged by radiant heat from the facing surfaces Ya and Yb as described below, and therefore a vapor deposition film more uniform in the thickness direction can be provided.

Again, FIG. 2 will be referred to. In this specification, the "facing surfaces Ya and Yb" facing the vapor deposition surface of the substrate 4 in the vapor deposition zones 60a and 60b face the surface of the substrate 4 (vapor deposition surface) passing through the vapor deposition zones 60a and 60b and alleviate the temperature difference which is caused to the vapor deposition surface as a result of incidence of the vapor-depositing material. In this embodiment, the facing surfaces Ya and Yb are located in the vapor deposition possible zone, and further located so as to be close to the vapor deposition surface at the ends 62U and 64U farther from the evaporation source 9 (namely, the top ends) and become farther from the vapor deposition surface as becoming closer to the evaporation source 9. Accordingly, for example, in the second vapor deposition zone 60b, a distance $D_Y$ between the vapor deposition surface and the facing surface Ya is small in the vicinity of the top end 64U and becomes larger as being closer to the bottom end 64L. In other words, in the cross-section shown in FIG. 2, each vapor deposition surface and the corresponding facing surface Ya, Yb form an inverted V shape convexed upward. An angle $\theta_Y$ made by each vapor deposition surface and the corresponding facing surface Ya, Yb is equal to or smaller than 90°.

The vapor deposition surface of the substrate 4 passing through the first and second vapor deposition zones 60a and 60b is always subjected to the radiant heat and the vapor deposition particles. In this embodiment, the amount of heat received by the vapor deposition surface of the substrate 4 mainly includes the amount of radiant heat generated by the evaporation source 9, the amount of radiant heat from the facing surfaces Ya and Yb, and the amount of heat of the vapor deposition particles. The amount of radiant heat is in inverse proportion to the square of the distance from the heat source.

Therefore, the amount of radiant heat from the evaporation source 9 is large in the vicinity of the evaporation source 9 in the vapor deposition zones 60a and 60b, and decreases as being farther from the evaporation source 9. Similarly, the amount of heat of the vapor deposition particles is large in the vicinity of the evaporation source 9 and decreases as being farther from the evaporation source 9. By contrast, the radiant amount of heat from the facing surface Ya, Yb is in inverse proportion to the square of the distance $D_Y$ between the vapor deposition surface and the facing surface Ya, Yb. As described above, the distance $D_Y$ increases as being closer to the evaporation source 9. Therefore, the amount of radiant heat from the facing surface Ya, Yb is large in an area far from the evaporation source 9 in the vapor deposition zones 60a and 60b, and increases as being closer to the evaporation source 9. In this manner, the temperature gradient generated in the surface of the substrate 4 because of the amount of radiant heat from the facing surface Ya, Yb is opposite to the temperature gradient generated because of the amount of radiant heat from the evaporation source 9 and the amount of heat of the vapor deposition particles. For this reason, the temperature difference caused to the substrate 4 by the amount of radiant heat from the evaporation source 9 and the amount of heat of the vapor deposition particles can be reduced.

The angle $\theta_Y$ made by the vapor deposition surface and the facing surface Ya, Yb may be any angle which is equal to or smaller than 90°, and is preferably 25° or greater and 70° or smaller. Where the angle $\theta_Y$ is smaller than 25°, the vapor deposition particles from the evaporation source 9 are unlikely to reach the vapor deposition surface, which may reduce the vapor deposition efficiency. Where the angle $\theta_Y$ is larger than 70°, the heat cannot be confined between these surfaces, which may reduce the effect provided by the facing surfaces Ya and Yb of averaging the amount of heat received by the vapor deposition surface. At least in the vicinity of the top ends of the vapor deposition zones 60a and 60b, the distance $D_Y$ between the facing surface Ya, Yb and the vapor deposition surface needs to be set to be sufficiently small such that the radiant heat from the facing surface Ya, Yb can be received by the vapor deposition surface.

In the vapor deposition device 100, the shielding plates 15a and 15b having the facing surfaces Ya and Yb respectively facing the first and second vapor deposition zones 60a and 60b are provided. The above-described effect is provided as long as the shielding plate 15a or 15b having the facing surface Ya or Yb facing at least one of the first and second vapor deposition zones 60a and 60b is provided.

In this embodiment, the shielding plates 15a and 15b are used to provide the facing surfaces Ya and Yb facing the vapor deposition surface of the substrate 4 passing through the first and second vapor deposition zones 60a and 60b. The facing surfaces Ya and Yb may be provided in other elements than the shielding plate 15a or 15b. The structure of the elements having the facing surfaces Ya and Yb is not specifically limited.

The elements having the facing surfaces Ya and Yb may have a structure for heating or cooling the facing surfaces Ya and Yb. For example, such elements may have a heater for heating the facing surfaces Ya and Yb or a cooling water path for cooling the rear surfaces of the facing surfaces Ya and Yb with cooling water.

Where the facing surfaces Ya and Yb are heated by the heater or the like, the vapor deposition particles flying toward the facing surfaces Ya and Yb are partially reflected and incident on the vapor deposition surface of the substrate 4 in the facing vapor deposition zone. This improves the attaching efficiency (vapor deposition efficiency) of the vapor deposition particles on the vapor deposition surface of the substrate 4. Where the temperature of the facing surfaces Ya and Yb is high, the vapor deposition particles partially move on, and are fixed to, the facing surfaces Ya and Yb. This increases the adhesive force between the facing surfaces Ya and Yb and the vapor deposition particles attached to the facing surfaces Ya and Yb. As a result, the vapor deposition film deposited on the facing surfaces Ya and Yb during the vapor deposition is unlikely to be detached from the facing surfaces Ya and Yb. Where the adhesive force between the vapor deposition particles and the facing surfaces Ya and Yb is small, the vapor deposition film deposited on the facing surfaces Ya and Yb during the vapor deposition is partially detached and falls on the evaporation source 9, which may generate splash. By heating the facing surfaces Ya and Yb, the adhesive force between the facing surfaces Ya and Yb and the vapor deposition film can be increased to suppress the splash. The term "splash" means that the vapor-depositing material in the evaporation source 9 is not gasified and flies to the vapor deposition possible zone in a liquid state. Where the facing surfaces Ya and Yb are heated, the amount of radiant heat received, by the substrate 4 in the vapor deposition zones, from the facing surfaces Ya and Yb is increased to raise the temperature of the vapor deposition surface of the substrate 4. As a result, the vapor deposition particles move on, and are fixed to, the vapor deposition surface, and therefore the adhesiveness between the vapor deposition surface of the substrate 4 and the vapor deposition film can be improved. In the case where the facing surfaces Ya and Yb are heated, the temperature thereof is preferably, for example, 100° C. or higher and 400° C. or lower. This guarantees that the above-described effects are provided more certainly.

Alternatively, the elements having the facing surfaces Ya and Yb may be cooled. In the case where the facing surfaces Ya and Yb are cooled by cooling water or the like, the following effects are provided.

Organic substances attached to the vapor deposition surface of the substrate 4 gather to a cool surface when being evaporated by the radiant heat of the evaporation source 9. Therefore, the evaporated organic substances may be vapor-deposited again on the vapor deposition surface of the substrate 4 together with the vapor deposition particles or may be attached to a cool surface of the substrate 4. This may decrease the adhesiveness between the substrate 4 and the vapor deposition particles. Where the facing surfaces Ya and Yb are cooled, the evaporated organic substances can be gathered to the facing surfaces Ya and Yb. Therefore, the influence of the evaporated organic substances exerted on the vapor deposition surface of the substrate 4 can be alleviated and thus the adhesiveness between the vapor deposition surface and the vapor deposition film can be improved. In the case where the facing surfaces Ya and Yb are cooled, the temperature thereof is preferably, for example, −20° C. or higher and 20° C. or lower. This alleviates the influence of the evaporated organic substances more effectively. When the facing surfaces Ya and Yb are cooled, the amount of radiant heat from the facing surfaces Ya and Yb is decreased, and so the effect of alleviating the temperature difference of the substrate 4 may be reduced. However, even in such a case, cooling the facing surfaces Ya and Yb is advantageous because the above-described influence of the evaporated organic substances can be alleviated.

In this embodiment, the structure of the facing surfaces Ya and Yb is not limited to the above described structure. In this embodiment, it is sufficient that the vapor deposition surface of the substrate 4 passing through at least one of the first and second vapor deposition zones 60a and 60b faces a facing surface provided so as to alleviate, on the vapor deposition surface, the temperature difference caused by the radiant heat generated by the vapor-depositing material. As in embodiments described later, the facing surfaces Ya and Yb may be formed during the vapor deposition by the substrate 4 transported by the transportation section. Specifically, another vapor deposition zone may be provided so as to face at least one of the vapor deposition zones 60a and 60b, and a transportation section may be provided such that the vapor deposition surface of the substrate 4 passing through the another vapor deposition zone faces the at least one of the vapor deposition zones 60a and 60b and such that the vapor deposition surface of the substrate 4 passing through the at least one of the vapor deposition zones 60a and 60b faces the another vapor deposition zone.

<Material Utilization Factor of the Vapor Deposition Device 100>

Here, the following angle ranges are set in any cross-section which is vertical to the evaporation surface 9s of the evaporation source 9 and includes a vapor deposition direction. The angle range made by the straight line 30 connecting the top end 62U of the first vapor deposition zone 60a and the center of the vaporization face 9s and the straight line 34 connecting the bottom end 62L of the first vapor deposition zone 60a and the center of the vaporization face 9s is labeled as A. The angle range made by the straight line connecting the top end 64U of the second vapor deposition zone 60b and the center of the vaporization face 9s and the straight line connecting the bottom end 64L of the second vapor deposition zone 60b and the center of the vaporization face 9s is labeled as B. In the vapor deposition device 100, as shown in FIG. 2, silicon atoms emitted from the center of the evaporation surface 9s to the angle ranges A and B are usable for vapor deposition. Accordingly, silicon atoms in a wider emission range are usable for vapor deposition than in a vapor deposition device having only one vapor deposition zone (for example, the vapor deposition device described in Patent Document 3) or a vapor deposition device of performing vapor deposition on a rotatably can (roller) described in Patent Document 5. Therefore, the utilization factor of the vapor-depositing material (silicon) can be improved and also the vapor deposition efficiency can be improved.

Here, the advantages of the vapor deposition device 100 over a structure of performing vapor deposition on a rotatable can such as the vapor deposition device described in Patent Document 5 or the like will be described in detail. In the vapor deposition device described in Patent Document 5, vapor deposition is performed only in a zone where a surface of the substrate which is subjected to the vapor-depositing material is transported on a curved surface along the rotatable can (hereinafter, such a zone will be referred to as the "curved transportation zone"). By contrast, in this embodiment, vapor deposition can be performed in a zone in which the substrate 4 is transported such that the surface thereof subjected to the vapor-depositing material is planar (hereinafter, such a zone will be referred to as the "planar transportation zone"). Therefore, the vapor-depositing material emitted to a wider range is usable for vapor deposition as described below with reference to the figures. The vapor deposition zones 60a and 60b in the vapor deposition device 100 both include only planar transportation zones. The vapor deposition zones 60a and 60b only need to include at least planar transportation zones. For example, as in embodiments described below, the vapor deposition zones 60a and 60b may include a curved transportation zone in which the substrate 4 is transported along a guide member.

Figure 35:
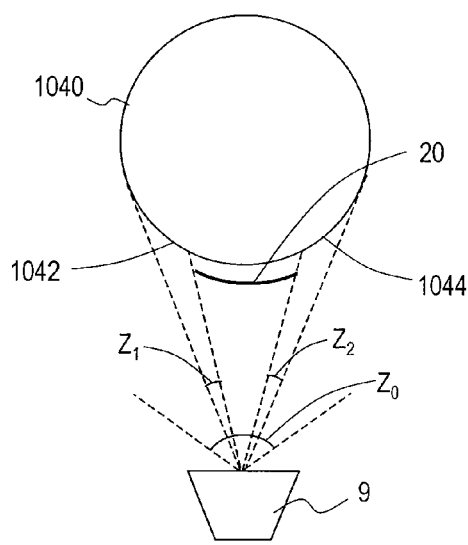
FIG. 35(a) is a schematic cross-sectional view showing an example of vapor deposition zone formed of only a curved transportation zone.
FIG. 35(b) is a schematic cross-sectional view showing an example of vapor deposition zone including a planar transportation zone.
Figure 35:
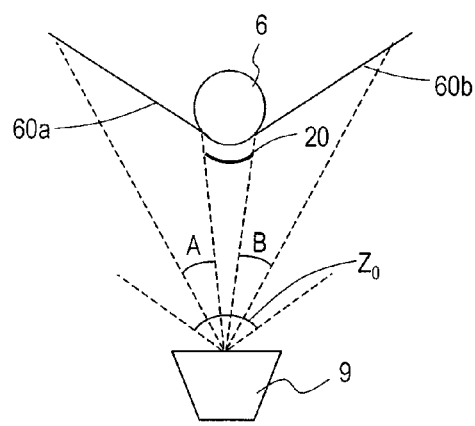

FIG. 35(a) is a schematic cross-sectional view showing an example of vapor deposition zone in the case where vapor deposition is performed only on a rotatable can, namely, an example of vapor deposition zone formed of a curved transportation zone. FIG. 35(b) is a schematic cross-sectional view showing an example of vapor deposition zone including a planar transportation zone. For simplicity, in these figures, identical elements with those in FIG. 2 bear identical reference numerals therewith, and descriptions thereof will be omitted.

As seen from FIG. 35(a), in the case where vapor deposition is performed on a rotatable can 1040, two vapor deposition zones 1042 and 1044 are formed in a part, of a surface of the rotatable can 1040, which is within an angle range $Z_0$ (vapor deposition possible zone) in which the vapor-depositing material are scattered. An angle range made by a straight line connecting a top end of the vapor deposition zone 1042 and the center of the evaporation surface 9 and a straight line connecting a bottom end of the vapor deposition zone 1042 and the evaporation surface 9 is labeled as $Z_1$. An angle range made by a straight line connecting a top end of the vapor deposition zone 1044 and the center of the evaporation surface 9 and a straight line connecting a bottom end of the vapor deposition zone 1044 and the evaporation surface 9 is labeled as $Z_2$. Then, the ratio of the emission angle range of the vapor-depositing material usable for vapor deposition, with respect to the angle range in which the vapor-depositing material is scattered, is represented by $(Z_1+Z_2)/Z_0$. This ratio is determined by the size (diameter) and the number of the rotatable can(s) 1040, the distance between the rotatable can (s) 1040 and the evaporation source 9 and the like. It is very difficult to increase the ratio while controlling the vapor deposition angle in each of the vapor deposition zones 1042 and 1044.

By contrast, according to this embodiment, as shown in FIG. 35(b), the angle ranges A and B can be arbitrarily set regardless of the diameter of the guide member 6. Therefore, the ratio of the emission angle ranges A and B of the vapor-depositing material usable in the vapor deposition zones 60a and 60b, with respect to the angle range $Z_0$ in which the vapor-depositing material is scattered, i.e., $(A+B)/Z_0$, can be made larger than the above-described ratio $(Z_1+Z_2)/Z_0$ in the conventional vapor deposition device. In addition, this embodiment is advantageous because the vapor deposition angle in each of the vapor deposition zones 60a and 60b can be more easily controlled by the location of the transportation rollers or the like. In order to further improve the utilization factor of the vapor-depositing material, a plurality of V-shaped paths may be provided by locating a plurality of guide members 6 in the vapor deposition possible zone as in embodiments described later. In addition to performing vapor deposition in the planar transportation zones, vapor deposition may also be performed on the guide member 6.

Moreover, in the case where vapor deposition is performed on the rotatable can 1040, the diameter of the rotatable can 1040 needs to be large to some extent in order to form the vapor deposition zones 1042 and 1044 having a sufficient size. This makes it difficult to provide many rotatable cans in the vapor deposition possible zone. By contrast, in the case where vapor deposition is performed in planar transportation zones, many planar transportation zones can be formed for one evaporation source as in embodiments described later. Therefore, the vapor deposition steps with different vapor deposition directions can be performed efficiently.

<Production Steps of the Film>

Hereinafter, with reference to the figures, steps of forming a vapor deposition film in the first and second vapor deposition zones 60a and 60b will be described in detail. Here, silicon is used as the vapor-depositing material and vapor deposition is performed while oxygen is supplied from the nozzle section 22, so as to form a film of an oxide of silicon ($SiO_x$, $0<x<2$) as the vapor deposition film.

Figure 3:
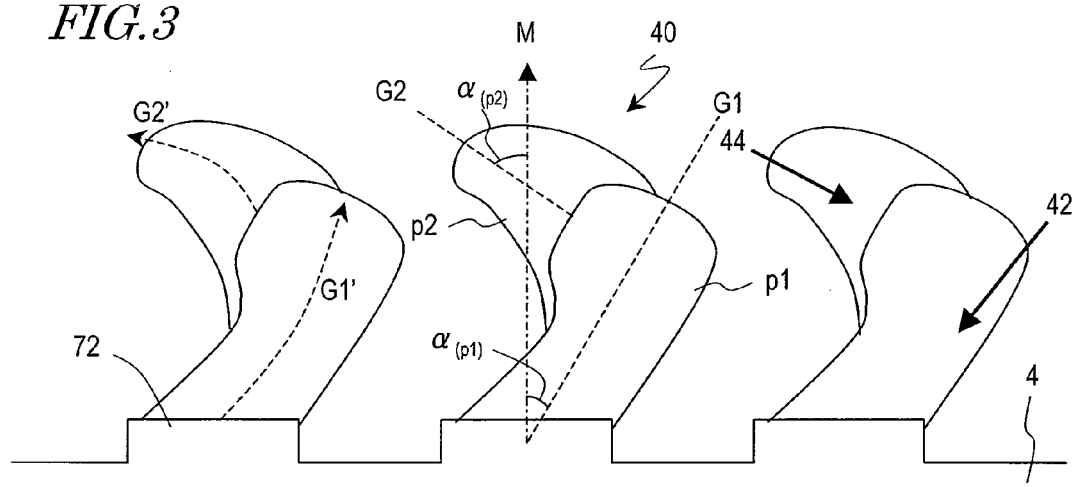
FIG. 3 is a schematic cross-sectional view of active material bodies (stacking number n=2) formed using the vapor deposition device in Embodiment 1 of the present invention.

FIG. 3 schematically shows an example of vapor deposition film (film of an oxide of silicon) and shows a cross-section which is vertical to the substrate 4 and includes an incidence direction (vapor deposition direction) of silicon.

First, in the first vapor deposition zone 60a, silicon is incident on the surface of the substrate 4 in a direction 42 inclined with respect to the direction of normal M to the substrate 4 at an angle of 60° or greater and 75° or smaller. At this point, silicon is likely to be vapor-deposited on projections 72 located on the surface of the current collector 4, and therefore an oxide of silicon grows like columns on the projections 72. In the meantime, on the surface of the current collector 4, areas are formed which are shadowed by the projections 72 and the oxide of silicon growing like the columns, and on which Si atoms are not incident and the oxide of silicon is not vapor-deposited (shadowing effect). In the example shown in FIG. 3, because of the shadowing effect, Si atoms are not attached and an oxide of silicon do not grow on grooves between adjacent projections 72 on the surface of the current collector 4. As a result, the oxide of silicon is selectively grown like columns on the projections 72 on the current collector 4, and thus a first part p1 is obtained (first stage vapor deposition step). A growth direction G1 of the first part p1 is inclined with respect to the normal direction M to the substrate 4.

Then, the substrate 4 is transported to the second vapor deposition zone 60b. In the second vapor deposition zone 60b, silicon is incident on the surface of the substrate 4 in a direction 44 inclined in the opposite direction to the direction 42 with respect to the normal direction M to the substrate 4 at an angle of 60° or greater and 75° or smaller. At this point, silicon is selectively incident on the first part p1 formed on the current collector 4 because of the above-described shadowing effect. As a result, a second part p2 having a growth direction G2 inclined with respect to the normal direction M to the current collector 4 is obtained on the first part p1 (second stage vapor deposition step).

The growth directions G1 and G2 of the first and second parts p1 and p2 are respectively determined by the incidence directions 42 and 44 of silicon. Accordingly, in this embodiment, the growth direction G2 of the second part p2 is inclined in the opposite direction to the growth direction G1 of the first part p1 with respect to the normal direction M to the current collector 4. Here, an angle (growth angle) made by each of the growth directions G1 and G2 of the first and second parts p1 and p2 and the normal direction M to the substrate 4 is labeled as $\alpha_{(p1)}$, $\alpha_{(p2)}$. An angle (incidence angle) made by the normal direction M to the substrate 4 and each of the incidence directions 42 and 44 of silicon is labeled as $\theta_{(p1)}$, $\theta_{(p2)}$. Then, these angles fulfill the relationships of $2 \tan \alpha_{(p1)} = \tan \theta_{(p1)}$ and $2 \tan \alpha_{(p2)} = \tan \theta_{(p2)}$.

In this manner, two-layer active material bodies 40 (stacking number=2) including two parts of different growth directions are formed. Since one active material body 40 is provided on each projection 72 formed on the surface of the current collector 4, a sufficient space can be secured between adjacent active material bodies 40. Hence, the problem of electrode deformation caused by the expansion stress on the active material body 40 or the like can be solved.

In the case where the stacking type active material bodies 40 as shown in the figure are formed, it is preferable that the incidence angles θ2 and θ3 of the vapor-depositing material at the bottom ends 62L and 64L of the first and second vapor deposition zones 60a and 60b are substantially equal to each other. The reason for this will be described, hereinafter.

The concentration of the vapor-depositing material evaporated from evaporation surface 9s is higher as being closer to the line extending from the center of the evaporation surface 9s vertical to the evaporation surface 9s (hereinafter, referred to simply as the "normal passing through the center of the evaporation surface 9s") and as being closer to the evaporation surface 9s. Therefore, in the vapor deposition zone 60a, the vapor deposition amount is larger in the vicinity of the bottom end 62L than in the vicinity of the top end 62U. As a result, the growth direction G1 of the first part p1 formed in the first vapor deposition zone 60a is mainly determined by the incidence angle θ2. Similarly, the growth direction G2 of the second part p2 formed in the second vapor deposition zone 60b is mainly determined by the incidence angle θ3 at the bottom end 64U, in the vicinity of which the vapor deposition amount is large. At this point, where the incidence angles θ2 and θ3 are substantially equal to each other, the parts p1 and p2 included in the active material body 40 can be inclined at a substantially equal angle opposite to each other with respect to the normal direction to the substrate 4. This is advantageous because the active material body 40 as a whole can be grown along the normal direction to the substrate 4.

Now, the shapes of the first and second parts p1 and p2 will be described in more detail. Referring to FIG. 3, the growth directions G1 and G2 of the first part p1 and the second part p2 represent the growth directions of the first part p1 and the second part p2 as straight lines obtained by averaging the growth directions. In actuality, the growth direction of each of the first part p1 and the second part p2 changes as the corresponding part grows. Specifically, as represented by arrows G1' and G2', the angle (growth angle) α made by the growth direction of the first part p1 and the normal direction M is actually large during the initial period of the first stage vapor deposition step and decreases as the first part p1 grows. The reason is as follows. During the first stage vapor deposition step, vapor deposition is performed on the substrate 4 moving toward the evaporation source 9 from the top end to the bottom end of the first vapor deposition zone 60a. As the substrate 4 becomes closer to the evaporation source 9, the incidence angle θ of the vapor-depositing material with respect to the normal direction M to the substrate 4 decreases (see FIG. 2). For example, the growth direction G1' of the first part p1 in the vicinity of the substrate 4 is determined by the incidence angle θ at the top end of the vapor deposition zone 60a (θ1, θ4 shown in FIG. 2), whereas the growth direction G1' of the first part p1 at and in the vicinity of a top surface of the first part p1 is determined by the incidence angle θ at the bottom end of the vapor deposition zone 60a (θ2, θ3 shown in FIG. 2; θ2<θ1, θ3<θ4). Therefore, the growth angle of the first part p1 in the vicinity of the substrate 4 is larger than the growth angle thereof in the vicinity of the top end of the first part p1.

By contrast, the growth angle α made by the growth direction of the second part p2 and the normal direction M is actually small during the initial period of the second stage vapor deposition step and increases as the second part p2 grows. The reason is as follows. During the second stage vapor deposition step, vapor deposition is performed on the substrate 4 moving away from the evaporation source 9 from the bottom end to the top end of the second vapor deposition zone 60b. As the substrate 4 becomes farther from the evaporation source 9, the incidence angle θ of the vapor-depositing material with respect to the normal direction M to the substrate 4 increases.

Accordingly, in the cross-section shown in FIG. 3, the first part p1 is warped upward (in the direction of rising) along the actual growth direction G1', whereas the second part p2 is warped downward along the actual growth direction G2'.

The first part p1 has a width which increases as the first part p1 grows. The reason is as follows. As described above, the concentration of the vapor-depositing material is higher as being closer to the evaporation source 9. Therefore, as the first stage vapor deposition step proceeds and as the substrate 4 becomes closer to the evaporation source 9, the amount of the vapor-depositing material incident on the substrate 4 (vapor deposition amount) increases. By contrast, the second part p2 has a width which decreases as the second part p2 grows. The reason is as follows. As the second stage vapor deposition step proceeds and as the substrate 4 becomes farther from the evaporation source 9, the vapor deposition amount on the substrate 4 decreases.

In the above, the two-layer active material bodies 40 are described with reference to FIG. 3. By repeating the vapor deposition while inverting the transportation direction of the substrate 4, active material bodies having three or more layers can be formed. For example, after the second stage vapor deposition step is finished, the substrate 4 taken up by the second roll 8 is transported toward the first roll 3 to further perform vapor deposition. By allowing the substrate 4 to pass through the first and second vapor deposition zones 60a and 60b a plurality of times by switching the transportation direction, active material bodies having an arbitrary stacking number n can be formed.

Figure 4:
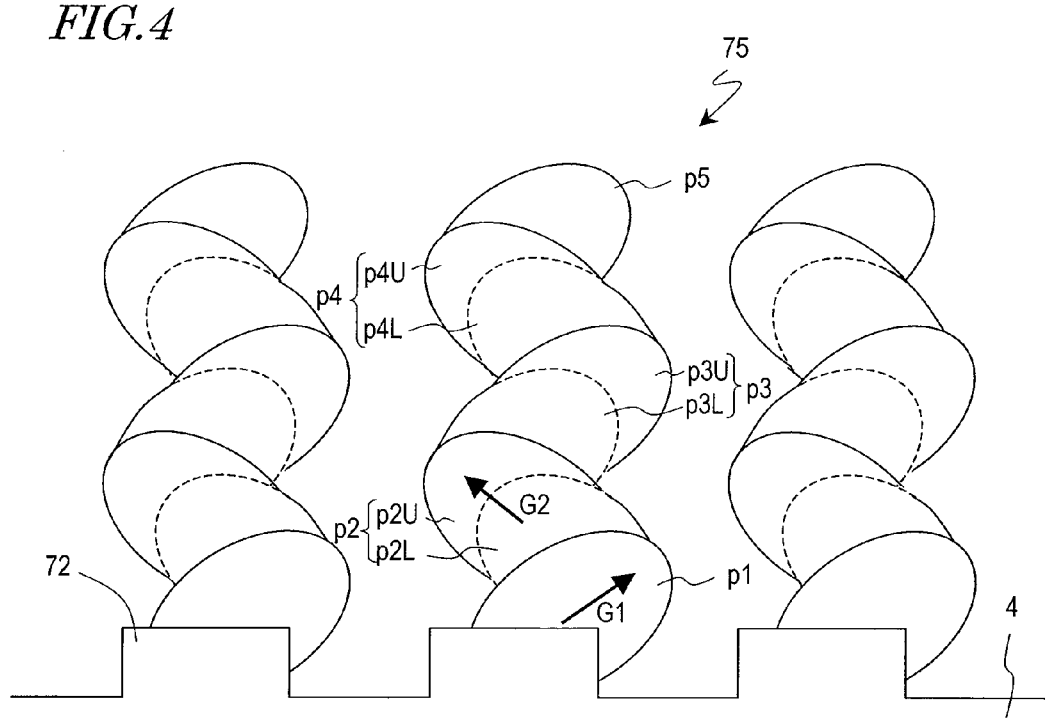
FIG. 4 is a schematic cross-sectional view of active material bodies (stacking number n=5) formed using the vapor deposition device in Embodiment 1 of the present invention.

FIG. 4 is a cross-sectional view showing an example of vapor deposition film including active material bodies having five layers (stacking number n=5) formed using the vapor deposition device 100. Active material bodies 75 shown in FIG. 4 are formed as follows, for example.

First, the above-described first and second stage vapor deposition steps are carried out. As a result, the first part p1 inclined with respect to the normal direction M to the substrate 4 and a lower layer p2L of a second part inclined oppositely to the first part p1 with respect to the normal direction M to the substrate 4 are formed. After the second stage vapor deposition step, the substrate 4 is taken up by the second roll 8.

Next, the substrate 4 is fed out from the second roll 8 and heated by the heating section 16b. Then, the substrate 4 is guided to the second vapor deposition zone 60b. In the second vapor deposition zone 60b, silicon atoms are incident in the above-described direction 44. Therefore, the oxide of silicon is further grown on the lower layer p2L of the second part in substantially the same direction as the growth direction G2 of the second part p2. Thus, an upper layer p2U of the second part is formed (third stage vapor deposition step). As a result, the second part p2 including the lower layer p2L and the upper layer p2U is obtained.

Next, the substrate 4 is guided to the first vapor deposition zone 60a. In the first vapor deposition zone 60a, a lower layer p3L of a third part growing parallel to the growth direction G1 of the first part p1 is formed on the second part p2 (fourth stage vapor deposition step). After this, the substrate 4 is taken up by the first roll 3. The transportation direction is inverted, and the substrate 4 is guided to the first vapor deposition zone 60a and vapor deposition is performed to obtain an upper layer p3U of the third part (fifth stage vapor deposition step). By repeating the vapor deposition until the eighth stage vapor deposition step is performed while switching the transportation direction, active material bodies 75 (stacking number n=5) can be obtained.

In the case where the vapor deposition is repeated while switching the transportation direction, it is preferable that the lengths and the positions of the first and second vapor deposition zones 60a and 60b are adjusted such that the ratio of the film formation amount in the first vapor deposition zone 60a (for example, the thickness of the first part p1) and the film formation amount in the second vapor deposition zone 60b (for example, the thickness of the lower layer p2L of the second part p2) is substantially 1:1. Where the ratio is significantly different from 1:1, the active material bodies as a whole are inclined in one direction. As a result, the space between adjacent active material bodies becomes smaller as being closer to the surface of the current collector. Hence, the active material bodies collide against each other at the time of charge, which causes a problem that the substrate is likely to be wrinkled. By contrast, where the transportation section is located such that the ratio is 1:1, the active material bodies 75 as a whole can be grown substantially in the normal direction to the surface of the substrate 4. Therefore, the above-described problem can be solved.

Although not shown in FIG. 4 for simplicity, active material bodies having three or more layers may also be formed. Like the first part p1 described above with reference to FIG. 3, the parts p1, p2U, p3U and p4U obtained by the step of performing vapor deposition while moving the substrate 4 toward the evaporation source 9 become wider and warped upward (in the direction of rising) as growing. Like the second part p2 described above with reference to FIG. 3, the parts p2L, p3L, p4L and p5 obtained by the step of performing vapor deposition while moving the substrate 4 away from the evaporation source 9 become narrower and warped downward as growing. Note that the "warp" and the change in the width of each part may not occasionally be confirmed by observing the cross-section depending on the stacking number n of the active material body or the thickness of each part.

Figure 13:
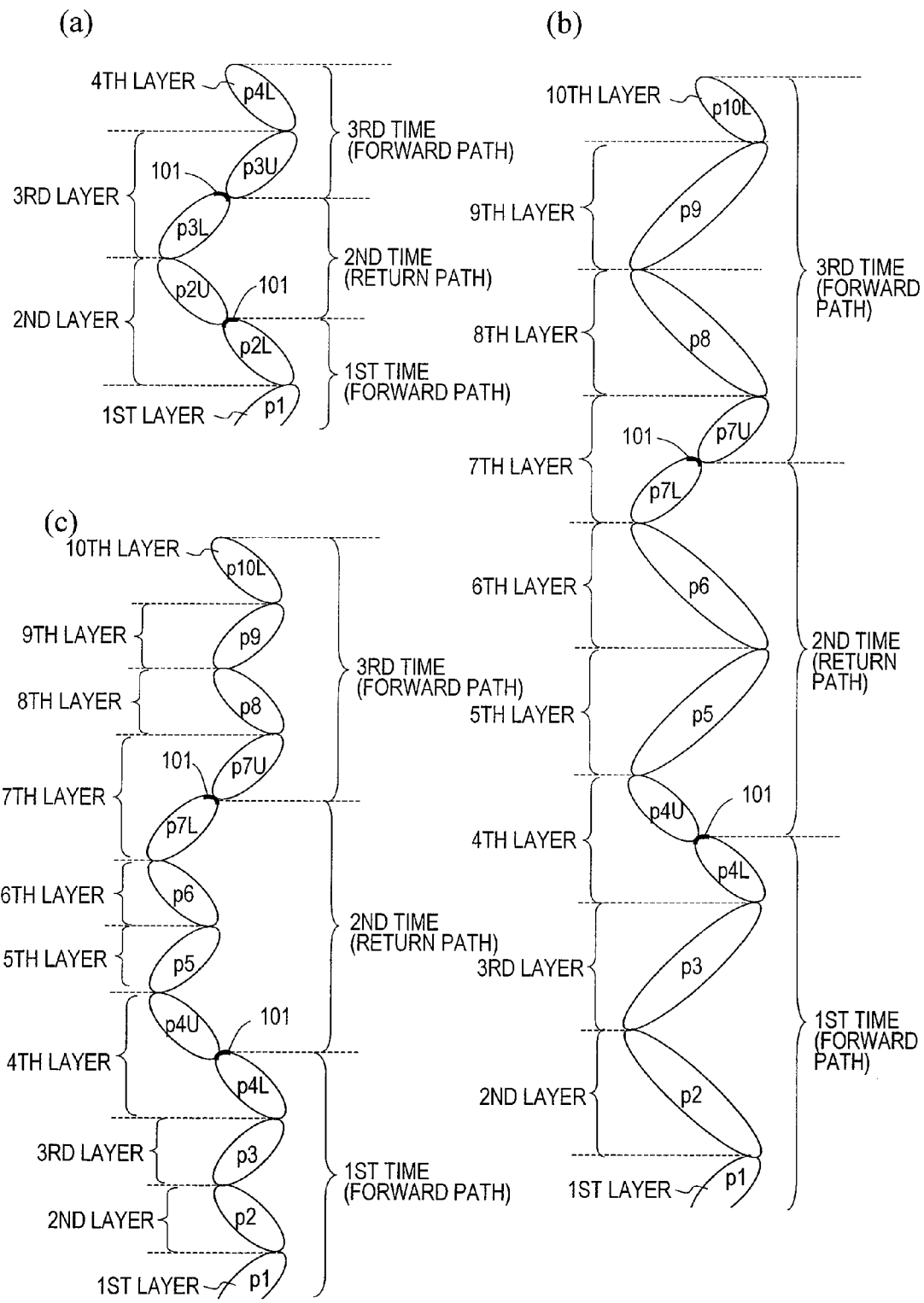
FIG. 13 is provided to explain the relationship between the transportation number of times C of the substrate and the stacking number n of the film (active material body)

The film obtained using the vapor deposition device in this embodiment has the following advantages over the film obtained by the batch system vapor deposition device as described in, for example, Patent Document 2. In the batch system vapor deposition device, oblique vapor deposition is performed while the fixing table for fixing the substrate is inclined so as to have a prescribed angle with respect to the evaporation source. As necessary, a plurality of stages of vapor deposition may be performed while switching the inclination direction of the fixing table. However, with such a vapor deposition device, the fixing table is usually located such that a central part of the surface of the substrate is located on the normal to the center of the evaporation source. Therefore, even when the inclination direction of the fixing table is switched, only the central part of the surface of the substrate is always in a zone having the highest concentration of the vapor-depositing material. For this reason, the vapor deposition amount is large in the central part of the surface of the substrate and is small in the vicinity of the ends of the surface of the substrate. It is difficult to form a vapor deposition film having a uniform thickness. By contrast, using the vapor deposition device in this embodiment, a film having a uniform thickness (height of the active material bodies) over the entirety of the sheet-like substrate 4 can be formed. In addition, a film obtained by the batch system vapor deposition device, unlike the film formed using the vapor deposition device in this embodiment, is not "warped", is changed in the width, or does not have a stacking structure described later with reference to FIG. 13.

In this embodiment, in order that the temperature of the substrate 4 heated by the heating sections 16a and 16b does not exceed 500° C. while the substrate 4 passes through the vapor deposition zones 60a and 60b respectively, it is preferable that the transportation rollers (including the first guide member 6), except for the transportation rollers along which the substrate 4 passes immediately after being heated by the heating sections 16a and 16b, are cooled. The transportation speed of the substrate 4 by the transportation section and the vapor deposition rate are appropriately adjusted such that the temperature of the substrate 4 does not exceed 500° C.

As described above, by adjusting the temperature of the substrate 4 running in the first and second vapor deposition zones 60a and 60b to the range of, for example, 200° C. or higher and lower than 500° C., the growth angle α of the active material bodies (angle made by the normal direction M to the substrate 4 and the growth directions G1 and G2) can be adjusted. As described above, the growth angle α of the active material bodies is determined by the incidence angle θ of the vapor-depositing material (2 tan α=tan θ; hereinafter, referred to as the "tan rule"). When the incidence angle θ is 60° or larger, the growth angle α tends to be smaller than the angle determined by the tan rule. In this case, if the temperature of the substrate 4 is lower than the above-described range, the growth angle α is especially small. Where the zigzag active material bodies are formed at a small growth angle α, the active material bodies are wider than the active material bodies grown at a growth angle conformed to the tan rule. As a result, a sufficient space between the active material bodies cannot be secured. Where such active material bodies are used to form an electrode, the active material bodies collide against each other at the time of charge, which may buckle or wrinkle the substrate, for example. The term "buckle" means that the substrate (electrode substrate) is bent by an expansion stress. When buckle occurs, the cross-section of the electrode is waved. By controlling the temperature of the substrate 4 to the range of 200° C. or higher, the growth angle α of the active material bodies can be made closer to the growth angle determined by the tan rule and thus a sufficient space can be secured between the active material bodies. By contrast, where the temperature of the substrate 4 is lower than 500° C., the substrate 4 can be prevented from being wrinkled by thermal deformation thereof. In the case where a copper substrate is used as the substrate 4, diffusion of silicon in the copper substrate can be prevented at such a temperature.

In this embodiment, the heating sections 16a and 16b are located outside the vapor deposition zones to heat the substrate 4 before the substrate 4 reaches the vapor deposition zones 60a and 60b. The heating sections 16a and 16b may be located in the first and second vapor deposition zones 60a and 60b. Note that it is preferable to locate the heating sections 16a and 16b so as to heat the substrate 4 immediately before the substrate 4 reaches the first and second vapor deposition zones 60a and 60b as in this embodiment because the temperature of the substrate 4 before vapor deposition can be controlled more accurately.

Figure 5:
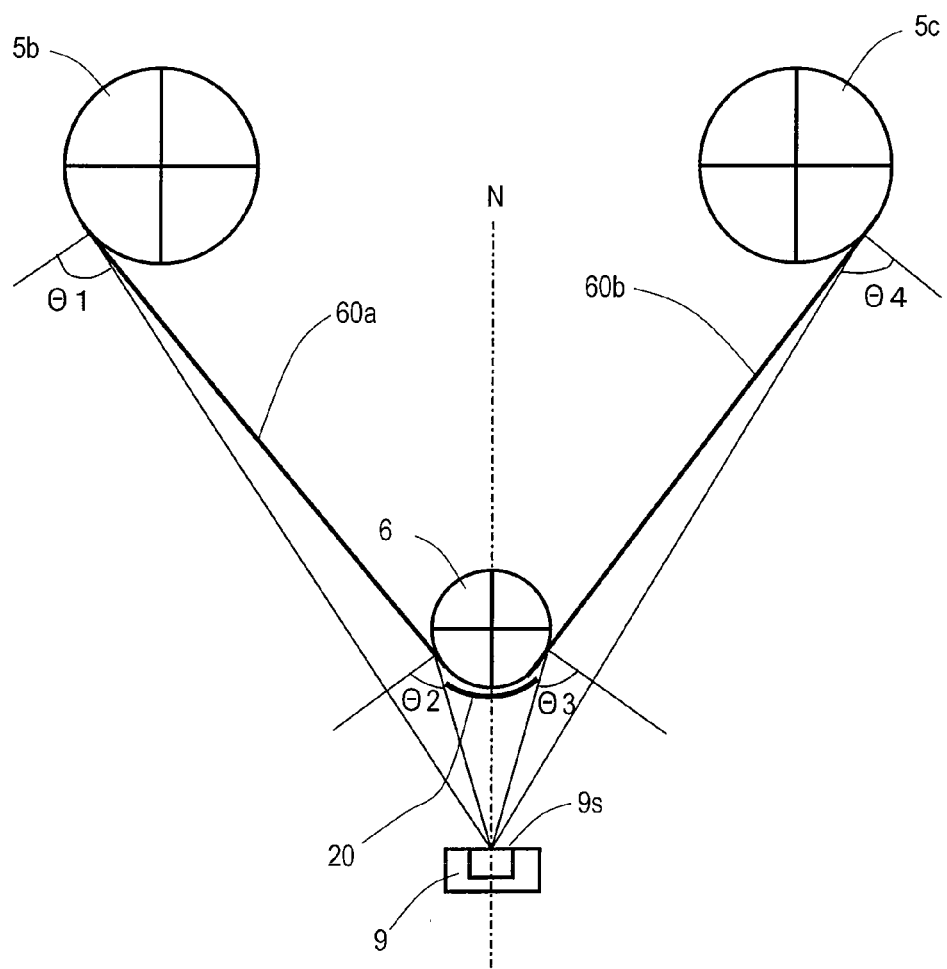
FIG. 5 is a cross-sectional view provided to explain a structure of another vapor deposition device according to Embodiment 1 of the present invention.

Instead of the structure shown in FIG. 2, as shown in FIG. 5, the first and second vapor deposition zones 60a and 60b may be formed so as to be line-symmetrical with respect to the normal N passing through the center of the evaporation surface 9s in the cross-section. This structure has the following advantages. The incidence angles θ2 and θ3 in the vapor deposition zones 60a and 60b can be easily made equal to each other (θ2=θ3), and also the amount vapor-deposited in the vapor deposition zones 60a and 60b (vapor deposition amount) can be easily adjusted to be substantially equal to each other. As a result, the active material body as a whole can be easily grown substantially in the normal direction to the substrate 4. Meanwhile, with the structure shown in FIG. 1 and FIG. 2, a zone with a high concentration of the vapor-depositing material evaporated from the evaporation surface 9s (a central zone including the normal N passing through the center of the evaporation surface 9s) in the vapor deposition possible zone is usable for vapor deposition. Thus, the structure shown in FIG. 1 and FIG. 2 has an advantage that the vapor-depositing material can be efficiently usable.

Using the vapor deposition device in this embodiment, an arbitrary stacking number n of the active material bodies can be formed continuously on the surface of the sheet-like substrate 4. In the case of forming active material bodies having a stacking number n of 30 or greater, the cross-section of each active material body may not be zigzag or inclined along the growth direction but may be like a column standing upright along the normal direction to the substrate 4. Even in this case, it can be confirmed that the active material body grows zigzag from the bottom surface to the top surface thereof regardless of the cross-sectional shape by, for example, observing the cross-section by an SEM.

These active material bodies are located with a prescribed space provided therebetween on the surface of the substrate 4. Therefore, the space between adjacent active material bodies is usable as an expansion space for accommodating the expansion of the active material bodies during the charge/discharge. Accordingly, the stress on the active material bodies is alleviated so as to suppress the shortcircuiting between the positive and negative electrodes. As a result, a cell having a high charge/discharge cycle characteristic can be obtained.

The operation of the vapor deposition device 100 has been described in the case of forming active material bodies of an oxide of silicon. The vapor-depositing material to be used or the use of the vapor deposition film are not limited to those in this example. In the above, the vapor deposition film is formed by reacting the vapor-depositing material evaporated from the evaporation source 9 (silicon atoms) with the gas supplied from the nozzle section 22 (oxygen gas). Alternatively, only the vapor-depositing material may be grown on the surface of the substrate 4 without supplying gas.

Embodiment 2

Hereinafter, a vapor deposition device according to Embodiment 2 of the present invention will be described with reference to the figure. In this embodiment, two V-shaped substrate paths (V-shaped paths) as described in EMBODIMENT 1 are provided in the vapor deposition possible zone in the chamber; namely, four vapor deposition zones in total are provided.

Figure 6:
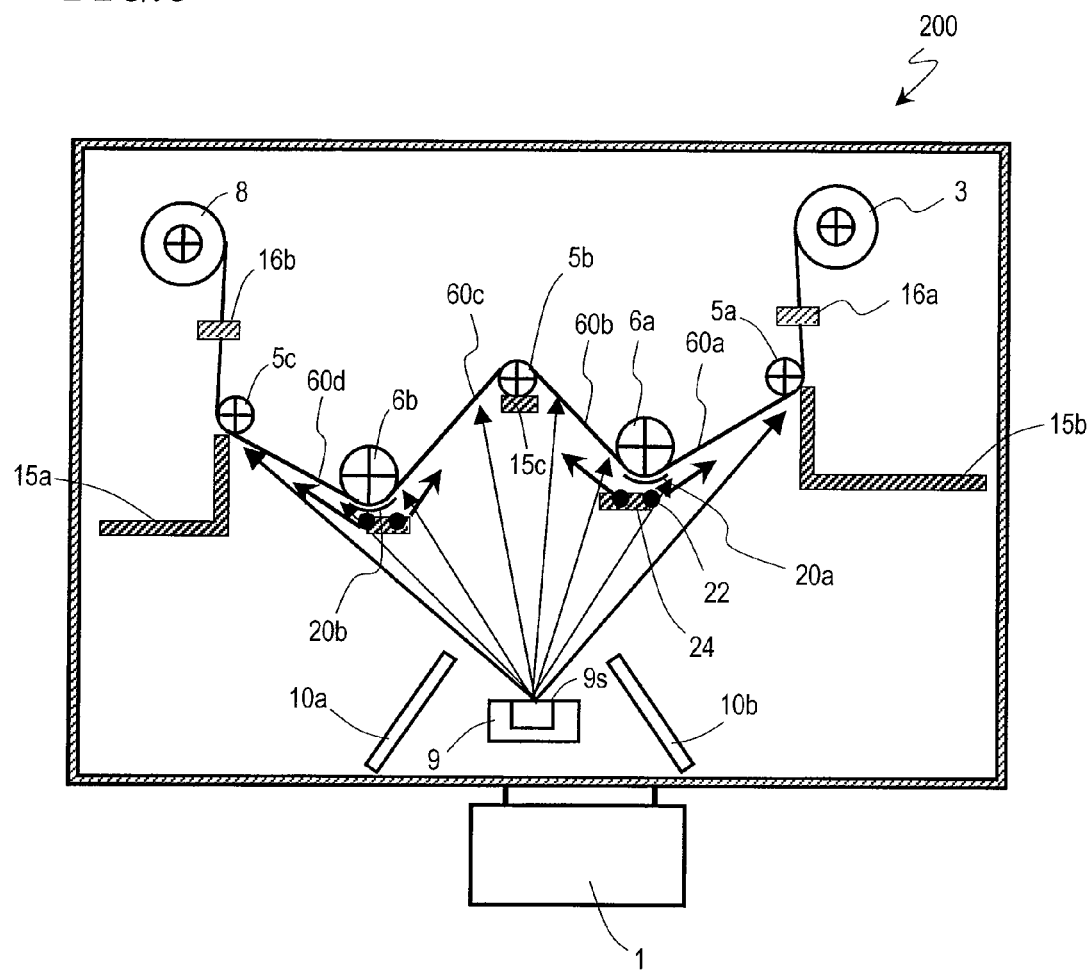
FIG. 6 is a schematic cross-sectional view of a vapor deposition device according to Embodiment 2 of the present invention.

FIG. 6 is a cross-sectional view schematically showing a vapor deposition device according to EMBODIMENT 2 of the present invention. For simplicity, identical elements with those of the vapor deposition device 100 in FIG. 1 bear identical reference numerals therewith, and descriptions thereof will be omitted. A vapor deposition device 200 shown in FIG. 6 includes a transportation section including first and second rolls 3 and 8, transportation rollers 5a through 5c, and first and second guide members (transportation rollers) 6a and 6b, and thus defines a transportation path of the substrate 4.

The transportation rollers 5a, 6a, 5b, 6b and 5c are sequentially located in this order from the first roll side on the transportation path of the substrate 4. In this embodiment, the first guide member 6a is located below the transportation rollers 5a and 5b adjacent thereto, and guides the substrate 4 such that the surface of the substrate 4 to be subjected to the vapor-depositing material is convexed toward the evaporation source 9. Thus, a V-shaped path is formed. Between the first guide member 6a and the evaporation source 9, a first shielding member 20a is located, which prevents the vapor-depositing material evaporated from the evaporation surface 9s of the evaporation source 9 from being incident in the normal direction to the substrate 4 and also separates the vapor deposition zone of the V-shaped path into two. Owing to such a structure, on this V-shaped path, a first vapor deposition zone 60a located on the first roll side with respect to the first shielding member 20a and a second vapor deposition zone 60b located on the second roll side with respect to the first shielding member 20a are formed. Similarly, the second guide member 6b is located below the transportation rollers 5b and 5c adjacent thereto, and guides the substrate 4 such that the surface of the substrate 4 to be subjected to the vapor-depositing material is convexed toward the evaporation source 9. Thus, a V-shaped path is formed. Between the second guide member 6b and the evaporation source 9, a first shielding member 20b is located, which prevents the vapor-depositing material evaporated from the evaporation surface 9s of the evaporation source 9 from being incident in the normal direction to the substrate 4 and also separates the vapor deposition zone of the V-shaped path into two. Owing to such a structure, on this V-shaped path, a third vapor deposition zone 60c located on the first roll side with respect to the first shielding member 20b and a fourth vapor deposition zone 60d located on the second roll side with respect to the first shielding member 20b are formed. The incidence directions of the vapor-depositing material in the vapor deposition zones 60a through 60d are controlled to be inclined by an angle of 45° or greater and 75° or smaller with respect to the normal direction to the substrate 4. In the case where the surface of the substrate 4 to be subjected to the vapor-depositing material is transported in two V-shaped paths continuously, namely, in a W-shaped manner as in this embodiment, the transportation path may be occasionally referred to as the "W-shaped path".

In the vapor deposition device 200 in this embodiment, four vapor deposition zones are formed in the vapor deposition possible zone. Therefore, the vapor-depositing material emitted to a wider angle is usable for vapor deposition and thus the utilization factor of the vapor-depositing material can be further improved. In addition, after four stages of vapor deposition are continuously performed on the surface of the substrate 4 while switching the vapor deposition direction, the transportation direction may be switched to further perform multiple stages of vapor deposition. Accordingly, active material bodies having an arbitrary stacking number n (for example, n=30 to 40) can be continuously formed on the surface of the substrate 4.

The vapor deposition device 200 preferably includes shielding plates 15a and 15b having walls facing the vapor deposition surface of the substrate 4 passing through the first and fourth vapor deposition zones 60a and 60d. Owing to this, gas emitted from a plurality of emission openings provided in side surfaces of the nozzle section 22 can be efficiently caused to reside in the vapor deposition zones 60a and 60d.

It is preferable that the surface of the wall of each of the shielding plates 15a and 15b acts as a facing surface for alleviating the temperature difference caused, by the radiant heat from the evaporation surface 9, to the vapor deposition surface of the substrate 4 passing through the corresponding vapor deposition zone. It is preferable that the vapor deposition surface of the substrate 4 passing through the second vapor deposition zone 60b and the vapor deposition surface of the substrate 4 passing through the third vapor deposition zone 60c face each other and each acts as a facing surface for alleviating the temperature difference caused, by the radiant heat from the evaporation surface 9, to the facing vapor deposition surface. Owing to such a structure, the temperature difference can be reduced in all the vapor deposition zones 60a through 60d to form a more uniform vapor deposition film. It is not absolutely necessary that the vapor deposition device in this embodiment includes the shielding plates 15a and 15b having the walls or that the vapor deposition surfaces of the substrate 4 passing through the facing vapor deposition zones act as the "facing surfaces" to each other. However, it is advantageous that the vapor deposition surface of the substrate 4 passing through at least one of the vapor deposition zones is structured to face a surface, which is the target of alleviation of the temperature difference caused by the radiant heat from the evaporation source 9, because this can suppress the uniformity of the vapor deposition film from being deteriorated by the temperature difference.

Hereinafter, a method for forming a vapor deposition film using the vapor deposition device 200 will be described.

First, the substrate 4 is transported from the first roll 3 to the first vapor deposition zone 60a. Next, in the first vapor deposition zone 60a, while the substrate 4 is moved toward the evaporation source 9, the vapor-depositing material evaporated from the evaporation source 9 is incident on the surface of the substrate 4 in a direction inclined with respect to the normal to the surface of the substrate 4 (incidence direction) to deposit the vapor-depositing material (first stage vapor deposition step). As a result, a first film is formed on the surface of the substrate 4.

Next, the substrate 4 is transported to the second vapor deposition zone 60b. In the second vapor deposition zone 60b, while the substrate 4 is moved away from the evaporation source 9, the vapor-depositing material is incident on the surface of the substrate 4 in a direction inclined oppositely to the incidence direction in the first stage vapor deposition step with respect to the normal to the surface of the substrate 4 (second stage vapor deposition step). As a result, a second film is formed on the first film.

Then, the substrate 4 is transported to the third vapor deposition zone 60c. In the third vapor deposition zone 60c, while the substrate 4 is moved toward the evaporation source 9, the vapor-depositing material is incident on the surface of the substrate 4 in a direction inclined on the same side as the incidence direction in the first stage vapor deposition step with respect to the normal to the surface of the substrate 4 (third stage vapor deposition step). As a result, a third film is formed on the second film.

Then, the substrate 4 is transported to the fourth vapor deposition zone 60d. In the fourth vapor deposition zone 60d, while the substrate 4 is moved away from the evaporation source 9, the vapor-depositing material is incident on the surface of the substrate 4 in a direction inclined oppositely to the incidence direction in the first stage vapor deposition step with respect to the normal to the surface of the substrate 4 (fourth stage vapor deposition step). As a result, a fourth film is formed on the third film.

After the first through fourth films are formed, the substrate 4 is taken up by the second roll 8. In this manner, a film having a stacking structure (stacking number n: 4) is formed.

After the fourth stage vapor deposition step, the substrate 4 may be transported from the second roll 8 to the first roll 3 to perform another four stages of vapor deposition.

In this case, the substrate 4 is first transported to the fourth vapor deposition zone 60d. In the fourth vapor deposition zone 60d, while the substrate 4 is moved toward the evaporation source 9, the vapor-depositing material is incident on the substrate 4 to form a fifth film on the fourth film (fifth stage vapor deposition step).

Next, the substrate 4 is transported to the third vapor deposition zone 60c. In the third vapor deposition zone 60c, while the substrate 4 is moved away from the evaporation source 9, the vapor-depositing material is incident on the substrate 4 to form a sixth film on the fifth film (sixth stage vapor deposition step).

Then, similarly, in the second vapor deposition zone 60b, while the substrate 4 is moved toward the evaporation source 9, a seventh stage vapor deposition step is carried out. In the first vapor deposition zone 60a, while the substrate 4 is moved away from the evaporation source 9, an eighth stage vapor deposition step is carried out. Then, the substrate 4 is taken up by the first roll 3.

The incidence direction and the incidence angle of the vapor-depositing material are determined by the angle made by the normal to the substrate 4 and the normal to the center of the evaporation source 9 in the vapor deposition zones 60a through 60d. Therefore, in the case where vapor deposition is performed in the same vapor deposition zone, the incidence direction and the incidence angle of the vapor-depositing material are the same regardless of the transportation direction of the substrate 4. For example, the fourth and fifth stage vapor deposition steps are both carried in the fourth vapor deposition zone 60d, and so the incidence direction and the incidence angle of the vapor-depositing material are the same.

Even after the eighth stage vapor deposition step, when necessary, the transportation direction of the substrate 4 may be switched to transport the substrate 4 sequentially from the first through fourth vapor deposition zones 60a through 60d and thus to further repeat substantially the same vapor deposition steps as the first through fourth stage vapor deposition steps. In this manner, an arbitrary number of stages of vapor deposition steps can be performed while the transportation direction of the substrate 4 is switched.

The vapor deposition device 200 further includes heating sections 16a and 16b respectively on the first roll side with respect to the first vapor deposition zone 60a and on the second roll side with respect to the fourth vapor deposition zone 60d for heating the substrate 4 to the range of 200° C. to 400° C. Owing to such a structure, when the substrate 4 is transported from the first roll 3 toward the second roll 8 via the W-shaped path, the substrate 4 can be heated by the heating section 16a before reaching the W-shaped path. When the substrate 4 is transported in the opposite direction, the substrate 4 can be heated by the heating section 16b before reaching the W-shaped path.

In the case where vapor deposition is repeated while switching the transportation direction of the substrate 4, it is preferable that the ratio among the film formation amounts in the first, second, third and fourth vapor deposition zones 60a, 60b, 60c and 60d is 1:2:2:1. Where the film formation amount in the first and fourth vapor deposition zones 60a and 60d through which the substrate 4 may possibly pass twice in a row is set to be ½ of the film formation amount in the other vapor deposition zones (the second and third vapor deposition zones 60b and 60c), the thickness of the parts of the zigzag active material body can be made substantially uniform. Thus, the active material body as a whole can be grown in the normal direction to the substrate 4. The expression "the substrate 4 passes through the vapor deposition zone twice in a row" means that the substrate 4 passes through the vapor deposition zone to form a vapor deposition film in a prescribed direction, and then, without a vapor deposition film being formed on the formed vapor deposition film in another direction in another vapor deposition zone, the substrate 4 passes through the same vapor deposition zone again by the transportation direction being switched and vapor deposition is performed.

Embodiment 3

Hereinafter, a vapor deposition device according to Embodiment 3 of the present invention will be described with reference to the figures. In this embodiment, two V-shaped substrate paths (V-shaped paths) are provided as in Embodiment 1; namely, four vapor deposition zones (first through fourth vapor deposition zones) 60a through 60d in total are provided. Note that unlike in the Embodiment 1, the transportation section in this embodiment is structured to put the substrate 4 upside down after the substrate 4 passes through the first and second vapor deposition zones 60a and 60b and to guide the substrate 4 to the third and fourth vapor deposition zones 60c and 60d.

Figure 7:
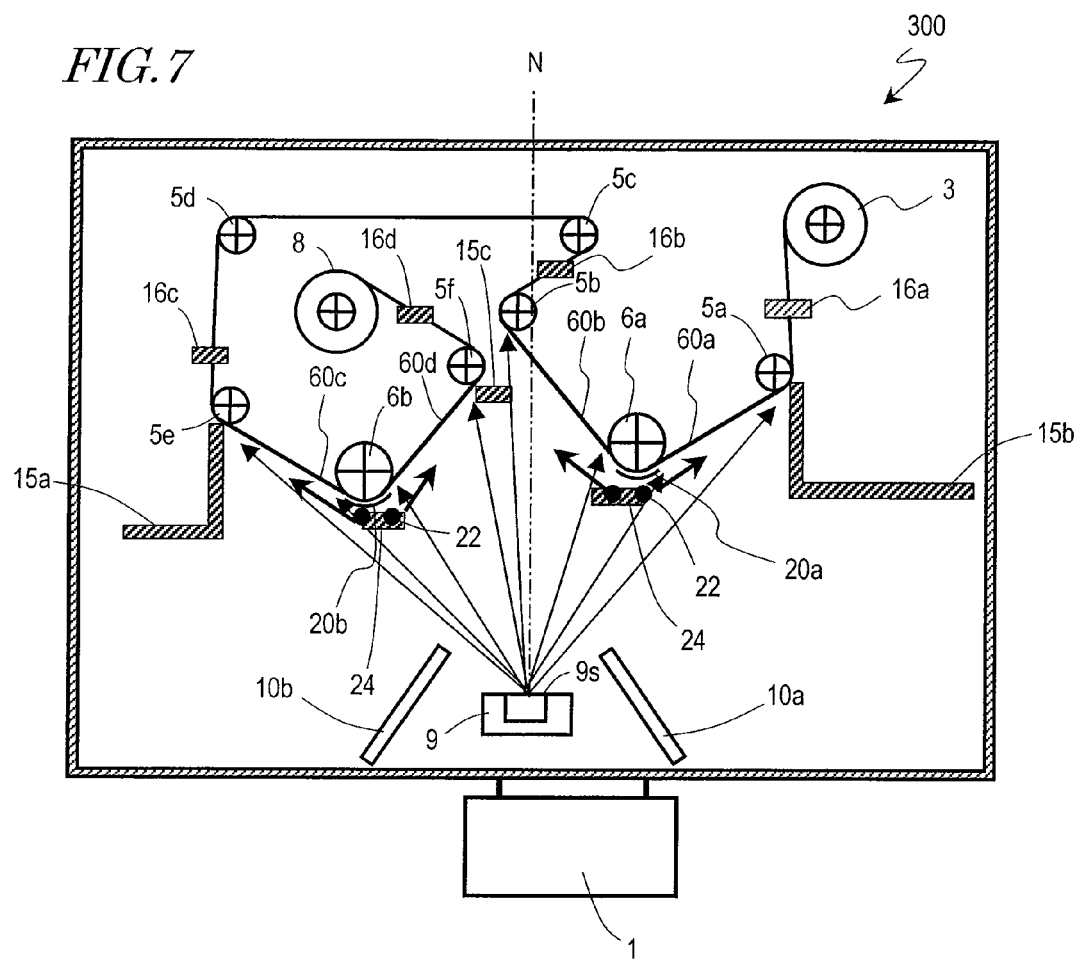
FIG. 7 is a schematic cross-sectional view of a vapor deposition device according to Embodiment 3 of the present invention.

FIG. 7 is a cross-sectional view showing an example of vapor deposition device in this embodiment. For simplicity, identical elements with those of the vapor deposition device 200 shown in FIG. 6 bear identical reference numerals therewith, and descriptions thereof will be omitted.

In a vapor deposition device 300, the transportation path of the substrate 4 is defined by the first and second rolls 3 and 8, the transportation rollers 5a through 5f, and first and second guide members 6a and 6b. The transportation rollers 5c through 5e are located between the second vapor deposition zone 60b and the third vapor deposition zone 60c on the transportation path of the substrate 4 so as to surround the second roll 8 (inversion structure). Owing to such a structure, the surface of the substrate 4 to face the evaporation source 9 can be inverted. Accordingly, while the substrate 4 passes through the first and second vapor deposition zones 60a and 60b, vapor deposition can be performed on one of the surfaces of the substrate 4 (this surface will be referred to as the "first surface"). While the substrate 4 passes through the third and fourth vapor deposition zones 60c and 60d, vapor deposition can be performed on the other surface of the substrate 4 (this surface will be referred to as the "second surface"). Therefore, using the vapor deposition device 300, vapor deposition films can be continuously formed on both surfaces of the substrate 4 while the chamber 2 is kept vacuum.

In this embodiment, the second vapor deposition zone 60b and the fourth vapor deposition zone 60d are formed to face each other. Between these vapor deposition zones 60b and 60d, a shielding plate 15c is provided so as to cover the transportation rollers 5b and 5f. The shielding plate 15c prevents the vapor-depositing material from being incident on the transportation rollers 5b and 5f and also controls the incidence angle at the top ends of the vapor deposition zones 60b and 60d.

In this embodiment, in a cross-section which is vertical to the surface of the substrate 4 and includes the transportation direction of the substrate 4, the first guide member 6a and the second guide member 6b are located on both sides of the normal N passing through the center of the evaporation surface 9s. The transportation section is located with respect to the evaporation source 9 such that one of the first through fourth vapor deposition zones 60a through 60d (in the example shown in the figure, the vapor deposition zone 60b) crosses the normal N passing through the center of the evaporation surface 9s. This is advantageous because a zone having a high concentration of the vapor-depositing material in the vapor deposition possible zone is usable to the maximum possible degree to perform vapor deposition. In the vapor deposition device 300 shown in the figure, the second vapor deposition zone 60b and the fourth vapor deposition zone 60d are formed to face each other at substantially the center of the vapor deposition possible zone. In this specification, the vapor deposition zone are assigned reference numerals in accordance with the transportation path. Hence, the other vapor deposition zones may face each other at the center of the vapor deposition possible zone depending on the arrangement of the transportation section. In either case, substantially the same effect as described above is provided as long as one of the two vapor deposition zones facing each other at substantially the center of the vapor deposition possible zone is located so as to cross the normal N.

In the vicinity of the top ends of the vapor deposition zones 60a through 60d, heating sections 16a through 16d are respectively located for heating the substrate 4 to the range of, for example, 200° to 400° C. The expression that the heating sections 16a through 16d are respectively "located in the vicinity of the top ends of the vapor deposition zones 60a through 60d" means that each heating section is provided at a position which is in a vapor deposition zone other than the corresponding vapor deposition zone and at which the substrate 4 is heated immediately before reaching the corresponding vapor deposition zone. Owing to such a structure, when the substrate 4 is transported from the first roll 3 toward the second roll 8, the substrate 4 can be heated by the heating sections 16a and 16c before reaching the corresponding V-shaped path. When the substrate 4 is transported in the opposite direction, the substrate 4 can be heated by the heating sections 16b and 16d before reaching the corresponding V-shaped path. The vapor deposition zone 300 includes four heating sections, but the number of the heating sections may be two in the case where, for example, the transportation direction does not need to be switched. In such a case, the heating section 16a located on the first roll side with respect to the first vapor deposition zone 60a on the transportation path of the substrate 4, and the heating section 16c located between the second vapor deposition zone 60b and the third vapor deposition zone 60c on the transportation path of the substrate 4, may be provided.

Figure 8:
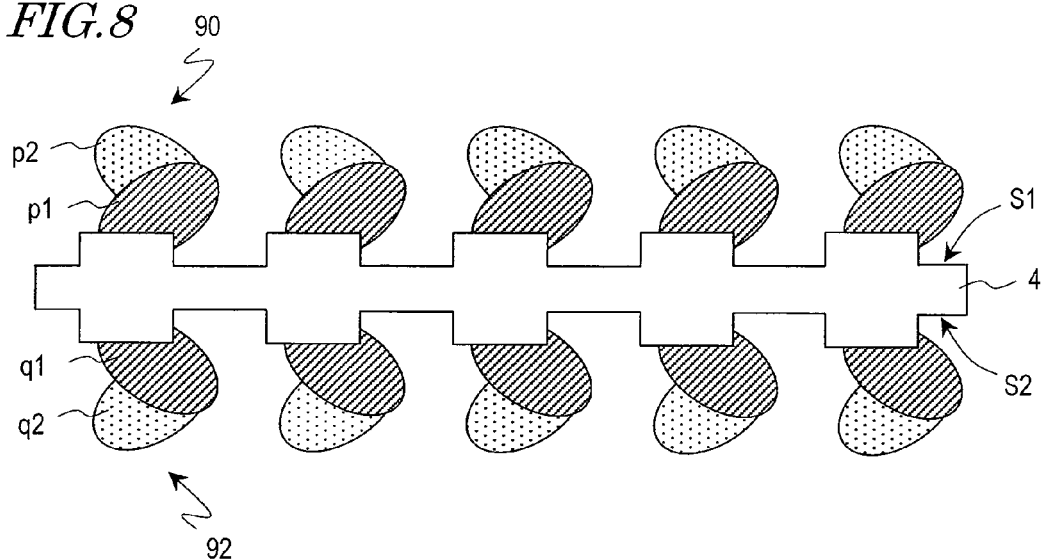
FIG. 8 is a schematic cross-sectional view of active material bodies (stacking number n=2) formed using the vapor deposition device in Embodiment 3 of the present invention.

FIG. 8 is a cross-sectional view showing an example of vapor deposition films formed on both surfaces of the substrate 4 using the vapor deposition device 300. The vapor deposition films shown here include a plurality of active material bodies formed by transporting the substrate 4 from the first roll 3 to the second roll 8 and arranged with a space provided therebetween.

In this embodiment, a metal foil having a concave and convex pattern on both surfaces (first surface and second surface) S1 and S2 thereof is used as the substrate 4. The pattern formed on the surfaces S1 and S2 is substantially the same as that described above in Embodiment 1 and will not be described here.

On the first surface S1 of the substrate 4, a plurality of active material bodies 90 including two layers having different growth directions are formed. Each active material body 90 includes a first part p1 formed in the first vapor deposition zone 60a and a second part p2 formed on the first part p1 in the second vapor deposition zone 60b. On the second surface S2 of the substrate 4 also, a plurality of active material bodies 92 having substantially the same two-layer structure are formed. Each active material body 92 includes a first part q1 and a second part q2 respectively formed in the third and fourth vapor deposition zones 60c and 60d.

In this embodiment, it is preferable that the transportation section and the shielding section are located such that the ranges of incidence angle θ of the vapor-depositing material in the first through fourth vapor deposition zones 60a through 60d are substantially equal to one another. It is also preferable that the film formation amounts in the first through fourth vapor deposition zones 60a through 60d are substantially equal to one another. Owing to this, the active material bodies 90 and 92 having substantially the same shape and thickness can be formed on both surfaces of the substrate 4. When such a substrate 4 is used to produce an electrode for a lithium secondary cell, the stress applied on the first surface S1 of the substrate 4 by the expansion of the active material bodies 90 and the stress applied on the second surface S2 of the substrate 4 by the expansion of the active material bodies 92 can be made substantially equal to each other. As a result, the substrate 4 can be effectively prevented from being curved due to the stress difference when the charge/discharge cycle is repeated.

Figure 9:
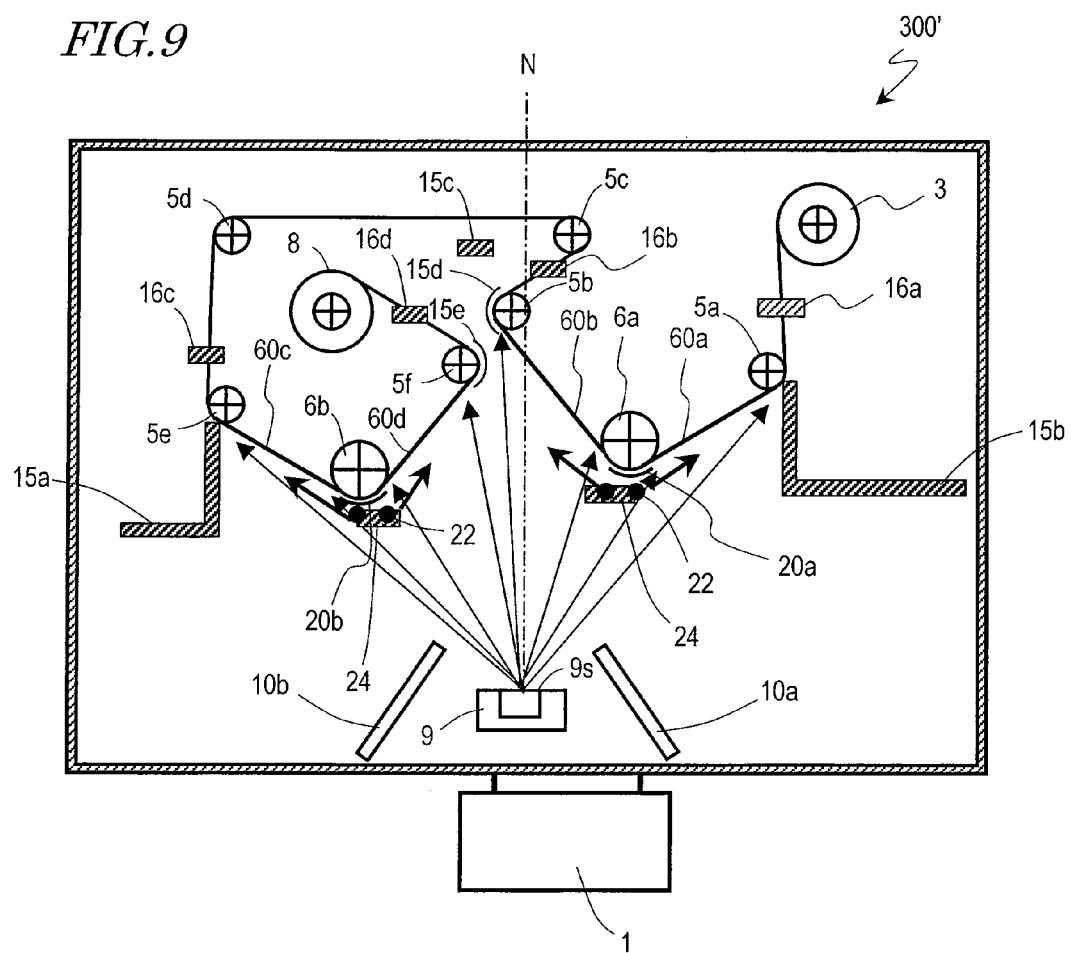
FIG. 9 is a cross-sectional view of a structure of another vapor deposition device according to Embodiment 3 of the present invention.

In the vapor deposition device 300 shown in FIG. 7, a single shielding plate 15c is provided for the transportation rollers 5b and 5f. Alternatively, one single shielding plate may be provided for each of the transportation rollers 5b and 5f. A vapor deposition device of such a structure is shown in FIG. 9. For simplicity, identical elements with those in FIG. 7 bear identical reference numerals therewith, and descriptions thereof will be omitted.

In a vapor deposition device 300' shown in FIG. 9, in order to effectively prevent the vapor-depositing material from being attached to the transportation rollers 5b and 5f, shielding plates 15d and 15e are provided along the transportation rollers 5b and 5c respectively. Accordingly, the top ends of the vapor deposition zones 60b and 60d are defined by the shielding plates 15d and 15e. A shielding plate 15e is provided above the gap between the transportation rollers 5b and 5f and prevents the vapor-depositing material, which has passed through the gap between transportation rollers 5b and 5f, from being attached to the substrate located above the gap. Such a structure of the shielding plates is preferably applicable to a vapor deposition device which requires two or more transportation rollers to be provided between facing vapor deposition zones for the purpose of forming an inversion structure. The structure of the shielding plates is not limited to that shown in FIG. 7 or FIG. 9. For example, the shielding plates 15a and 15b do not need to have a wall having a function of alleviating the temperature difference on the substrate 4.

Embodiment 4

Hereinafter, a vapor deposition device according to Embodiment 4 of the present invention will be described with reference to the figures. In the vapor deposition device in this embodiment, the transportation section has two W-shaped substrate paths (W-shaped paths) as described in Embodiment 2 with reference to FIG. 6 and is structured to have an inversion structure for inverting the surface of the substrate 4 to be subjected to the vapor-depositing material between the W-shaped paths. The W-shaped path may have a structure substantially the same as that described in Embodiment 3 with reference to FIG. 7.

Figure 10:
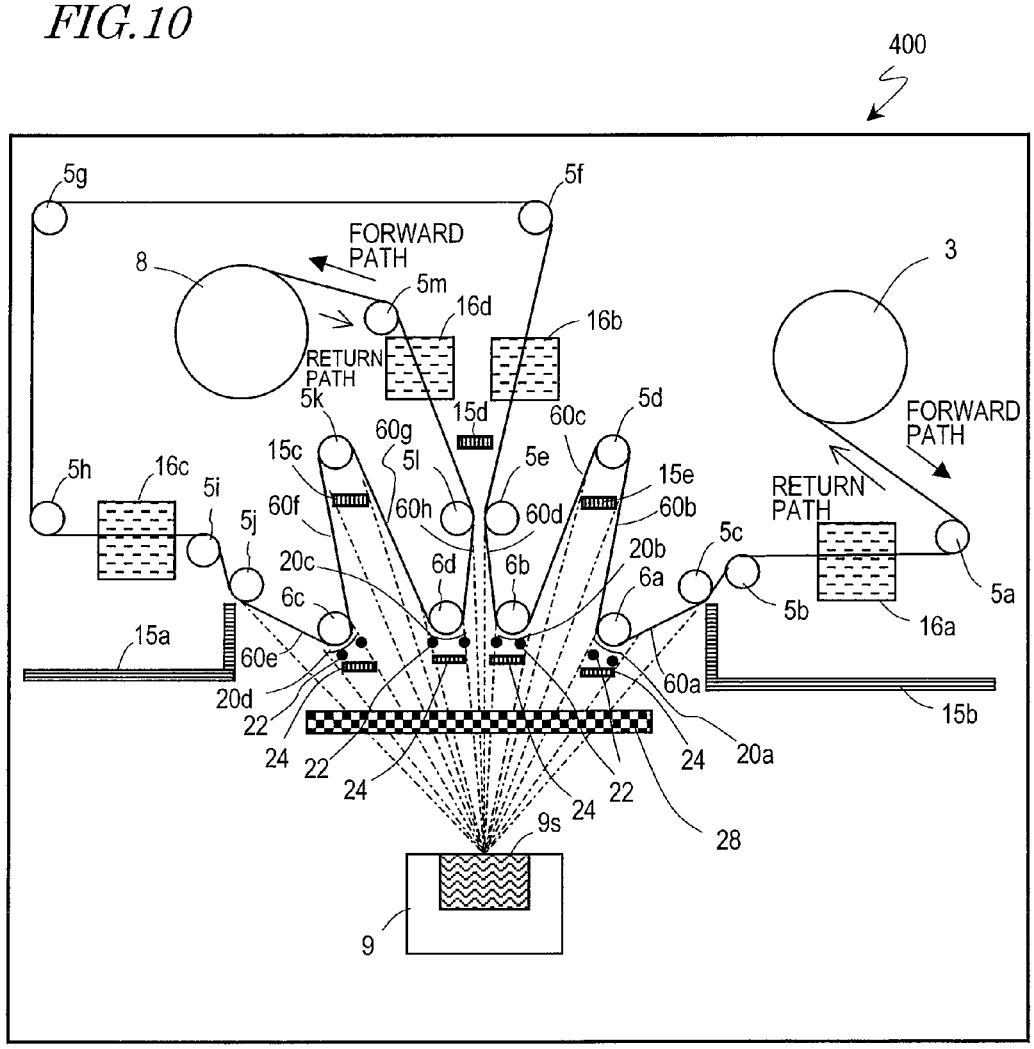
FIG. 10 is a schematic cross-sectional view of a vapor deposition device according to Embodiment 4 of the present invention.

FIG. 10 is a cross-sectional view schematically showing a vapor deposition device in this embodiment. For simplicity, identical elements with those of the vapor deposition devices 100, 200 and 300 described in the above embodiments bear identical reference numerals therewith, and descriptions thereof will be omitted.

A vapor deposition device 400 shown in FIG. 10 includes a transportation section including first and second rolls 3 and 8, transportation rollers 5a through 5m, and first through fourth guide members 6a through 6d, and thus defines a transportation path of the substrate 4. In addition, shielding plates 15a through 15e and first through fourth shielding members 6a through 6b are provided so as to prevent the vapor-depositing material evaporated from the vapor deposition surface 9s from being incident on the substrate 4 in the normal direction to the substrate 4.

The transportation rollers 5a through 5m are sequentially located in this order from the first roll side on the transportation path of the substrate 4. The first through fourth guide members (transportation rollers) 6a through 6d are sequentially located in this order from the first roll side on the transportation path of the substrate 4. Like in the above embodiments, the guide members 6a through 6d guide the substrate 4 such that the surface of the substrate 4 to be subjected to the vapor-depositing material is convexed toward the evaporation source 9 and thus a V-shaped path is formed. Between the guide members 6a through 6d and the evaporation source 9, the first through fourth shielding members 20a through 20d are respectively located. Each of the shielding members 20a through 20d prevents the vapor-depositing material evaporated from the evaporation surface 9s of the evaporation source 9 from being incident in the normal direction to the substrate 4 and also separates the corresponding vapor deposition zone of the V-shaped path into two. Owing to such a structure, on the V-shaped path formed by the first guide member 6a, a first vapor deposition zone 60a located on the first roll side with respect to the first shielding member 20a and a second vapor deposition zone 60b located on the second roll side with respect to the first shielding member 20a are formed. Similarly, on the V-shaped path formed by the second guide member 6b, a third vapor deposition zone 60c located on the first roll side with respect to the first shielding member 20b and a fourth vapor deposition zone 60d located on the second roll side with respect to the first shielding member 20b are formed. On the V-shaped path formed by the third guide member 6c, a fifth vapor deposition zone 60e located on the first roll side with respect to the first shielding member 20c and a sixth vapor deposition zone 60f located on the second roll side with respect to the first shielding member 20c are formed. On the V-shaped path formed by the fourth guide member 6d, a seventh vapor deposition zone 60g located on the first roll side with respect to the first shielding member 20d and an eighth vapor deposition zone 60h located on the second roll side with respect to the first shielding member 20d are formed. Between the first through eighth vapor deposition zones 60a through 60h and the evaporation surface 9s, a shutter 28 is provided.

In this embodiment, the transportation section and the shielding section are located with respect to the evaporation source 9 such that the incidence direction of the vapor-depositing material in the first through eighth vapor deposition zones 60a through 60h is inclined by an angle of, for example, 45° or greater and 75° or smaller with respect to the normal direction to the substrate 4.

In this embodiment, the transportation rollers 5f through 5h are located between the fourth vapor deposition zone 60d and the fifth vapor deposition zone 60e on the transportation path of the substrate 4 so as to surround the second roll 8 (inversion structure). Owing to such a structure, the substrate 4 after passing through the W-shaped path including the first through fourth vapor deposition zones 60a through 60d can be inverted to be guided to the fifth through eighth vapor deposition zones 60e through 60h. Therefore, vapor deposition films can be continuously formed on both surfaces of the substrate 4 while the chamber 2 is kept vacuum.

The vapor deposition device 400 also includes four heating sections 16a through 16d located outside the corresponding vapor deposition zones for heating the substrate 4 to the range of 200° to 400° C. The heating sections 16a through 16d are respectively located in the vicinity of the top ends of the first, fourth, fifth and eighth vapor deposition zones 60a, 60d, 60e and 60h. Owing to such a structure, when the substrate 4 is transported from the first roll 3 toward the second roll 8, the substrate 4 can be heated by the heating sections 16a and 16c immediately before reaching the corresponding W-shaped path. When the substrate 4 is transported in the opposite direction, the substrate 4 can be heated by the heating sections 16b and 16d before reaching the corresponding W-shaped path. The vapor deposition zone 400 includes four heating sections, but the number of the heating sections may be two in the case where, for example, the transportation direction does not need to be switched. In such a case, the heating section 16a located on the first roll side with respect to the first vapor deposition zone 60a on the transportation path of the substrate 4, and the heating section 16c located between the fourth vapor deposition zone 60d and the fifth vapor deposition zone 60e on the transportation path of the substrate 4, may be provided.

The vapor deposition device 400 allows a plurality of stages of vapor deposition steps to be continuously performed on both surfaces of the substrate 4 while the vapor deposition direction is switched. In addition, since eight vapor deposition zones are formed in the vapor deposition possible zone, the vapor-depositing material emitted to a wider angle is usable for vapor deposition, which can further improve the utilization factor of the vapor-depositing material.

Hereinafter, a method for forming a film using the vapor deposition device 400 will be described.

First, substantially the same vapor deposition steps as those in the first through fourth stage vapor deposition steps described above with reference to FIG. 6 are performed in the first through fourth vapor deposition zones 60a through 60d to form first through fourth films.

Next, the vapor deposition surface of the substrate 4 is inverted, and vapor deposition is performed in the fifth through eighth vapor deposition zones 60e through 60h on the opposite surface (rear surface) of the substrate 4 to the surface on which the first through fourth films have been formed. Specifically, this is performed as follows. In the fifth vapor deposition zone 60e, while the substrate 4 is moved toward the evaporation source 9, the vapor-depositing material evaporated from the evaporation source 9 is incident on the rear surface of the substrate 4 in a direction inclined with respect to the normal to the surface of the substrate 4 (incidence direction) to form a 1'st film on the rear surface of the substrate 4 (1'st stage vapor deposition step). Then, in the sixth vapor deposition zone 60f, while the substrate 4 is moved away from the evaporation source 9, the vapor-depositing material is incident on the rear surface of the substrate 4 in a direction inclined oppositely to the incidence direction in the 1'st stage vapor deposition step with respect to the normal to the surface of the substrate 4 to form a 2'nd film on the 1'st film (2'nd stage vapor deposition step). Then, in the seventh vapor deposition zone 60g, while the substrate 4 is moved toward the evaporation source 9, the vapor-depositing material is incident on the rear surface of the substrate 4 in a direction inclined on the same side as the incidence direction in the 1'st stage vapor deposition step with respect to the normal to the surface of the substrate 4 to form a 3'rd film on the 2'nd film (3'rd stage vapor deposition step). Then, in the eighth vapor deposition zone 60h, while the substrate 4 is moved away from the evaporation source 9, the vapor-depositing material is incident on the rear surface of the substrate 4 in a direction inclined oppositely to the incidence direction in the 1'st stage vapor deposition step with respect to the normal to the surface of the substrate 4 to form a 4'th film on the 3'rd film (4'th stage vapor deposition step).

After this, the substrate 4 is once taken up by the second roll 8 and then is transported to the eighth through fifth vapor deposition zones 60h through 60e in this order to perform 5'th through 8'th stage vapor deposition steps in the eighth through fifth vapor deposition zones 60h through 60e. Specifically, this is performed as follows. In the eighth vapor deposition zone 60h, while the substrate 4 is moved toward the evaporation source 9, the vapor-depositing material is incident on the substrate 4 to form a 5'th film on the 4'th film (5'th stage vapor deposition step). Then, in the seventh vapor deposition zone 60g, while the substrate 4 is moved away from the evaporation source 9, the vapor-depositing material is incident on the substrate 4 to form a 6'th film on the 5'th film (6'th stage vapor deposition step). Then, similarly, in the sixth vapor deposition zone 60f, while the substrate 4 is moved toward the evaporation source 9, a 7'th stage vapor deposition step is carried out. In the fifth vapor deposition zone 60e, while the substrate 4 is moved away from the evaporation source 9, an 8'th stage vapor deposition step is carried out.

As described above, in the case where vapor deposition is performed in the same vapor deposition zone, the incidence direction and the incidence angle of the vapor-depositing material are the same regardless of the transportation direction of the substrate 4. For example, the 4'th and 5'th stage vapor deposition steps are both carried in the eighth vapor deposition zone 60h, and so the incidence direction and the incidence angle of the vapor-depositing material are the same.

After the 8'th stage vapor deposition step, the vapor deposition surface of the substrate 4 is again inverted and the substrate 4 is transported to the fourth vapor deposition zone 60d. After this, in the fourth through second vapor deposition zones 60d through 60a, the fifth through eighth stage vapor deposition steps are carried out on the surface of the substrate 4 on which the first through fourth films have been formed. As a result, the fifth through eighth films are formed. The fifth through eighth stage vapor deposition steps are substantially the same as the fifth through eighth stage vapor deposition steps described above with reference to FIG. 6. After this, the substrate 4 is taken up by the first roll 3.

Even after the eighth stage vapor deposition step, when necessary, the transportation direction of the substrate 4 may be switched to transport the substrate 4 sequentially to the first through eighth vapor deposition zones 60a through 60h and thus to further repeat substantially the same vapor deposition steps as the first through fourth stage vapor deposition steps and the 1'st through 4'th stage vapor deposition steps. By reciprocating the substrate 4 an arbitrary number of times between the first roll 3 and the second roll 8 in this manner, a desired number of stages of vapor deposition can be performed.

In this embodiment, it is preferable that in a cross-section which is vertical to the surface of the substrate 4 and includes the transportation direction of the substrate 4, the first and second guide members 6a and 6b, and the third and fourth guide members 6c and 6d, are preferably located on both sides of the normal N passing through the center of the evaporation source 9. It is also preferable that in the above-described cross-section, the transportation section is located with respect to the evaporation source 9 such that one of the first through eighth vapor deposition zones 60a through 60h crosses the normal passing through the center of the evaporation source 9. Owing to this, a zone having a high concentration of the vapor-depositing material evaporated from the evaporation source 9 in the vapor deposition possible zone is usable for vapor deposition, and thus the utilization factor of the vapor-depositing material can be improved.

The vapor deposition device 400 has an inversion structure for inverting the substrate 4. However, a vapor deposition device in this embodiment does not need to have an inversion structure. In a vapor deposition device without the inversion structure, the substrate 4 passes through two W-shaped paths and as a result, active material bodies having eight layers (stacking number n=8) are formed on only one surface of the substrate 4.

Figure 11:
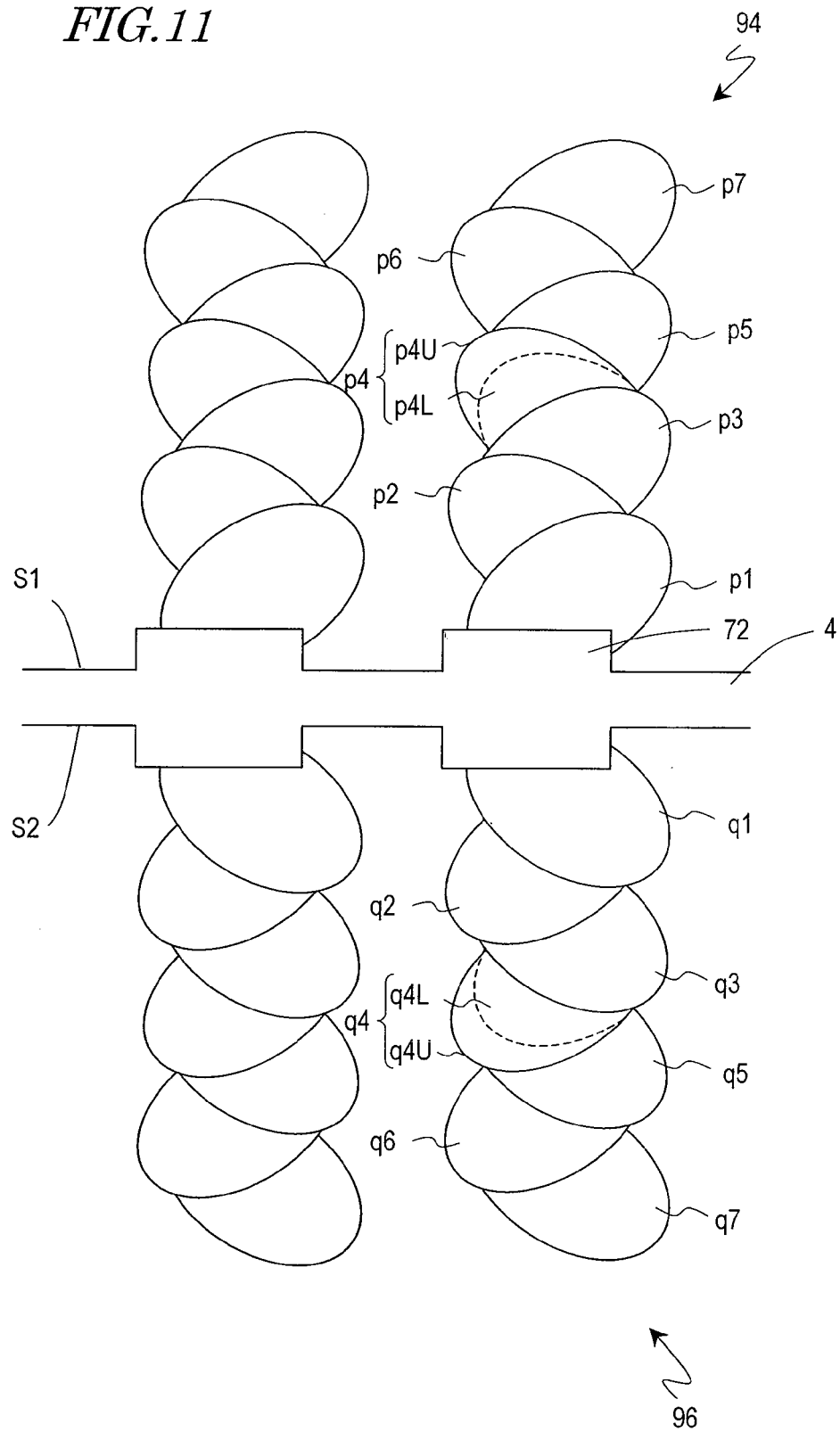
FIG. 11 is a schematic cross-sectional view of active material bodies (stacking number n=7) formed using the vapor deposition device in Embodiment 4 of the present invention.

Now, an example of structure of the vapor deposition films formed on both surfaces of the substrate 4 using the vapor deposition device 400 will be described. FIG. 11 is a cross-sectional view showing vapor deposition films obtained by transporting the substrate 4 from the first roll 3 to the second roll 8 (forward path) and then transporting the substrate 4 from the second roll 8 to the first path 3 (return path). In this example, the vapor deposition film formed on each surface of the substrate 4 includes a plurality of active material bodies formed with a space provided therebetween.

In this embodiment, as the substrate 4, a metal foil having a concave and convex pattern on both surfaces (first surface and second surface) S1 and S2 thereof is used. Here, the pattern formed on the surfaces S1 and S2 is the same as the concave and convex pattern described in Embodiment 1 and will not be described again.

On the first and second surfaces S1 and S2 of the substrate 4, a plurality of active material bodies 94 and 96 are respectively formed. Each active material body 94 has a structure in which seven layers, i.e., first through seventh parts p1 through p7, are stacked (stacking number n=7). The parts p1 through p7 have growth directions inclined alternately in opposite directions with respect to the normal direction to the first surface S1.

The active material bodies 94 and 96 are formed as follows, for example. First, in the forward path, the substrate 4 fed out from the first roll 3 passes through the first through fourth vapor deposition zones 60a through 60d. As a result, the first part p1, the second part p2, the third part p3 and a lower layer p4L of the fourth part are stacked in this order on the first surface S1 of the substrate 4 (first through fourth vapor deposition steps).

Next, the substrate 4 is inverted by the inversion structure and passes through the fifth through eighth vapor deposition zones 60e through 60h. As a result, a first part q1, a second part q2, a third part q3 and a lower layer $4qL$ of a fourth part are stacked in this order also on the second surface S2 of the substrate 4 (1'st through 4'th vapor deposition steps).

Then, the substrate 4 is once taken up by the second roll 8 and then is fed out toward the first roll 3 (return path). In the return path, the substrate 4 first passes through the eighth vapor deposition zone 60h. As a result, on the lower layer $4qL$ in the fourth part formed in the forward path, an upper layer $4qU$ is grown in substantially the same direction as that of the lower layer $4qL$. Thus, the fourth part q4 including the lower layer $4qL$ and upper layer $4qU$ is obtained. Then, the substrate 4 passes through the seventh, sixth and fifth vapor deposition zones 60g, 60f and 60e in this order. As a result, fifth through seventh parts q5 through q7 are formed on the fourth part p4 (5'th through 8'th vapor deposition steps). In this manner, the active material bodies 96 including the first through seventh parts q1 through q7 (stacking number n: 7) are obtained.

Next, the substrate 4 is inverted by the inversion structure to be guided to the fourth vapor deposition zone 60d. Here, on the lower layer $4pL$ in the fourth part formed in the forward path, an upper layer $4pU$ is grown. Thus, the fourth part p4 is obtained. Then, the substrate 4 passes through the third, second and first vapor deposition zones 60c, 60b and 60a in this order. As a result, the fifth through seventh parts p5 through p7 are formed (fifth through eighth vapor deposition steps). In this manner, the active material bodies 94 including the first through seventh parts p1 through p7 (stacking number n: 7) are obtained.

In the case where the vapor deposition is repeated while switching the transportation direction of the substrate 4, it is preferable that the transportation section and the shielding section are structured such that the ratio among the film formation amounts in the first through eighth vapor deposition zones 60a through 60h is 1:2:2:1:1:2:2:1. Owing to this, as described above in Embodiment 2, the film formation amount in the vapor deposition zones 60a, 60d, 60e and 60h through which the substrate 4 may possibly pass twice in a row is set to be ½ of the film formation amount in the other vapor deposition zones 60b, 60c, 60f and 60g. Therefore, the thickness of the parts of the active material body can be made substantially uniform (excluding the first part and the uppermost layer). This will be specifically described regarding the active material bodies shown in FIG. 11. The thickness of the fourth part p4 formed by allowing the substrate 4 to pass through the fourth vapor deposition zone 60d twice, and the thickness of each of the second and third parts p2 and p3 formed by allowing the substrate 4 to pass through each of the second and third vapor deposition zones 60b and 60c, can be made substantially equal to each other. Therefore, the active material bodies 94 as a whole can be prevented from being significantly inclined in one particular direction. The same is applicable to the active material bodies 96. Accordingly, where the film formation ratio is set as above, the active material bodies as a whole can be grown in the normal direction to the substrate 4 while using the oblique vapor deposition.

Example 1 and Example 2

In Examples 1 and 2, a substrate having projections formed regularly on a surface thereof was transported between the first roll 3 and the second roll 8 eight times (total of the forward path and the return path), and first through 32nd stage vapor deposition steps were performed using the vapor deposition device 400 to form a film (stacking number n: 25). The vapor deposition conditions in Examples 1 and 2 were the same except that the vapor deposition angle (incidence angle of the vapor-depositing material with respect to the normal to the substrate) θ in Example 1 was larger than the vapor deposition angle in Example 2. In these examples, a metal foil having column-like projections located thereon was used as the substrate. Each projection had a diamond-shaped top surface, and the diagonal lines had lengths of 20 μm×10 μm.

Figure 12:
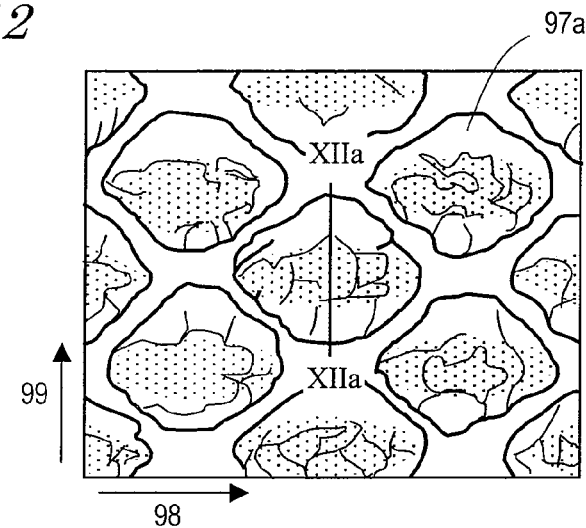
FIGS. 12($a$) and ($b$) are top views showing an example of films in Example 1 and Example 2 produced using a vapor deposition device according to the present invention, and FIG. 12($c$) is a schematic cross-sectional view of an active material body in the films shown in FIGS. 12($a$) and ($b$).
Figure 12:
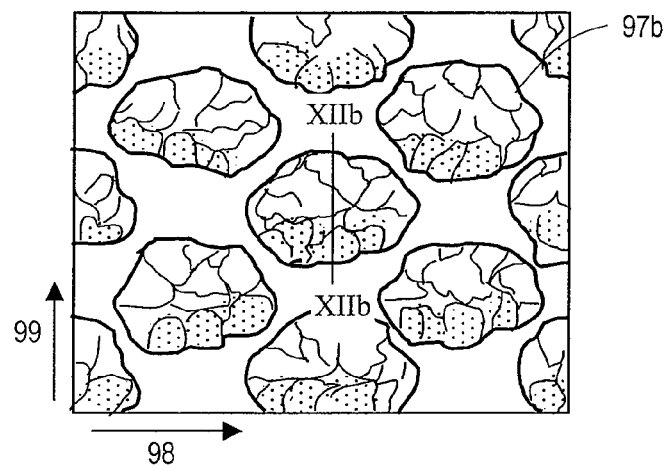
Figure 12:
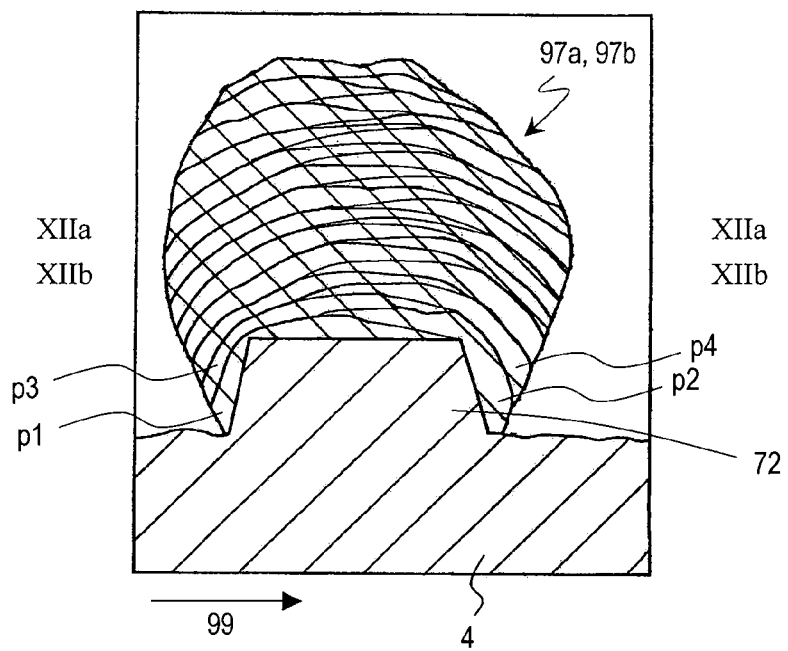

FIGS. 12(a) and (b) are top views showing an example of films in Examples 1 and 2. FIG. 12(c) schematically shows a cross-section of the active material body 97a, 97b shown in FIGS. 12(a) and (b) taken along line XIIa-XIIa and line XIIb-XIIb. Arrow 98 in FIGS. 12(a) and (b) represents a direction parallel to the longer diagonal line of the diamond, and arrow 99 represents a direction parallel to the shorter diagonal line of the diamond.

As shown in the figures, the films in Examples 1 and 2 respectively include a plurality of active material bodies 97a and 97b located with a space provided therebetween. Each of the active material bodies 97a and 97b had a stacking number n of 25. The relationship between the number of times the substrate 4 is transported and the stacking number n will be described later.

From these results, it is understood that the active material bodies 97a and 97b are formed with a space therebetween in accordance with the arrangement of the projections on the substrate 4. Widths of the top surface of the active material body 97a in the directions 98 and 99 (about 33 μm and about 25 μm) are respectively larger than widths of the top surface of the active material body 97b in the directions 98 and 99 (about 30 μm and about 20 μm). Therefore, the space between adjacent active material bodies 97b is larger than the space between adjacent active material bodies 97a. From this, it is understood that where the vapor deposition angle θ is larger, the widths of the active material body are larger and accordingly, the space between adjacent active material bodies is smaller. In addition, from FIG. 12(c), it is understood that the active material bodies 97a and 97b each have a structure in which parts p1, p3, . . . deposited on the projection 72 formed on the substrate 4 from left in the sheet of FIG. 12(c) and parts p2, p4, . . . deposited from right in the sheet of FIG. 12(c) are alternately stacked.

Here, with reference to FIGS. 13(a) through (c), the relationship between the number of times the substrate is transported between the first roll 3 and the second roll 8 for forming a film using one of the vapor deposition devices 100 through 400 having a V-shaped or W-shaped path(s) (hereinafter, the number of times will be referred to as the "transportation number of times C") and the stacking number n of the film (active material body) will be described. In the case where the transportation direction is switched to perform vapor deposition, the total number of times the substrate 4 is transported on the forward path and on the return path is the "transportation number of times C".

First, FIG. 13(a) will be referred to. FIG. 13(a) is a schematic cross-sectional view showing an active material body formed using the vapor deposition device 100 having one V-shaped path or the vapor deposition device 300 having two V-shaped paths and an inversion structure.

In each of the vapor deposition devices 100 and 300, during the first time in which the substrate is transported between the first roll and the second roll (forward path), two parts p1 and p2L having different growth directions are formed in this order in two vapor deposition zones (for example, the first and second vapor deposition zones 60a and 60b shown in FIG. 1). The growth directions of these parts p1 and p2L are inclined oppositely to each other with respect to the normal to the substrate. At this point, the active material body has a two-layer structure (stacking number n: 2) including a first layer formed of the part p1 and a second layer formed of the part p2L.

Next, the transportation direction is switched, and during the second time in which the substrate is transported (return path), a part p2U having the same growth direction as that of the part p2L, and a part p3L having a growth direction inclined oppositely to the part p2U with respect to the normal to the substrate, are formed. At this point, the active material body has a three-layer structure (stacking number n: 3) including the first layer formed of the part p1, the second layer formed of the parts p2L and p2U, and a third layer formed of the part p3L. The transportation direction is switched again, and during the third time in which the substrate is transported (forward path), parts p3U and p4L are formed similarly. The stacking number n of the active material body becomes 4. In this manner, the stacking number n of the formed active material body is represented by the following expression using the transportation number of times C.

$$n = C + 1$$

Between the parts p2L and p2U, and between the parts p3L and p3U, a thin oxide film 101 is formed. The oxide film 101 is formed as a result of the vapor deposition surface reacting with oxygen while the transportation direction of the substrate is switched or while the vapor deposition surface of the substrate is inverted. Accordingly, in an active material body formed by each of the vapor deposition devices 100 and 300, a thin oxide film 101 is formed in each of the layers located between the first layer, i.e., the lowermost layer and the uppermost layer (in the example shown in the figure, the fourth layer formed of the part p4L) (hereinafter, such layers will be referred to as the "intermediate layers"), regardless of the stacking number n.

In the case where the film formation amounts in the vapor deposition zones 60a and 60b are substantially equal to each other, the thickness of the lowermost layer and the thickness of the uppermost layer are each about ½ of the thickness of each intermediate layer located therebetween.

FIG. 13(b) is a schematic cross-sectional view showing an active material body formed using the vapor deposition device 200 having one W-shaped path or the vapor deposition device 400 having two W-shaped paths and an inversion structure.

In each of the vapor deposition devices 200 and 400, during the first time in which the substrate is transported between the first roll and the second roll (forward path), four parts p1, p2, p3 and p4L are formed in this order in four vapor deposition zones (for example, the first through fourth vapor deposition zones 60a through 60d shown in FIG. 6). The growth directions of these parts p1, p2, p3 and p4L are inclined alternately in opposite directions with respect to the normal to the substrate. At this point, the active material body has a four-layer structure (stacking number n: 4) including first through third layers formed of the parts p1 through p3 and a fourth layer formed of the part p4L.

Next, the transportation direction is switched, and during the second time in which the substrate is transported (return path), four layers of p4U, p5, p6 and p7L are formed. The part p4U has the same growth direction as that of the part p4L. At this point, the active material body has a seven-layer structure (stacking number n: 7) including the first through third layers formed of the parts p1 through p3, the fourth layer formed of the parts p4L and p4U, and fifth through seventh layers formed of the parts p5 through p7L. The transportation direction is switched, and during the third time in which the substrate is transported (forward path), parts p7U, p8, p9 and p10L are formed similarly. The stacking number n of the active material body becomes 10. The stacking number n of the formed active material body is represented by the following expression using the transportation number of times C.

$$n = 3 \times C + 1$$

Between the parts p4L and p4U, and between the parts p7L and p7U, a thin oxide film 101 is formed. In this manner, in an active material body formed by each of the vapor deposition devices 200 and 400 having a W-shaped path(s), a layer including two parts and an oxide film 101 between the two parts (hereinafter, such a layer will be referred to as the "oxide film-containing layer") is formed as every third layer. Such an oxide film-containing layer is formed at every third layer from the fourth layer. In other words, the oxide film-containing layer is formed at the $(3 \times m+1)$th layer (m: an integer of 1 through (C−1); C: transportation number of times C).

As described above, in the case where the ratio among film formation amounts in the vapor deposition zones 60a through 60d is 1:2:2:1, the thicknesses of the intermediate layers are substantially equal to one another. The thickness of each of the lowermost layer formed of the part p1 and the uppermost layer (in the example shown in the figure, the tenth layer formed of the part p10L) is about ½ of the thickness of each intermediate layer.

In the case where the film formation amounts in the vapor deposition zones 60a through 60d are substantially equal to one another, as shown in FIG. 13(c), the thickness of each oxide film-containing layer, such as the fourth layer or the seventh layer is about twice the thickness of the other layers. By the presence of such an oxide film-containing layer, the start position of the layer formed on the oxide film-containing layer is shifted to the same side as the growth direction of the oxide film-containing layer. Accordingly, an active material body in which the vapor deposition position is shifted alternately to the opposite side at every third layer is formed.

Embodiment 5

Hereinafter, a vapor deposition device according to Embodiment 5 of the present invention will be described with reference to the figure. In the vapor deposition device in this embodiment, the transportation section has two substrate transportation paths, each including three V-shaped substrate paths (hereinafter, referred to as the "V×3 path"), and is structured to have an inversion structure for inverting the surface of the substrate 4 to be subjected to the vapor-depositing material between the V×3 paths. The inversion structure may be substantially the same as the inversion structure described in Embodiment 3 with reference to FIG. 7.

Figure 14:
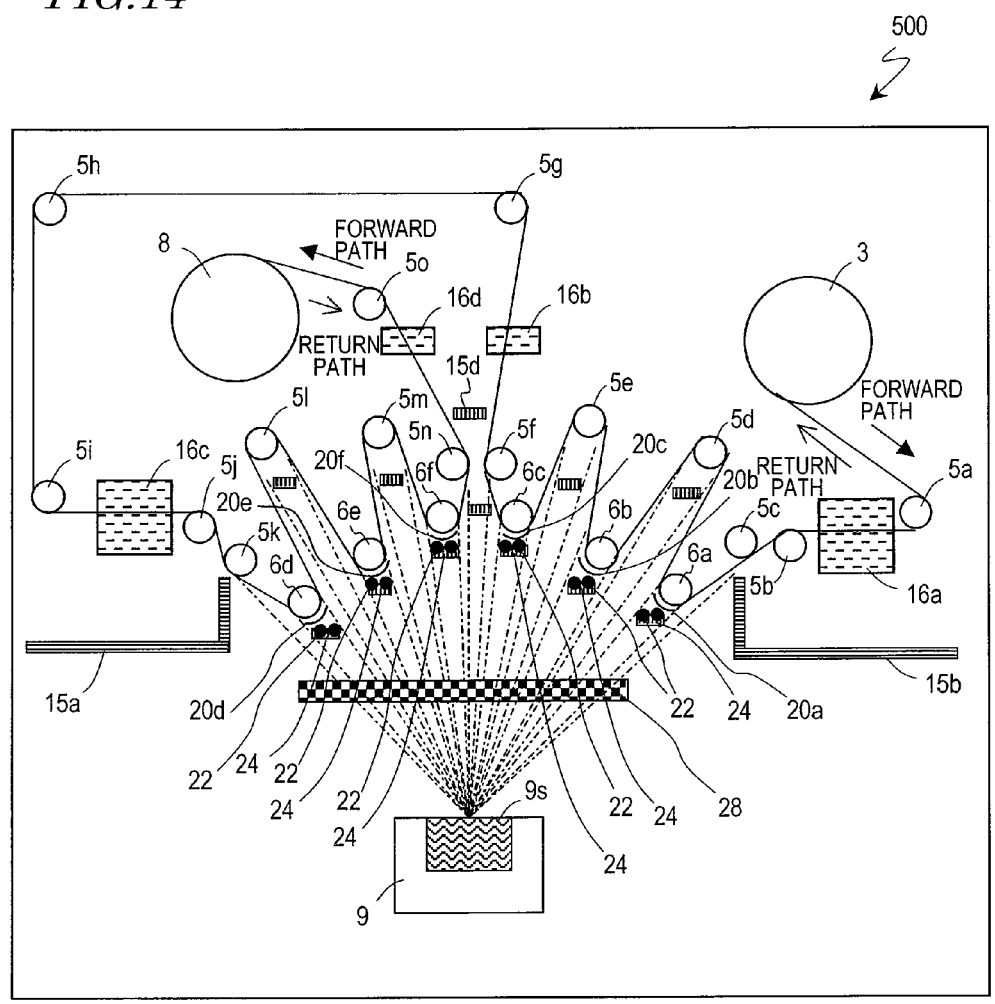
FIG. 14 is a schematic cross-sectional view of a vapor deposition device according to Embodiment 5 of the present invention.

FIG. 14 is a cross-sectional view schematically showing a vapor deposition device in this embodiment. For simplicity, identical elements with those of the vapor deposition device 400 described in the above embodiment bear identical reference numerals therewith, and descriptions thereof will be omitted.

A vapor deposition device 500 has substantially the same structure as that of the vapor deposition device 400 described above with reference to FIG. 10. Note that the number of guide members is increased to six (guide members 6a through 6f) and the number of the vapor deposition zones is increase to 12 because the vapor deposition zones are formed on both sides of each of the six guide members 6a through 6f. Accordingly, unlike the vapor deposition device 400, during the time in which the substrate 4 is transported from the first roll 3 to the second roll 8, a vapor deposition film having a stacking number of 12 can be formed. This is especially advantageous for forming a vapor deposition film having a large stacking number.

An operation of the vapor deposition device 500 and a method for forming a film using the vapor deposition device 500 are substantially the same as those of the operation of the vapor deposition device 400 and the method for forming a film using the vapor deposition device 400.

Embodiment 6

Hereinafter, a vapor deposition device according to Embodiment 6 of the present invention will be described with reference to the figures.

Figure 15:
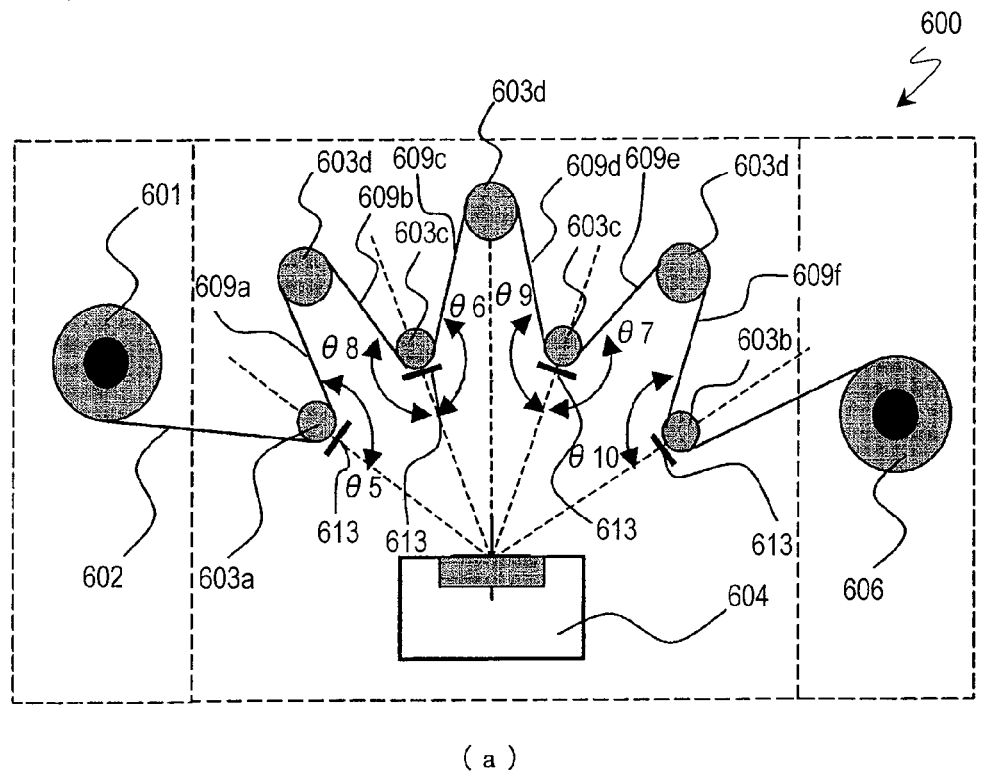
FIG. 15($a$) is a schematic cross-sectional view of a vapor deposition device according to Embodiment 6 of the present invention.
Figure 15:
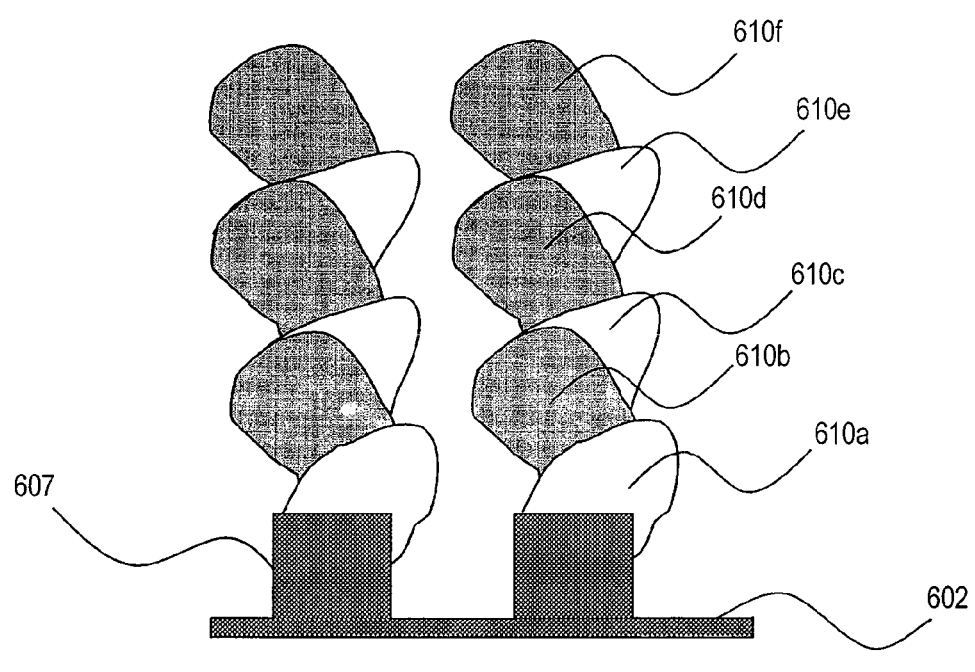

FIG. 15 is a schematic cross-sectional view of a vapor deposition device in this embodiment. A vapor deposition device 600 includes a supply section 601 for supplying a substrate (current collector) 602, a take up section 606 for taking up the supplied substrate 602, an evaporation source 604, a plurality of support rolls 603a, 604b, 603c and 604d radially provided with respect to the evaporation source 604, and shielding plates 613 respectively provided between the support rolls 603*a*, 603*b* and 603*c* and the evaporation source 604. In the vapor deposition device 600, the support rolls 603*a*, 603*b* and 603*c* (hereinafter, referred to as the "front support rolls") are located farther from the evaporation source 604 than the support rolls 604*d* (hereinafter, referred to as the "rear support rolls").

In this embodiment, the substrate 602 is fed out from the supply section 602, passes alternately along the front support rolls 603*a*, 603*c* and 603*b* radially located with respect to the evaporation source 604 and along the rear support rolls 603*d* radially located farther from the front support rolls, and is taken up like a coil by the take-up section 606. The front support rolls 603*a*, 603*b* and 603*c* form a V-shaped path for transporting the substrate 602 in a V-shaped manner. On both sides of the front support rolls 603*c* located at the center among these front support rolls, a plurality of vapor deposition zones 609*b* through 609*e* are formed. Accordingly, the front support rolls 603*c* correspond to the "guide members" in the above embodiments. A vapor deposition zone 609*a* is formed on the opposite side to the supply section 601 with respect to the front support roll 603*a*, which is located closest to the supply section 601 among the front support rolls. A vapor deposition zone 609*f* is formed on the opposite side to the take-up section 606 with respect to the front support roll 603*b*, which is located closest to the take-up section 606 among the front support rolls. In this embodiment, vapor deposition is not performed on the supply section 601 side with respect to the support roll 603*a* or the take-up section 606 side with respect to the support roll 603*b*.

In this embodiment, the plurality of vapor deposition zones (vapor deposition forming section) 609*a* through 609*f* are formed for one evaporation source 604 by the support rolls 603*c* and 603*d*. Therefore, the vapor deposition device 600 is superb in mass productivity. It is preferable that the vapor deposition surface of the substrate 602 passing through the vapor deposition zone 609*a* acts as the "facing surface" for the vapor deposition surface of the substrate 602 passing through the vapor deposition zone 609*b*, and that the vapor deposition surface of the substrate 602 passing through the vapor deposition zone 609*b* acts as the "facing surface" for the vapor deposition surface of the substrate 602 passing through the vapor deposition zone 609*a*. The "facing surface" is as described above with reference to FIG. 2. Owing to this, the amounts of heat received by the substrate 602 in the vapor deposition zones 609*a* and 609*b* can be averaged. Similarly, it is preferable that the vapor deposition surfaces of the substrate 602 passing through the vapor deposition zones 609*c* and 609*d* act as the facing surfaces for each other, and that the vapor deposition surfaces of the substrate 602 passing through the vapor deposition zones 609*e* and 609*f* act as the facing surfaces for each other. This is advantageous because the difference in the amount of heat received by the substrate 602 in all the vapor deposition zones 609*a* through 609*f* can be reduced without adding any member having a facing surface.

Now, a method for producing a film using the vapor deposition device 600 will be described. As the substrate 602, a strip-like metal foil (current collector) processed to have projections on a surface thereof is used. This substrate 602 is fed out from the supply section 601 and passes alternately along the front support rolls 603*a*, 603*b* and 603*c* radially located with respect to the evaporation source 604 and along the rear support rolls 603*d* also radially located with respect to the evaporation source 604. Then, the substrate 602 is taken up like a coil by the take-up section 606. Vapor deposition is performed on the running substrate 604 in the vapor deposition zones 609*a* through 609*f*. The support rolls 603*a* through 603*d* are located at the same angle with respect to the evaporation source 604. Therefore, angles θ5 through θ7 of the vapor deposition surface of the substrate 602 in the vapor deposition zones 609*a*, 609*c* and 609*e* with respect to the evaporation source 604 are equal to one another. For the same reason, angles θ8 through θ10 of the vapor deposition surface of the substrate 602 in the vapor deposition zones 609*b*, 609*d* and 609*f* with respect to the evaporation source 604 are equal to one another. Where the angles θ5 through θ7 are each γ, the angles θ8 through θ10 are each −γ. The absolute values of the angles θ5 through θ10 are all equal.

A cross-section of the film obtained using the vapor deposition device 600 was observed with an SEM. FIG. 15(*b*) shows a schematic view thereof. From this, it is understood that thin layers 610*a* through 610*f* formed on the surface of the substrate 602 having projections 607 are inclined alternately in opposite directions with respect to the normal to the substrate 602. This occurs for the following reason. During the time in which the substrate 602 fed out from the supply section 601 passes through the vapor deposition zone 609*a*, the thin layer 610*a* is formed by vapor deposition. The thin layer 610*b* is formed by vapor deposition in the vapor deposition zone 609*b*, the thin layer 610*c* is formed by vapor deposition in the vapor deposition zone 609*c*, the thin layer 610*d* is formed by vapor deposition in the vapor deposition zone 609*d*, the thin layer 610*e* is formed by vapor deposition in the vapor deposition zone 609*e*, and the thin layer 610*f* is formed by vapor deposition in the vapor deposition zone 609*f*. In this manner, the angle of the vapor deposition surface with respect to the evaporation source 604 is switched alternately between γ and −γ.

Next, an electrode plate having a plurality of electrode active material thin films alternately formed on the concave and convex part of the strip-like substrate 602 was formed, and slit-processed to have a width defined by a cylindrical lithium ion secondary cell (not shown) to produce an electrode for a lithium ion secondary cell. The slit-processed electrode plate did not have inconveniences such as warping or the like, and detachment of any electrode active material thin film was not recognized.

As described above, according to this embodiment, a single evaporation source 604 is used. Therefore, the deposition speed can be easily controlled and the thin layers can be continuously formed stably. Since the vapor deposition surfaces of the substrate 602 passing through adjacent vapor deposition zones face each other, the amounts of heat received by the substrate 602 in the vapor deposition zones can be averaged. By providing the shielding plates 613 between the evaporation source 604 and the front support rolls 603*a* through 603*c* facing the evaporation source 604, the support rolls 603*a* through 603*c* can be prevented from being contaminated with evaporated substances. This provides an advantage of simplifying the cleaning work after the vapor deposition and shortening the non-operation time of the vapor deposition device 600.

Embodiment 7

Hereinafter, a vapor deposition device according to Embodiment 7 of the present invention will be described with reference to the figure. In this embodiment, unlike in the above-described embodiments, vapor deposition is performed on a substrate transported in a curved state along a guide member as well as a substrate transported in a planar state.

Figure 16:
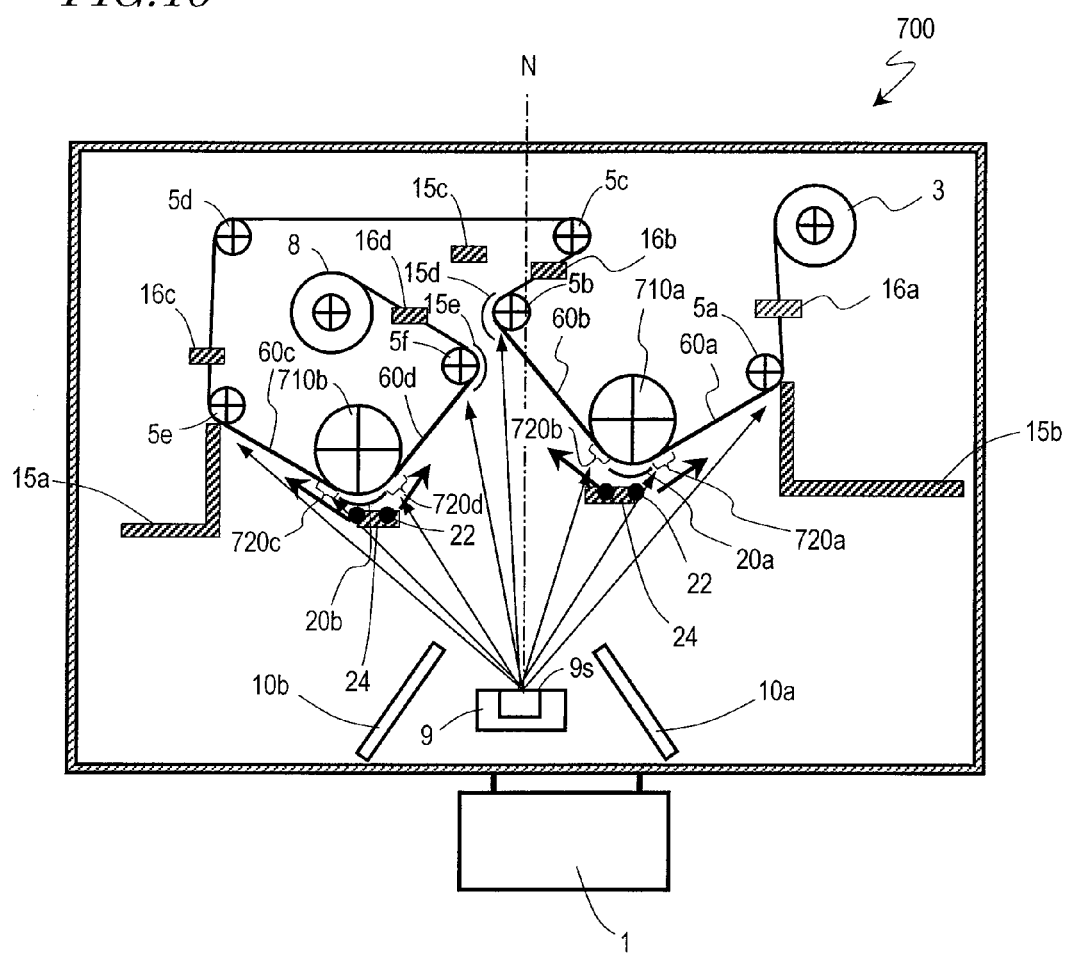
FIG. 16 is a schematic cross-sectional view of a vapor deposition device according to Embodiment 7 of the present invention.

FIG. 16 is a cross-sectional view schematically showing a vapor deposition device in this embodiment. For simplicity, identical elements with those of the vapor deposition device 300' (FIG. 9) in the embodiment described above bear identical reference numerals therewith, and descriptions thereof will be omitted.

In a vapor deposition device 700, guide members 710*a* and 710*b* are partially located in the vapor deposition possible zone without being shielded by shielding members 20*a* and 20*b*, and the vapor-depositing material is incident on the substrate 4 transported on a curved path along the guide members 710*a* and 710*b*. Accordingly, the vapor deposition zones 60*a* through 60*d* respectively include curved transportation zones 720*a* through 720*d* in which substrate 4 is transported in a curved state, as well as the plane transportation zones in which the substrate 4 is transported in a planar state. Except for this, the structure of the vapor deposition device 700 is substantially the same as that of the vapor deposition device 300' described above with reference to FIG. 9.

Since the vapor deposition zones 60*a* through 60*d* respectively include the curved transportation zones 720*a* through 720*d*, the surface area of the vapor deposition surface of the substrate 4 can be increased in a zone which is close to the evaporation source 9 and has the vapor-depositing material at a high concentration, as compared with the case where each vapor deposition zone includes only a planar transportation zone. This significantly improves the utilization factor of the vapor-depositing material. The deposition speed of the vapor-depositing material on the substrate 4 is in inverse proportion to the square of the distance between the substrate 4 and the evaporation source 9. In this embodiment, the distance between the substrate 4 and the evaporation source 9 can be shortened, and therefore the deposition speed of the vapor-depositing material on the substrate 4 can be significantly increased. In the cross-section shown in the figure, the curved transportation zones 720*a* through 720*d* are represented with curved lines, and so are occasionally referred to as the "curved running sections". Advantages of performing vapor deposition in the curved running sections 720*a* through 720*d* will also be described in Reference Embodiment C provided later.

In the vapor deposition device 700, the curved transportation zones 720*a* through 720*d* are provided in all the vapor deposition zones 60*a* through 60*d*. The above-described effect is provided as long as at least one vapor deposition zone includes a curved transportation zone. For example, only the vapor deposition zones 60*b* and 60*d* facing each other while having the normal to the center of the evaporation source 9 therebetween may include the curved transportation zones 720*b* and 720*d*.

Although not shown, the structure in this embodiment is also applicable to the vapor deposition devices 100, 200, 300, 400, 500 and 600. Substantially the same effect as described above is realized by providing a curved transportation zone in a vapor deposition zone in these vapor deposition devices and performing vapor deposition on a guide member.

Embodiment 8

Hereinafter, a vapor deposition device according to Embodiment 8 of the present invention will be described with reference to the figures. Unlike the vapor deposition device 700 in Embodiment 7, in the vapor deposition device in this embodiment, an inclination direction switching roller is provided on the substrate transportation path in the vapor deposition zone and vapor deposition is performed also on the inclination direction switching roller.

Figure 17:
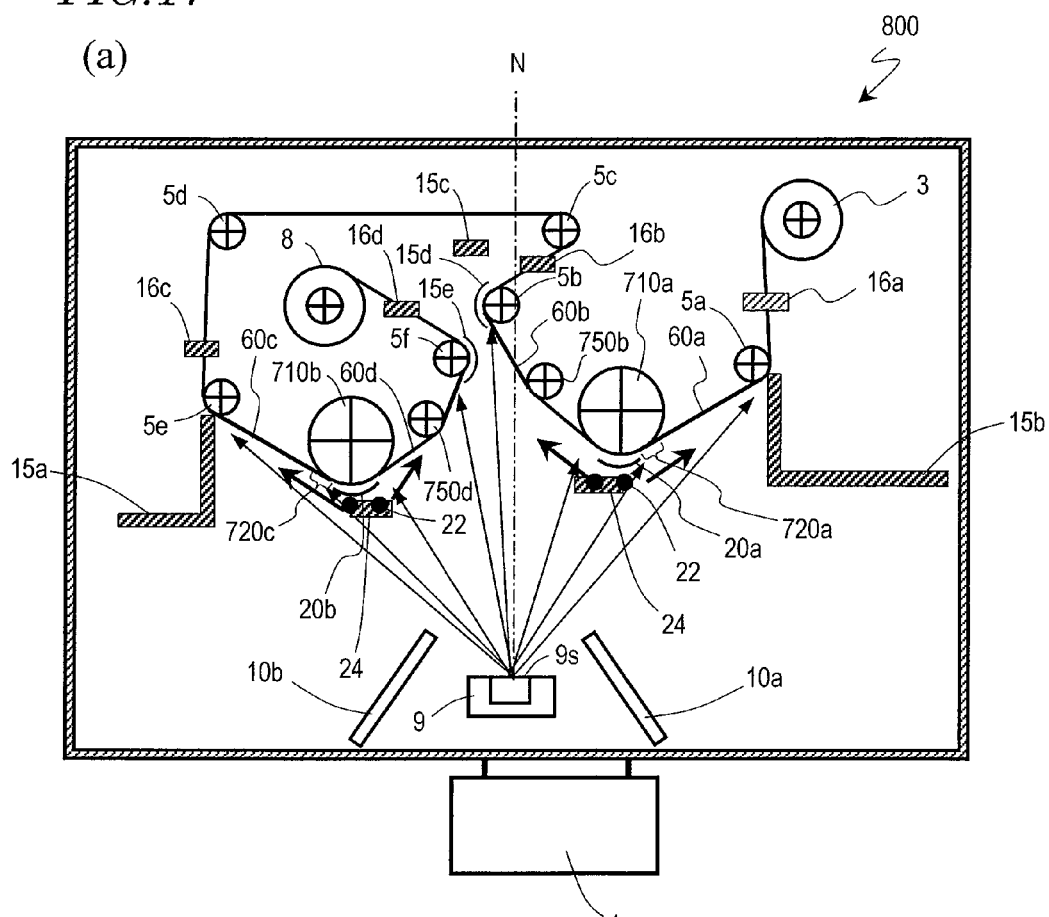
FIG. 17(a) is a schematic cross-sectional view of a vapor deposition device according to Embodiment 8 of the present invention.
FIG. 17(b) is a schematic enlarged cross-sectional view of vapor deposition zones in the vapor deposition device shown in FIG. 17(a).
Figure 17:
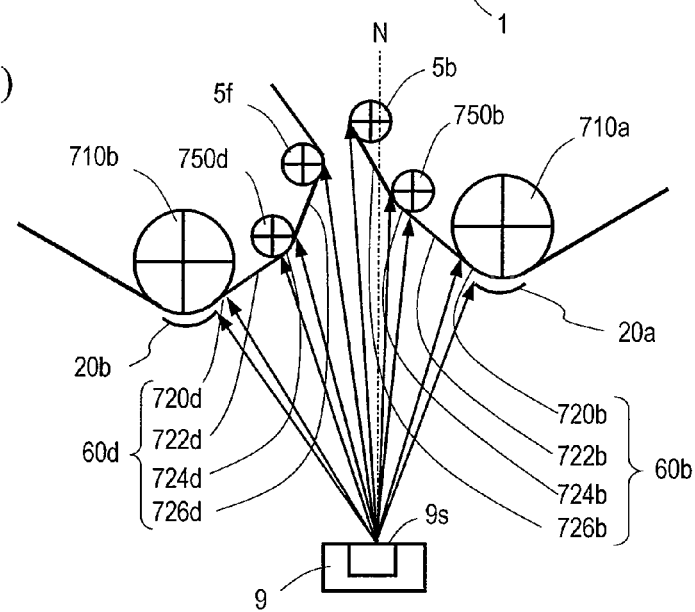
Figure 18:
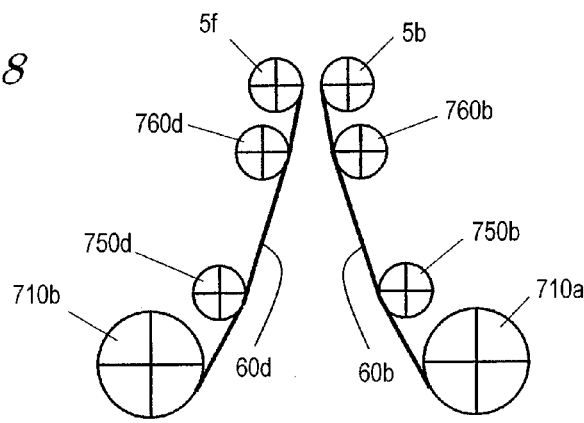
FIG. 18 is a schematic enlarged cross-sectional view of vapor deposition zones in another vapor deposition device according to Embodiment 8 of the present invention.

FIG. 17(*a*) is a cross-sectional view schematically showing a vapor deposition device in this embodiment. FIG. 17(*b*) is a schematic enlarged cross-sectional view provided to explain a vapor deposition zone in the vapor deposition device shown in FIG. 17(*a*). For simplicity, identical elements with those of the vapor deposition device 700 (FIG. 16) described in the above embodiment bear identical reference numerals therewith, and descriptions thereof will be omitted.

A vapor deposition device 800 includes an inclination direction switching roller 750*b* located between the guide member 710*a* and the transportation roller 5*b* in the vapor deposition zone 60*b* and also includes an inclination direction switching roller 750*d* located between the guide member 710*b* and the transportation roller 5*f* in the vapor deposition zone 60*d*. The inclination direction switching rollers 750*b* and 750*d* respectively switch the inclination direction of the substrate transportation path with respect to the evaporation source 9 in the vapor deposition zones 60*b* and 60*d* (angle made by the substrate transportation path and the normal N passing through the center of the evaporation source 9). As a result, in each of the vapor deposition zones 60*b* and 60*d*, two planar transportation zones having different inclination angles are formed; namely, one planar transportation zone is provided upstream, and the other planar transportation zone is provided downstream, with respect to the corresponding inclination direction switching roller 750*b*, 750*d*.

Accordingly, in this embodiment, as shown in FIG. 17(*b*), the vapor deposition zone 60*b* includes a curved transportation zone 720*b* along the guide member 710*a* (this curved transportation zone is also referred to as the "bottom end curved transportation zone"), a curved transportation zone 724*b* along the inclination direction switching roller 750*b* (this curved transportation zone is also referred to as the "intermediate curved transportation zone"), a planar transportation zone 722*b* located between the guide member 710*a* and the inclination direction switching roller 750*b*, and a planar transportation zone 726*b* located between the inclination direction switching roller 750*b* and the transportation roller 5*b*. Similarly, the vapor deposition zone 60*d* includes a bottom end curved transportation zone 720*d* along the guide member 710*b*, an intermediate curved transportation zone 724*d* along the inclination direction switching roller 750*d*, a planar transportation zone 722*d* located between the guide member 710*b* and the inclination direction switching roller 750*d*, and a planar transportation zone 726*d* located between the inclination direction switching roller 750*d* and the transportation roller 5*f*.

According to this embodiment, as compared with the case where the inclination direction switching rollers are not provided, the distance between the substrate 4 and the evaporation source 9 in the planar transportation zone can be shortened. This improves the deposition speed and the utilization factor of the vapor-depositing material. The inclination direction switching rollers also provide an advantage of suppressing the substrate 4 from being wrinkled during the transportation. In addition, by cooling the inclination direction switching rollers 750*b* and 750*d*, the heat received by the substrate 4 during the vapor deposition can be alleviated and thus the thermal expansion of the substrate 4 can be suppressed. The advantages of providing the inclination direction switching rollers 750*b* and 750*d* will also be described in Reference Embodiment D provided later.

In the vapor deposition device 800, the inclination direction switching rollers 750*b* and 750*d* are located in the two vapor deposition zones 60*d* and 60*d* facing each other while having the normal N to the substrate 4 therebetween. This is because in a vapor deposition zone close to the normal N to the center of the evaporation source 9, the vapor deposition angle of the planar transportation zones formed upstream and downstream with respect to the inclination direction switching roller can be easily controlled to be a desired angle. It is sufficient that the inclination direction switching roller is provided in at least one vapor deposition zone, and the inclination direction switching roller may be provided in each of all the vapor deposition zones 60a through 60d.

Figure 19:
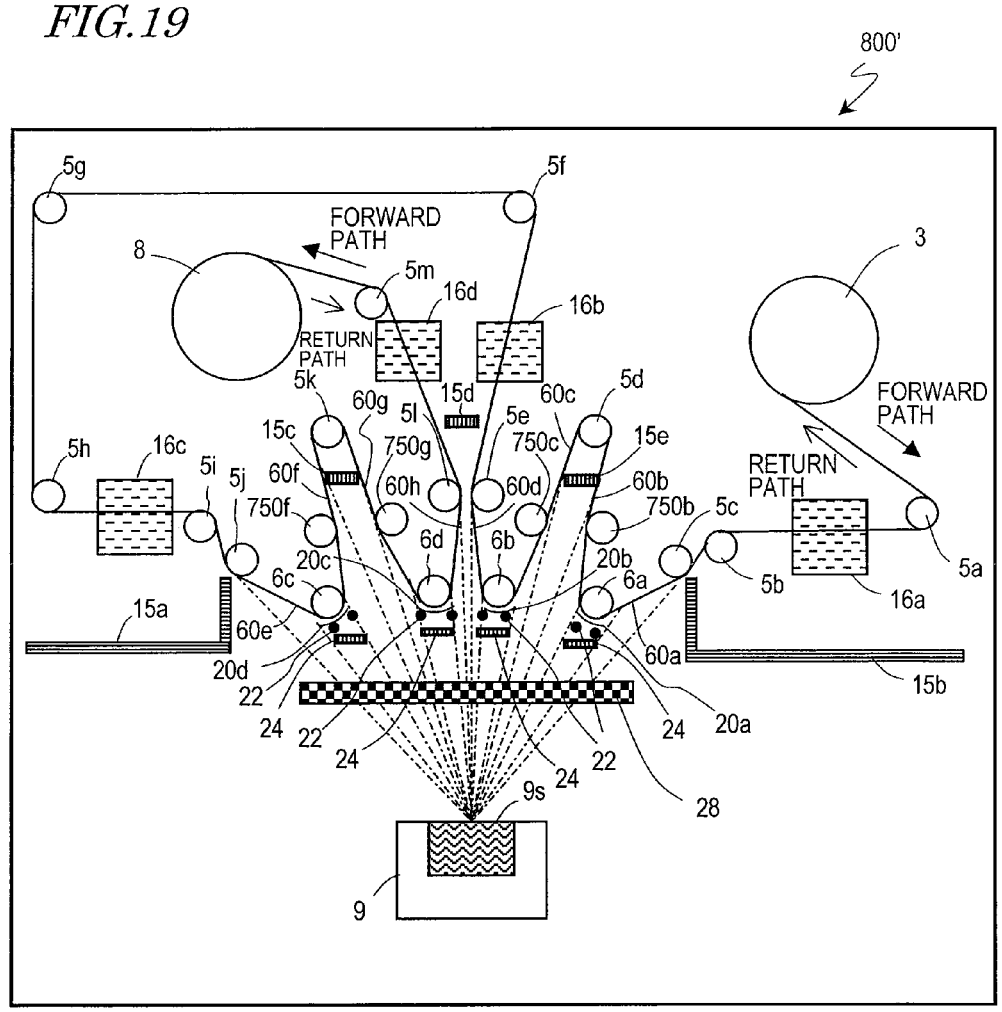
FIG. 19 is a schematic cross-sectional view of still another vapor deposition device according to Embodiment 8 of the present invention.

A plurality of inclination direction switching rollers may be provided in one vapor deposition zone. For example, as shown in FIG. 19, inclination direction switching rollers 750b and 760b may be provided in the vapor deposition zone 60b, and inclination direction switching rollers 750d and 760d may be provided in the vapor deposition zone 60d. In the example shown in the figure, the vapor deposition zones 60b and 60d each include a bottom curved transportation zone, two intermediate curved transportation zones, and three planar transportation zones.

The structure of this embodiment is also applicable to the vapor deposition devices 100, 200, 300, 400, 500 and 600. FIG. 19 is a schematic cross-sectional view showing an example of structure in which inclination direction switching rollers are provided in the vapor deposition device 400 (FIG. 10). For simplicity, identical elements with those of the vapor deposition device 400 bear identical reference numerals therewith, and descriptions thereof will be omitted.

In a vapor deposition device 800' shown in FIG. 19, inclination direction switching rollers 750b, 750c, 750f and 750g are respectively located in the vapor deposition zones 60b, 60c, 60f and 60g. Vapor deposition is performed also on these inclination direction switching rollers (intermediate curved transportation zones). In the vapor deposition device 800', vapor deposition is not performed on the guide members 6a through 6d. Alternatively, vapor deposition may be performed on the guide member(s).

The shape of the active material bodies formed using a vapor deposition device according to the present invention is not limited to the shapes described in Embodiments 1 through 8 provided above, and may be appropriately selected in accordance with the designed capacitance of the cell to which the active material bodies are to be applied. For example, the stacking number n of each active material body may also be appropriately selected. Note that the stacking number n is preferably three or greater. Where the stacking number n is two or smaller, the expansion of the active material bodies in the width direction (lateral direction) may not be sufficiently suppressed. The upper limit of the preferable stacking number n is determined based on the total thickness of the active material bodies (for example, 100 µm or smaller) and the thickness of each part of the active material bodies (for example, 2 µm or greater). For example, the stacking number n is preferably 50 (100 µm/2 µm). More preferably, the stacking number n is 30 or greater and 40 or smaller.

As described above, according to a vapor deposition device in embodiments of the present invention, an active material layer including a plurality of active material bodies located with a space provided therebetween can be formed on a surface of the substrate 4. The substrate 4 having the active material layer is cut into a prescribed size when necessary and used for a negative electrode of a nonaqueous electrolytic secondary cell such as a lithium secondary cell or the like. The negative electrode thus obtained is protected against destruction of active material bodies which would otherwise be caused by expansion of the active material bodies, against deformation of the electrode plate, and against deformation of the hole of the separator. Therefore, such a negative electrode realizes superb charge/discharge cycle characteristic.

The above-described negative electrode is applicable to cylindrical, flat, coin-shaped, polygonal or many other shapes of nonaqueous electrolytic secondary cells. A nonaqueous electrolytic secondary cell can be produced by a known method, specifically as follows. The negative electrode obtained using a vapor deposition device according to the present invention is located to face a positive electrode plate containing a positive electrode active material in the state where a separator formed of microporous film or the like is provided therebetween, to form an electrode assembly. The electrode assembly is accommodated in a case together with an electrolytic solution having lithium ion conductivity. Thus, the nonaqueous electrolytic secondary cell is obtained. As the positive electrode active material and the electrolytic solution, materials generally used for lithium ion secondary cells are usable. Materials usable as the positive electrode active material include, for example, $LiCoO_2$, $LiNiO_2$, $LiMn_2O_4$ and the like. An example of electrolytic solution is obtained by dissolving lithium hexafluorophosphate or the like in a cyclic carbonate such as ethylene carbonate, propylene carbonate or the like. The sealing form of the cell is not specifically limited.

Reference Embodiment A

Hereinafter, a vapor deposition device in Reference Embodiment A will be described with reference to the figures.

FIG. 20(a) is a cross-sectional view schematically showing a vapor deposition device in Reference Embodiment A.

A vapor deposition device 1000A in Embodiment A includes a vacuum tank 802, an exhaust pump 801 provided outside the vacuum tank 802, an assisting exhaust pump 831 communicated with an assisting exhaust opening 830 of the vacuum tank 802, an evaporation source 809 provided inside the vacuum tank 802 at a position near the exhaust pump 801 for evaporating a vapor-depositing material, shielding plates 810a and 810b provided on both sides of the evaporation source 809, and gas introduction pipes 811a and 811b acting as oxygen gas supply sections for introducing oxygen gas into the vacuum tank 802. The shielding plates 810a and 810b are located in a truncated inverted V shape so as to cover the evaporation source 809 and the exhaust pump 801.

The vacuum tank 802 accommodates a supply roll 803 around which a substrate 804 is wound, transportation rollers 805a through 805h, a take-up roll 808, a cylindrical first can 812, a cylindrical second can 813, a cylindrical third can 814, and a cylindrical fourth can 815. A first vapor deposition section 862 is formed of the first can 812 and the second can 813. A first vapor deposition zone 860 in the first vapor deposition section 862 is formed of a vapor deposition surface of the substrate 804 between the second can 813 and a contact point at which the first can 812 contacts a straight line extending from the center of the vapor deposition surface of the evaporation source 809 through the end of the gas introduction pipe 811a to the first can 812. A second vapor deposition section 863 is formed of the third can 814 and the fourth can 815. A second vapor deposition zone 861 in the second vapor deposition section 863 is formed of the vapor deposition surface of the substrate 804 between the fourth can 815 and a contact point at which the third can 814 contacts a straight line extending from the center of the vapor deposition surface of the evaporation source 809 through the end of the gas introduction pipe 811b to the third can 814.

In order to effectively prevent the vapor-depositing material from being attached to each can, as shown in FIG. 20(b), shielding plates 810g, 810f, 810c and 810d may be respectively provided for the first through fourth cans 812, 813, 814 and 815. A shielding plate 811e may be provided above a gap between the second and fourth cans 813 and 815.

Figure 21:
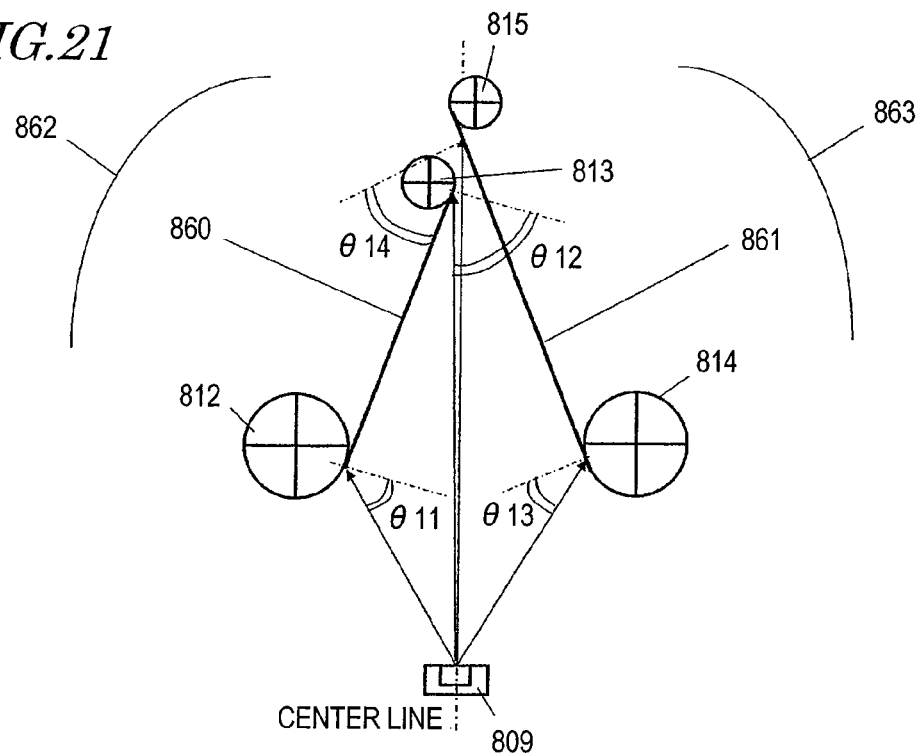
FIG. 21 is a schematic cross-sectional view of a first vapor deposition section and a second vapor deposition section in Reference Embodiment A.

FIG. 21 is a schematic view showing the positional relationship among the first vapor deposition section 862, the second vapor deposition section 863, and the evaporation source 809 in the vacuum tank 802. As shown in FIG. 21, the first vapor deposition section 862 and the second vapor deposition section 863 are provided such that the vapor deposition surface of the first vapor deposition zone 860 and the vapor deposition surface of the second vapor deposition zone 861 face each other on both sides of the normal passing through the center of the vapor deposition surface of the evaporation source. In Embodiment A, the first can 812, the second can 813, the third can 814 and the fourth can 815 are located such that the incidence angle of the vapor-depositing material on the substrate 804 is 45° or greater and 75° or smaller and such that θ11=45°, θ12=75°, θ13=45° and θ14=75° are fulfilled. Referring to FIG. 21, θ11 is an angle made by a straight line extending from the center of the vapor deposition surface of the evaporation source 809 through the end of the gas introduction pipe 811$a$ to the first can 812 and the normal extending from a point at which the straight line and the first can 812 cross each other. θ12 is an angle made by a straight line extending from the center of the vapor deposition surface of the evaporation source 809 to a point at which the substrate 804 contacts the second can 813 when leaving the second can 813 and the normal extending from such a contact point of the straight line and the second can 813. θ13 is an angle made by a straight line extending from the center of the vapor deposition surface of the evaporation source 809 through the end of the gas introduction pipe 811$b$ to the third can 814 and the normal extending from a point at which the straight line and the third can 814 cross each other. θ14 is an angle made by a straight line extending from the center of the vapor deposition surface of the evaporation source 809 to a point at which the substrate 804 contacts the fourth can 815 when leaving the fourth can 815 and the normal extending from such a contact point of the straight line and the fourth can 815. The fourth can 815 is located such that the second vaporization zone 861 crosses the normal passing through the center of the vapor deposition surface of the evaporation source. Owing to this, the vapor-depositing material from the evaporation source 809 does not directly exit toward the assisting exhaust opening 830 through the gap between the first vaporization zone 860 and the second vaporization zone 861.

Now, an operation of the vapor deposition device 1000A in Embodiment A will be described. First, the substrate 804 is caused to run. The substrate 804 of a long strip type fed out from the supply roll 803 is guided along the transportation rollers 805$a$ and 805$b$, the first can 812, the second can 813, the transportation rollers 805$c$, 805$d$ 805$e$, 805$f$ and 805$g$, the third can 814, and the fourth can 815, and then is taken up by the take-up roll 8. Since the substrate 804 is used as a current collector of an electrode, a film-type metal foil having a concave and convex pattern formed on a top surface and a rear surface thereof is used as the substrate 804. The metal material of the metal foil is, for example, a material fulfilling the electric conductivity required of a current collector such as copper, nickel, aluminum or the like. The concave and convex pattern is formed of diamond shapes, each of which has a size of 20 μm×20 μm and a height of 10 μm. The arithmetic average roughness (Ra) of the surface of the concave and convex pattern is 2.0 μm. On the running substrate 804, the vapor-depositing material evaporated from the evaporation source 809 is vapor-deposited to form a vapor deposition film (vapor deposition particles). For the evaporation source 809, a crucible or the like is used. The evaporation source 809 is heated by a heating device (not shown) such as a resistance heating device, an induction heating device, an electronic beam heating device or the like, and silicon, for example, as the vapor-depositing material is evaporated. Between the first can 812 and the second can 813, the substrate 804 is exposed to the silicon evaporated from the evaporation source 809, and as a result, a first active material layer 821 of silicon is formed on one surface of the substrate 804. Then, between the third can 814 and the fourth can 815, the substrate 804 is exposed to the silicon evaporated from the evaporation source 809, and as a result, a second active material layer 823 of silicon is also formed on the other surface of the substrate 804. For forming an active material layer of a compound containing silicon and oxygen, oxygen gas is introduced through the gas introduction pipes 811$a$ and 811$b$, and silicon is evaporated from the evaporation source 809 in an oxygen gas atmosphere. The arithmetic average roughness (Ra) is defined in the Japanese Industrial Standards (JISB 0601-1994), and may be measured by, for example, a contact-system or laser-system surface roughness meter or the like.

Figure 20:
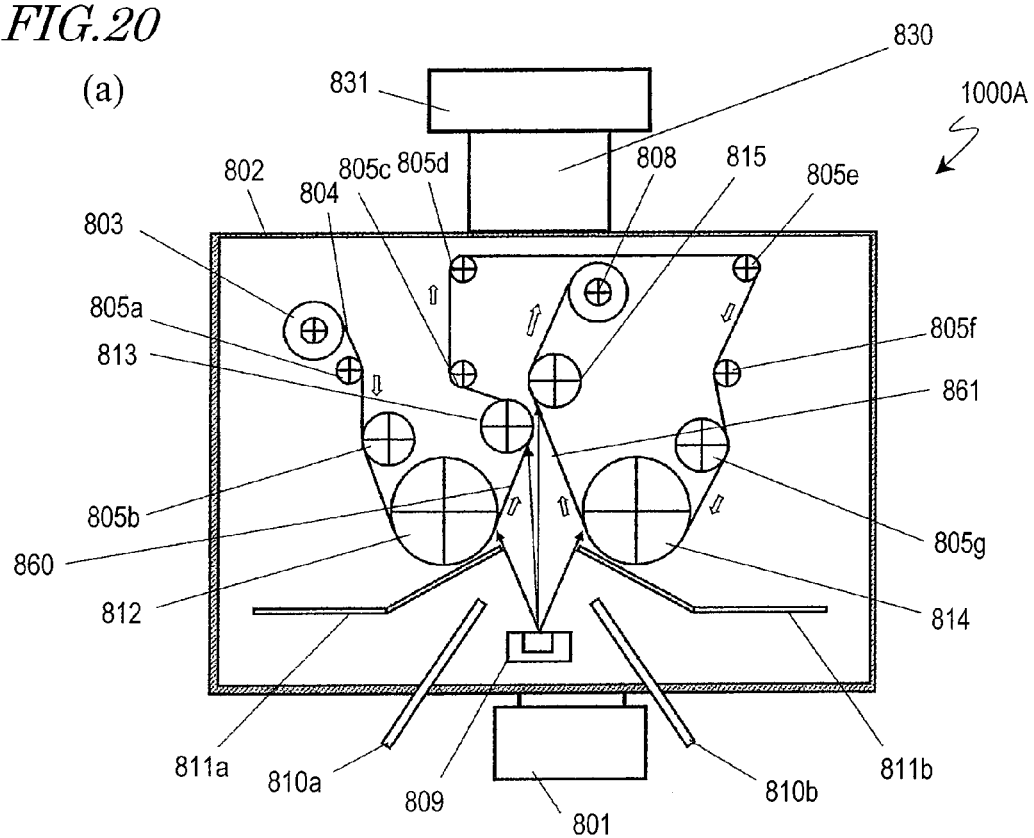
FIGS. 20(a) and (b) are each a schematic cross-sectional view showing examples of vacuum vapor deposition devices in Reference Embodiment A.
Figure 20:
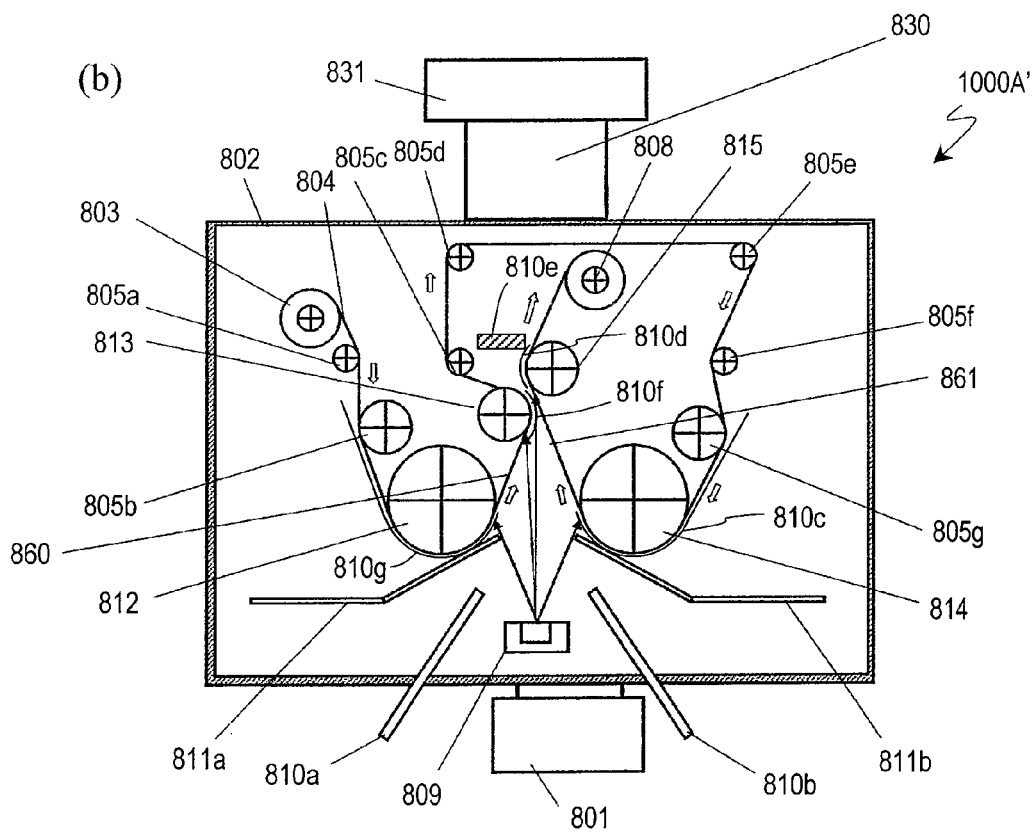
Figure 22:
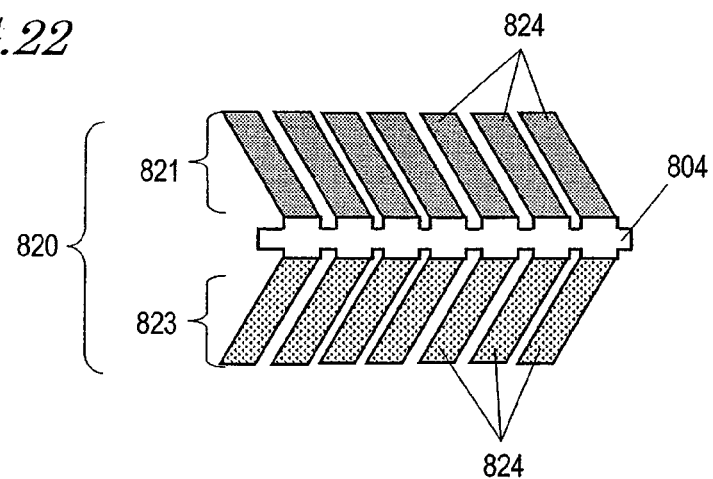
FIG. 22 is a schematic cross-sectional view of vapor deposition films formed by the vapor deposition device in Reference Embodiment A.

FIG. 22 is a schematic view of a vapor deposition film formed on the substrate 804 by the above operation. The first vaporization zone 860 and the second vaporization zone 861 are located such that the incidence angle of the vapor-depositing material particles evaporated from the center of the evaporation source 809 on the substrate 804 is oblique. Therefore, a vapor deposition film including column-like elements oblique with respect to the substrate 804 as shown in FIG. 22 can be formed. As shown in FIG. 20, the first film formation zone 860 and the second film formation zone 861 are located on both sides of the evaporation source 809. Therefore, vapor deposition can be performed in the two film formation zones at the same time. As shown in FIG. 20, the substrate 804 transported between the first can 812 and the second can 813, and the substrate 804 transported between the third can 814 and the fourth can 815, are located on both sides of the evaporation source 809. Therefore, vapor deposition can be performed in the two film formation zones at the same time. The growth direction of the first active material layer 821 and the growth direction of the second active material layer 823 formed on both surfaces of the substrate 804 are substantially symmetrical to each other.

In the vapor deposition device 1000A in Embodiment A, the fourth can 815 is located right above the evaporation source 809 with a gap from the second can 813 and the fourth can 815 and above the second can 813. Owing to this, a reduction of the vacuum degree can be prevented, and also an increase of probability of collision of vapor deposition material particles which results in a decrease of the attaching force can be prevented, in the vicinity of the second can 813 and the fourth can 815. In addition, the second film formation zone 861 is located at such a position that the incidence angle of the vapor deposition particles on the substrate is 75° and right above the evaporation source 809. Therefore, film formation can be performed in a zone having the highest concentration of the evaporated material. This occurs for the following reason. The material heated in the vacuum atmosphere is evaporated by the COS rule. Therefore, the vapor concentration is higher in a zone closer to the normal to the evaporation source. Thus, in such a zone, the utilization factor of the material can be improved, and the direction right above the evaporation source can be actively used. Substantially the same effect is provided where the first vapor deposition zone 860 is located in the same manner instead of the second vapor deposition zone 861.

Where θ11 and θ13 are smaller than 45°, the particles to be grown rise steeply, and hence, it is likely to be difficult to form a vapor deposition film having a space between the particles on the concaved and convexed surface of the substrate 804. As a result, the substrate is likely to be wrinkled by the expansion of the particles at the time of charge/discharge. Where $\theta 12$ and $\theta 14$ are larger than 75°, the particles to be grown are inclined largely. This weakens the attachment of the particles to the concaved and convexed surface of the substrate, and as a result, a vapor deposition film having a weak adhesiveness to the substrate is formed. As a result, the electrode active material is likely to be detached from the substrate at the time of charge/discharge. Accordingly, in the vapor deposition device 1000A in Embodiment A, it is preferable that $\theta 11$, $\theta 12$, $\theta 13$ and $\theta 14$ are set such that silicon particles as the vapor deposition particles evaporated from the center of the evaporation source 809 fly at an incidence angle in the range of 45° to 75° on the substrate 804 transported between the first can 812 and the second can 813 and between the third can 814 and the fourth can 815.

Outside the vacuum tank 802, the exhaust pump 801 and the assisting exhaust pump 831 communicated with the assisting exhaust opening 830 located above the vacuum tank 802 are provided. The inside of the vacuum tank 802 is made vacuum by the exhaust pump 801 and the assisting exhaust opening 830. In the vapor deposition device 1000A, when the pressure inside the vacuum tank 802 rises to about $4.5 \times 10^{-2}$ Pa, the pipe conductance is adjusted using the assisting exhaust pump 831 having an exhaust speed of 5000 L/sec. such that the vacuum exhaust speed at the assisting exhaust opening 830 is 2000 L/sec. In this manner, the vacuum pressure is improved from about $4.5 \times 10^{-2}$ Pa to about $3.0 \times 10^{-2}$ Pa.

In order to improve the gas molecule exhaust capability, it is desirable to provide a gap in the vicinity of the film formation zones close to each other, namely, around a zone where the incidence angle of the vapor deposition particles on the substrate is 75°, thus to exhaust the introduced gas molecules. In order to improve the gas molecule exhaust capability, it is desirable to perform vacuum exhaust above the film formation zone. Especially, where a vacuum exhaust opening is provided above such a zone, the vapor-depositing material particles do not directly reach the vacuum exhaust opening from the evaporation source 809. Therefore, the vacuum pump does not need to be protected and so can be installed at a highest exhaust efficiency. In addition, the vapor-depositing material does not form a film around the vacuum exhaust opening and so no substance is deposited. Therefore, there is no risk that the deposited substance falls to contaminate the substrate. Furthermore, since the vacuum degree in the vicinity of the film formation zones close to each other can be improved, the oxygen gas or evaporated particles of silicon having directivity can be vapor-deposited as being distributed over the film formation zones. Accordingly, a reduction of the space among the active material particles caused by the reduction of the vacuum degree at the time of vapor deposition and the expansion/contraction of the electrode active material can be suppressed, and so a cell having a high charge/discharge cycle characteristic is provided.

The space in the first active material layer 821 and the second active material layer 823 formed in Embodiment A can be used as an expansion space necessary when the electrode plate is expanded by the charge/discharge, and allows the stress on the electrode active material to be alleviated. Therefore, the shortcircuiting between the positive electrode and the negative electrode can be suppressed, which provides a cell having a high charge/discharge cycle characteristic, needless to say.

Figure 23:
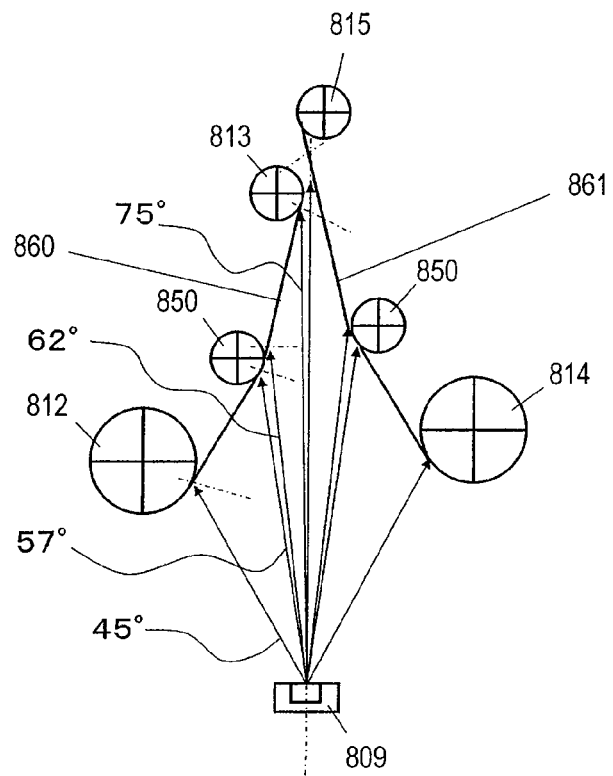
FIG. 23 is a partial cross-sectional view schematically showing a modification of the first vapor deposition section and the second vapor deposition section in Reference Embodiment A.

FIG. 23 is a partial schematic view showing a modification of the first film formation zone 860 and the second film formation zone 861 in the vapor deposition zones of the vapor deposition device 1000A in Embodiment A. As shown in FIG. 23, it is possible to provide an assisting can 850 between the first can 812 and the second can 813 forming the first film formation zone 860, and also between the third can 814 and the fourth can 815 forming the second film formation zone 861. By providing the assisting cans 850, a curved running section can be provided in the middle of the straight running section of the substrate 804 in the first film formation zone 860 and the second film formation zone 861, which suppresses the slackening of the substrate 804 during the running. This can suppress the substrate 804 from being wrinkled during the running.

Figure 24:
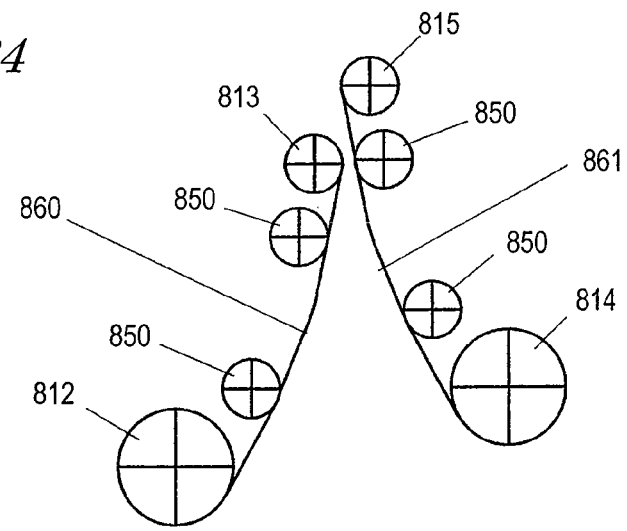
FIG. 24 is a partial cross-sectional view schematically showing another modification of the first vapor deposition section and the second vapor deposition section in Reference Embodiment A.

FIG. 24 is a partial schematic view showing another modification of the first film formation zone 860 and the second film formation zone 861 in the vapor deposition zones of the vapor deposition device 1000A in Embodiment A. As shown in FIG. 24, it is possible to provide the first can 812, the second can 813, the third can 814, the fourth can 815, and a plurality of assisting cans 850 as a cooling structure, and set each can to a temperature range of −30° C. to 20° C. to cool the substrate 804. Since the heat received by the substrate 804 during the vapor deposition (radiant heat from the evaporation source 809, heat of solidification of the vapor deposition particles, etc.) can be alleviated, the thermal expansion of the substrate 804 during the running can be suppressed and so substrate 804 can be suppressed from being wrinkled during the running.

Reference Embodiment B

Figure 25:
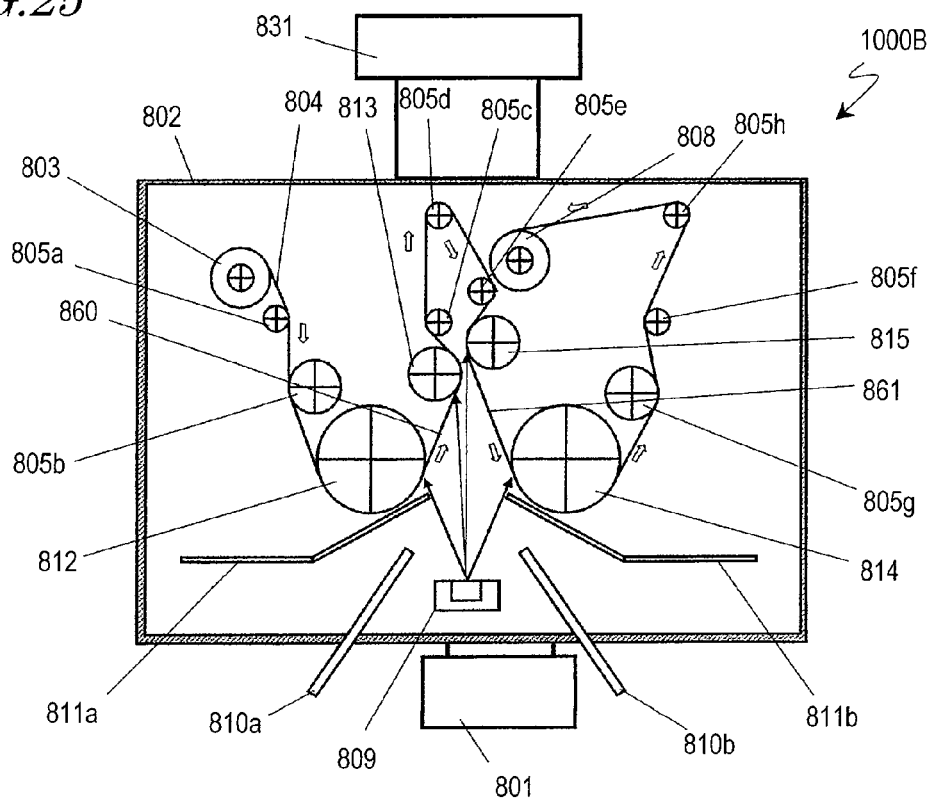
FIG. 25 is a schematic cross-sectional view of a vacuum vapor deposition device in Reference Embodiment B.

Now, a structure of a vapor deposition device 1000B in Reference Embodiment B will be described. FIG. 25 is a schematic cross-sectional view of the vapor deposition device 1000B in Embodiment B. The vapor deposition device 1000B in Embodiment B has almost the same structure as that of the vapor deposition device 1000A in Embodiment A except for the following. Unlike the vapor deposition device 1000A, the vapor deposition device 1000B includes a path, located on the path for guiding the substrate 804 from the first film formation zone 860 to the second film formation zone 861, for allowing the substrate 804 to run such that a film is formed on the same surface of the substrate 804 in the first film formation zone 860 and the second film formation zone 861.

Now, an operation of the vapor deposition device 1000B in Embodiment B will be described. The vapor deposition device 1000B operates in almost the same manner as the deposition device 1000A in Embodiment A. The difference is the following. A film is formed on the same surface of the substrate 804 in the first film formation zone 860 and the second film formation zone 861. The rolled substrate 804 having the film formed thereon is set to the supply roll 803 again, and the same operation is performed on the surface of the substrate 804 on which no vapor deposition film has been formed. Specifically, as shown in FIG. 25, the substrate 804 of a long strip type fed from the supply roll 803 in the vacuum tank 802 is guided along the transportation rollers 805a and 805b, the first can 812, the second can 813, the transportation rollers 805c, 805d and 805e, the fourth can 815, the third can 814, and the transportation rollers 805g, 805f and 805h in this order, and then is taken up by the take-up roll 808.

Figure 26:
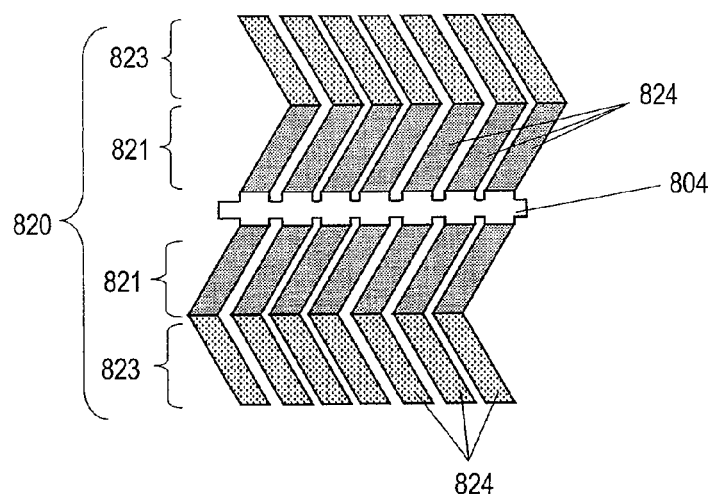
FIG. 26 is a schematic cross-sectional view of a vapor deposition film formed by the vapor deposition device in Reference Embodiment B.

FIG. 26 is a cross-sectional view of a vapor deposition film formed by the vapor deposition device 1000B in Embodiment B. While the incidence direction of the evaporated vapor-depositing material particles on the substrate 804 is changed, the film is formed on the same surface of the substrate 804 in the first film formation zone 860 and the second film formation zone 861. Therefore, the first active material layer 821 and the second active material layer 823 can be formed zigzag as shown in FIG. 7. In Embodiment B also, the second film formation zone 861 is provided above the evaporation source 809. Therefore, film formation can be performed in a zone having a high concentration of the evaporated material, and the utilization factor of the material can be improved, needless to say.

The shape of an electrode 820 after the vapor deposition film is formed in each of Embodiments A and B is not limited to the above shape, and may be appropriately selected in accordance with the designed capacitance of the cell.

Using the electrode 820 produced by each of vapor deposition devices 1000A and 1000B, a nonaqueous electrolytic secondary cell can be easily produced as follows. The electrode 820 is used together with a positive electrode plate containing a positive electrode active material generally usable for a lithium ion secondary cell such as $LiCoO_2$, $LiNiO_2$, $LiMn_2O_4$ or the like, a separator formed of a microporous film or the like, and an electrolytic solution having a generally known composition and having lithium ion conductivity obtained by dissolving lithium hexafluorophosphate or the like in a cyclic carbonate such as ethylene carbonate, propylene carbonate or the like.

According to the vapor deposition devices 1000A and 1000B described above, film formation can be performed in a zone right above the evaporation source, where the concentration of the evaporated vapor-depositing material is high and the incidence angle of the vapor-depositing material is high. Accordingly, the film formation can be performed in a zone having a high concentration of the evaporated material supplied from the evaporation source, although the structure of the vapor deposition device is compact. Thus, the utilization factor of the evaporated material can be improved, and a film which is not easily deteriorated can be continuously formed by a highly productive vapor deposition method.

Reference Embodiment C

Figure 27:
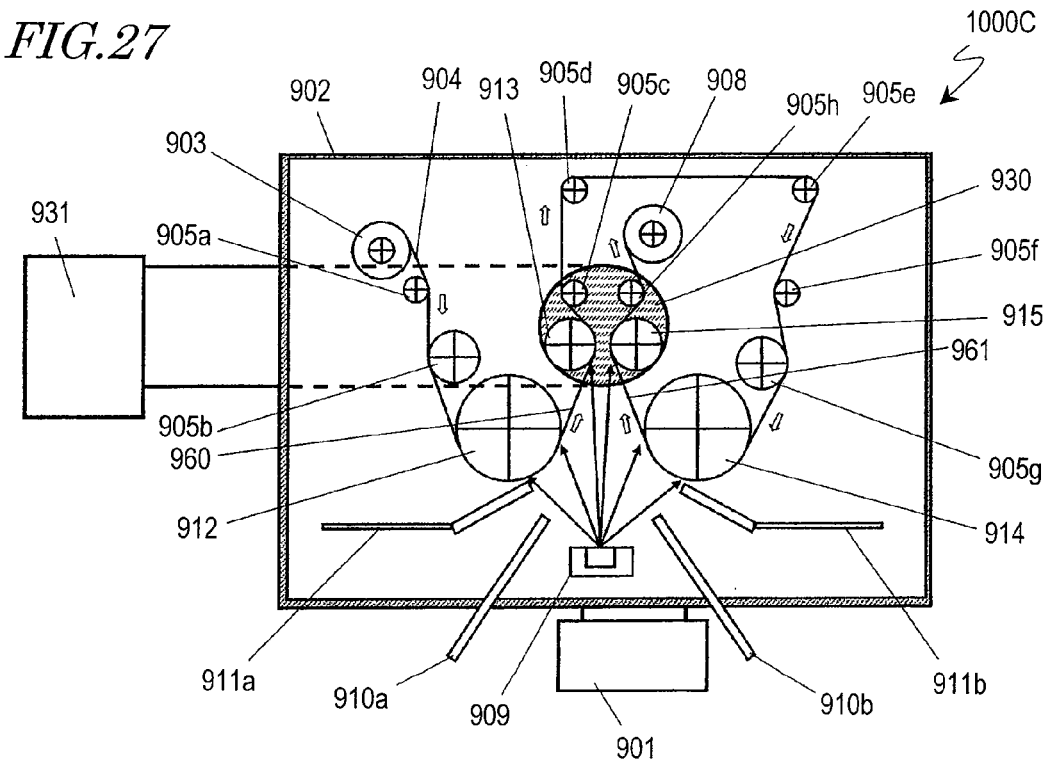
FIG. 27 is a schematic cross-sectional view of a vacuum vapor deposition device in Reference Embodiment C.

FIG. 27 is a cross-sectional view schematically showing a vapor deposition device 1000C in Reference Embodiment C. As shown in FIG. 27, the vapor deposition device 1000C in Embodiment C includes a vacuum tank 902, an exhaust pump 901 provided outside the vacuum tank 902, an assisting exhaust pump 931 communicated with an assisting exhaust opening 930 of the vacuum tank 902, an evaporation source 909 provided inside the vacuum tank 902 at a position near the exhaust pump 901 for evaporating a vapor-depositing material, shielding plates 10a and 10b provided on both sides of the evaporation source 909, and gas introduction pipes 911a and 911b acting as oxygen gas supply sections for introducing oxygen gas into the vacuum tank 902. The shielding plates 910a and 910b are located in a truncated inverted V shape so as to cover the evaporation source 909 and the exhaust pump 901.

The vacuum tank 902 accommodates a supply roll 903 around which a substrate 904 is wound, transportation rollers 905a through 905h, a take-up roll 908, a cylindrical first can 912, a cylindrical second can 913, a cylindrical third can 914, and a cylindrical fourth can 915. A first vapor deposition section 962 is formed of the first can 912 and the second can 913. A first vapor deposition zone 960 in the first vapor deposition section 962 is formed of a vapor deposition surface of the substrate 904 between the second can 913 and a contact point at which the first can 912 contacts a straight line extending from the center of the vapor deposition surface of the evaporation source 909 through the end of the gas introduction pipe 911a to the first can 912. A second vapor deposition section 963 is formed of the third can 914 and the fourth can 915. A second vapor deposition zone 961 in the second vapor deposition section 963 is formed of the vapor deposition surface of the substrate 904 between the fourth can 915 and a contact point at which the third can 914 contacts a straight line extending from the center of the vapor deposition surface of the evaporation source 909 through the end of the gas introduction pipe 911b to the third can 914. The first vapor deposition zone 960 and the second vapor deposition zone 961 are located on both sides of the normal passing through the center of the vapor deposition surface of the evaporation source so as to face each other.

Figure 28:
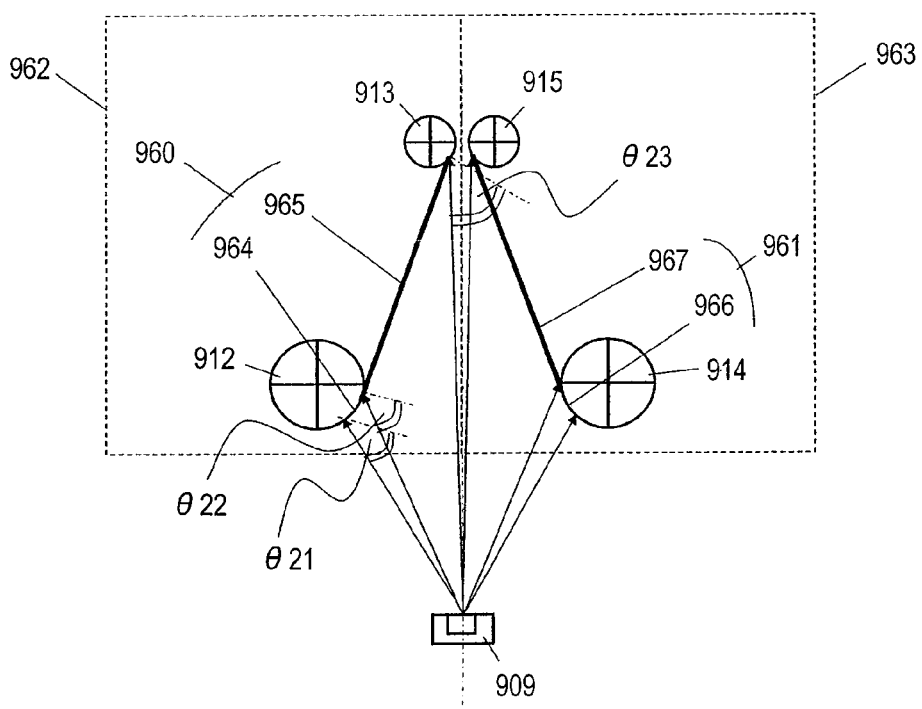
FIG. 28 is a schematic cross-sectional view of a first vapor deposition section and a second vapor deposition section in Reference Embodiment C.

FIG. 28 is a schematic view showing the set positions of the first vapor deposition section 962, the second vapor deposition section 963, the evaporation source 909 and the like. As shown in FIG. 28, the first vapor deposition zone 960 is formed of a first curved running section 964 for allowing the substrate 904 to run along the first can 912 and a first straight running section 965 for allowing the substrate 904 to run along a straight section between the first can 912 and the second can 913. The second vapor deposition zone 963 is formed of a second curved running section 966 for allowing the substrate 904 to run along the third can 914 and a second straight running section 967 for allowing the substrate 904 to run along a straight section between the third can 914 and the fourth can 915. Referring to FIG. 28, θ21 is an angle made by a straight line extending from the center of the vapor deposition surface of the evaporation source 909 through the end of the gas introduction pipe 911a to the first can 912 and the normal extending from a point at which the straight line and the first can 912 cross each other. θ22 is an angle made by the normal extending from a point at which the substrate 904 leaves the first can 912 and a straight line extending from the center of the vapor deposition surface of the evaporation source 909 to such a point. θ23 is an angle made by a straight line extending from the center of the vapor deposition surface of the evaporation source 909 to a point at which the substrate 904 contacts the second can 813 when leaving the second can 813 and the normal extending from such a contact point of the straight line and the second can 913. The first can 912 and the second can 913 are located such that θ21, θ22 and θ33 fulfill the relationship of 45°≦θ21<θ22<θ23≦75° (in this Embodiment C, θ21=45°, θ22=63°, and θ23=75°). The third can 914 and the fourth can 915 are located line-symmetric to the first can 912 and the second can 913 with respect to the center line passing through the center of the evaporation source 909.

Now, an operation of the vapor deposition device 1000C in Embodiment C will be described. First, the substrate 904 is caused to run. The substrate 904 of a long strip type fed out from the supply roll 903 is guided along the transportation rollers 905a and 905b, the first can 912, the second can 913, the transportation rollers 905c, 905d 905e, 905f and 905g, the third can 914, and the fourth can 915, and then is taken up by the take-up roll 908. Since the substrate 904 is used as a current collector of an electrode, a film-type metal foil having a concave and convex pattern formed on a top surface and a rear surface thereof is used as the substrate 904. The metal material of the metal foil is, for example, a material fulfilling the electric conductivity required of a current collector such as copper, nickel, aluminum or the like. The concave and convex pattern is formed of diamond shapes, each of which has a size of 20 μm×20 μm and a height of 10 μm. The arithmetic average roughness (Ra) of the surface of the concave and convex pattern is 2.0 μm. On the running substrate 904, the vapor-depositing material evaporated from the evaporation source 909 is vapor-deposited to form a vapor deposition film (vapor deposition particles). For the evaporation source 909, a crucible or the like is used. The evaporation source 909 is heated by a heating device (not shown) such as a resistance heating device, an induction heating device, an electronic beam heating device or the like, and silicon, for example, as the vapor-depositing material is evaporated. In the first film formation zone 960 between the first can 912 and the second can 913, the substrate 904 is exposed to the silicon evaporated from the evaporation source 909, and as a result, a first active material layer 921 of silicon is formed on one surface of the substrate 904. Then, in the second film formation zone 961 between the third can 914 and the fourth can 915, the substrate 904 is exposed to the silicon evaporated from the evaporation source 909, and as a result, a second active material layer 923 of silicon is also formed on the other surface of the substrate 904. For forming an active material layer of a compound containing silicon and oxygen, oxygen gas is introduced through the gas introduction pipes 911a and 911b, and silicon is evaporated from the evaporation source 909 in an oxygen gas atmosphere. The arithmetic average roughness (Ra) is defined in the Japanese Industrial Standards (JISB 0601-1994), and may be measured by, for example, a contact-system or laser-system surface roughness meter or the like.

Figure 29:
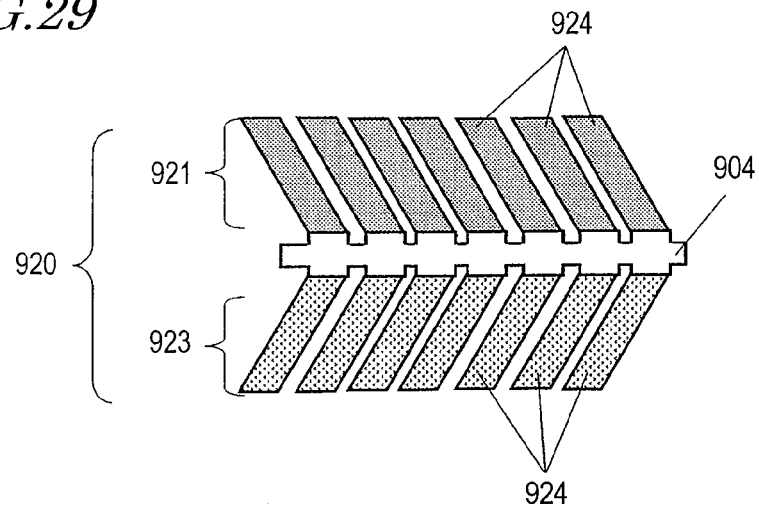
FIG. 29 is a schematic cross-sectional view of a vapor deposition film formed by the vapor deposition device in Reference Embodiment C.

FIG. 29 is a schematic view of a vapor deposition film formed on the substrate 904 by the above operation. The first vaporization zone 960 and the second vaporization zone 961 are located such that the incidence angle of the vapor-depositing material particles evaporated from the center of the evaporation source 909 on the substrate 904 is oblique. Therefore, a vapor deposition film including column-like elements oblique with respect to the substrate 904 as shown in FIG. 29 can be formed.

In the vapor deposition device 1000C in Embodiment C, the first film formation zone 960 and the second film formation zone 961 are located such that silicon particles as the vapor deposition particles evaporated from the center of the evaporation source 909 fly at an incidence angle in the range of 45° to 75° on the substrate 904 transported between the first can 912 and the second can 913 and between the third can 914 and the fourth can 915. This is for the following reason. In vapor deposition, the material heated in the vacuum atmosphere is evaporated by the COS rule. Therefore, the vapor concentration is higher in a zone closer to the normal to the evaporation source 909. Thus, in such a zone, the utilization factor of the material is improved. Where the angle with respect to the normal to the evaporation source 909 is defined as the vaporization angle, the utilization factor of the material can be adjusted in the range of the vaporization angle of the vapor deposition particles. Namely, where the range of the vaporization angle is the same, as the distance from the evaporation source is shorter, the deposition speed of the material evaporated from the evaporation source on the substrate 904 is higher. For this reason, in order to raise the productivity, it is important to widen the vaporization angle and shorten the distance from the evaporation source 909 to the substrate 904. This is why the first film formation zone 960 and the second film formation zone 961 are located as described above. However, in the case where the film formation zone includes only a zone where the substrate 904 runs straight, a film formation zone with a large incidence angle unavoidably needs to be located far from the evaporation source 909. For this reason, in the vapor deposition device 1000C in Embodiment C, the first vapor deposition zone 960 is formed of the first curved running section 964 for allowing the substrate 904 to run along the first can 912 and the first straight running section 965 for allowing the substrate 904 to run along the straight section provided by the first can 912 and the second can 913.

The second vapor deposition zone 963 is formed of the second curved running section 966 for allowing the substrate 904 to run along the third can 914 and the second straight running section 967 for allowing the substrate 904 to run along the straight section provided by the third can 914 and the fourth can 915. The first curved running section 964 and the second curved running section 966 form a film formation zone with an incidence angle of about 45° to 63°, and therefore a film formation zone with an incidence angle of about 75° can be provided near the evaporation source. For example, assuming that a vaporization angle of 2° to 32° and a vaporization angle of −32° to −2° are used, a zone with an incidence angle of 45° to 63° is provided above the first can 912 and the third can 914, and a zone with an incidence angle of 63° to 75° is provided linearly. In this case, as compared with the case where a film formation zone with an incidence angle of 45° to 75° is provided linearly, the position of an incidence angle of 75° can be closer by $7/10$ to the evaporation source. Since the deposition speed on the substrate is in inverse proportion to the square of the distance between the evaporation source and the substrate, the material deposition speed on the substrate can be increased about twice as higher. The zone with an incidence angle of 45° to 63° is close to the evaporation source 909, and so the temperature of the substrate in this zone is increased as a result of the influence of the radiant heat and the energy of the vapor-depositing material. By allowing the substrate to be in contact with the can, heat can be removed from the substrate, which provides an effect of suppressing a temperature rise of the substrate.

Where $\theta 21$ is smaller than 45°, the particles to be grown rise steeply, and hence, it is likely to be difficult to form a vapor deposition film having a space between the particles on the concaved and convexed surface of the substrate 904. As a result, the substrate is likely to be wrinkled by the expansion of the particles at the time of charge/discharge. Where $\theta 23$ is larger than 75°, the particles to be grown are inclined largely. This weakens the attachment of the particles to the concaved and convexed surface of the substrate, and as a result, a vapor deposition film having a weak adhesiveness to the substrate is formed. As a result, the electrode active material is likely to be detached from the substrate at the time of charge/discharge. Accordingly, in the vapor deposition device 1000C in Embodiment C, it is preferable that $\theta 21$ and $\theta 23$ are set such that silicon particles as the vapor deposition particles evaporated from the center of the evaporation source 909 fly at an incidence angle in the range of 45° to 75° on the substrate 904 transported between the first can 912 and the second can 913 and between the third can 914 and the fourth can 915.

In the vapor deposition device 1000C in Embodiment C, when the pressure inside the vacuum tank 902 rises to about $4.5 \times 10^{-2}$ Pa, the pipe conductance is adjusted using the assisting exhaust pump 931 having an exhaust speed of 5000 L/sec. such that the vacuum exhaust speed at the assisting exhaust opening 930 is 2000 L/sec. In this manner, the vacuum pressure is improved from about $4.5 \times 10^{-2}$ Pa to about $3.0 \times 10^{-2}$ Pa.

The vacuum exhaust capability can be improved as follows. The first film formation zone 960 and the second film formation zone 961 of the substrate 904 located obliquely are located symmetrical with respect to the evaporation source 909, and the assisting exhaust opening 930 is provided in the vicinity of a zone where the incidence angle of the vapor deposition particles on the substrate is 75°, i.e., in the vicinity of the above-mentioned film formation zones close to each other. Owing to this, the vacuum degree in the vicinity of the film formation zones close to each other can be improved, and the oxygen gas or evaporated particles of silicon having directivity can be vapor-deposited as being distributed over the film formation zones. Accordingly, a reduction of the space among the active material particles caused by the reduction of the vacuum degree at the time of vapor deposition and the expansion/contraction of the electrode active material can be suppressed, and so a cell having a high charge/discharge cycle characteristic is provided.

The space in the first active material layer 921 and the second active material layer 923 formed in Embodiment C can be used as an expansion space necessary when the electrode plate is expanded by the charge/discharge, and allows the stress on the electrode active material to be alleviated. Therefore, the shortcircuiting between the positive electrode and the negative electrode can be suppressed, which provides a cell having a high charge/discharge cycle characteristic, needless to say.

Figure 30:
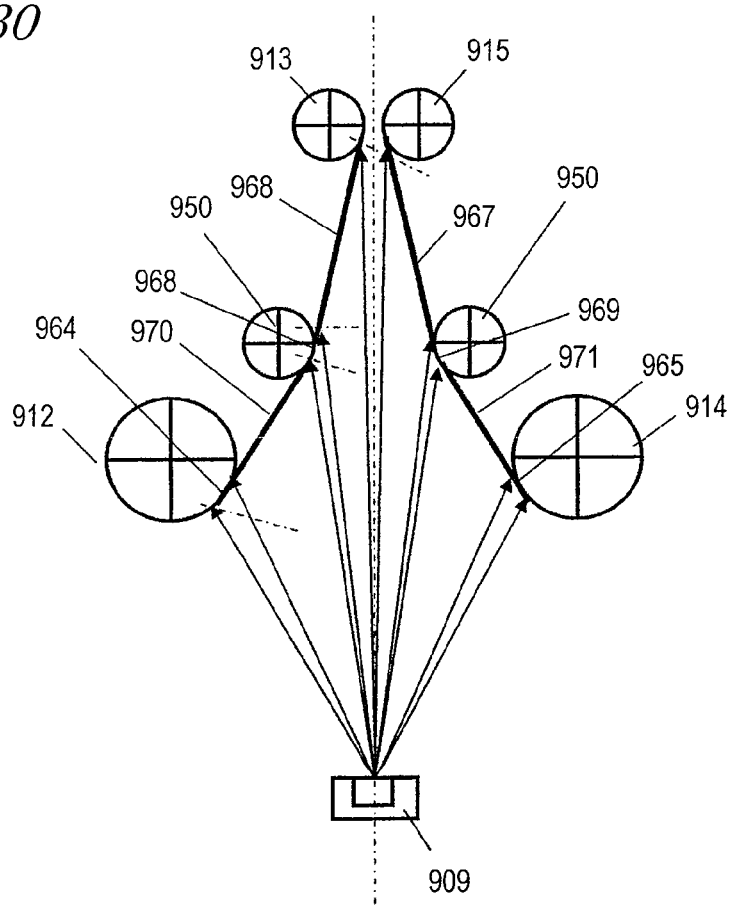
FIG. 30 is a partial cross-sectional view schematically showing a modification of a first vapor deposition section and a second vapor deposition section in Reference Embodiment C.

FIG. 30 is a partial schematic view showing a modification of the first vapor deposition zone 960 and the second vapor deposition zone 961 in the vapor deposition zones of the vapor deposition device 1000C in Embodiment C. As shown in FIG. 30, it is possible to provide an assisting can 950 in a middle part of the first film formation zone 960 and in a middle part of the second film formation zone 961. By providing the assisting cans 950, the first film formation zone 960 is formed of a first curved running section 964, a first intermediate straight running section 970, a first intermediate curved running section 968 and a first straight running section 965. Also by providing the assisting cans 950, The second film formation zone 961 is formed of a second curved running section 966, a second intermediate straight running section 970, a second intermediate curved running section 969 and a second straight running section 967. Owing to this structure, in the first film formation zone 960 and the second film formation zone 961, slackening of the substrate 804 can be suppressed during the running. This can suppress the substrate 804 from being wrinkled during the running.

By providing the first intermediate curved running section 968 and the second intermediate curved running section 969, zones having a high incidence angle in the first straight running section 965 and the second straight running section 967 can be made closer to the evaporation source 909. Thus, film formation can be performed fulfilling the conditions on both the incidence angle and the vaporization angle, which improves the utilization factor of the material.

By allowing the first intermediate curved running section 968 and the second intermediate curved running section 969 to be cooled, heat can be removed from the substrate, which provides an effect of suppressing a temperature rise of the substrate. For example, the temperature of each can may be set to the range of −30° C. to 20° C. to cool the substrate 904. Since the heat received by the substrate 904 during the vapor deposition (radiant heat from the evaporation source 909, heat of solidification of the vapor deposition particles, etc.) can be alleviated, the thermal expansion of the substrate 904 during the running can be suppressed and so substrate 904 can be suppressed from being wrinkled during the running.

Figure 31:
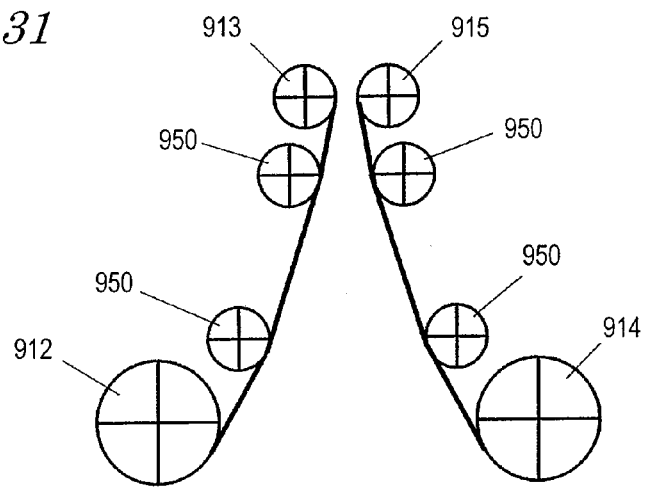
FIG. 31 is a partial cross-sectional view schematically showing another modification of the first vapor deposition section and the second vapor deposition section in Reference Embodiment C.

FIG. 31 is a partial schematic view showing another modification of the first vapor deposition zone 960 and the second vapor deposition zone 961 in the vapor deposition zones of the vapor deposition device 1000C in Embodiment C. As shown in FIG. 31, it is possible to provide two assisting cans 950 in each of the first film formation zone 960 and the second film formation zone 961.

Owing to this structure, zones having a high incidence angle in the first straight running section 965 and the second straight running section 967 can be made still closer to the evaporation source 909. Thus, film formation can be performed fulfilling the conditions on both the incidence angle and the vaporization angle, which improves the utilization factor of the material.

Reference Embodiment D

Figure 32:
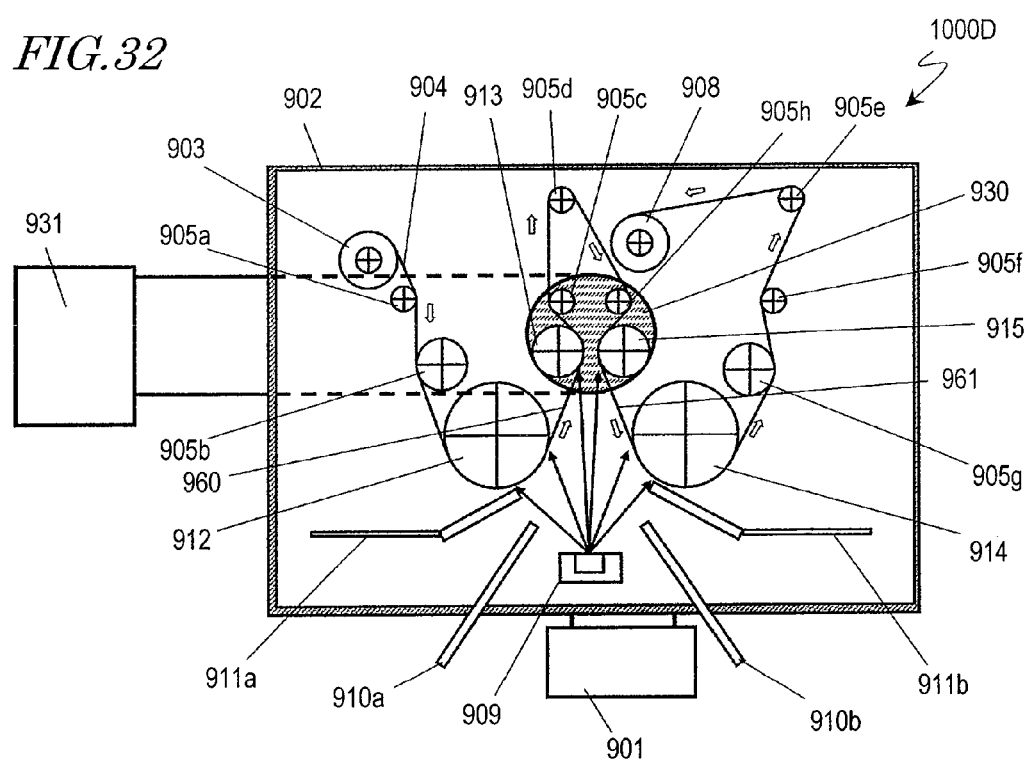
FIG. 32 is a schematic cross-sectional view of a vacuum vapor deposition device in Reference Embodiment D.

Now, a structure of a vapor deposition device 1000D in Reference Embodiment D will be described. FIG. 32 is a cross-sectional view schematically showing the vapor deposition device 1000D in Embodiment D. The vapor deposition device 1000D in Embodiment D has almost the same structure as that of the vapor deposition device 1000C in Embodiment C except for the following. Unlike the vapor deposition device 1000C, the vapor deposition device 1000D includes a path, located on the path for guiding the substrate 904 from the first film formation zone 960 to the second film formation zone 961, for allowing the substrate 904 to run such that a film is formed on the same surface of the substrate 904 in the first film formation zone 960 and the second film formation zone 961.

Now, an operation of the vapor deposition device 1000D in Embodiment D will be described. The vapor deposition device 1000D in Embodiment D operates in almost the same manner as the deposition device 1000C shown in Embodiment C. The difference is the following. A film is formed on the same surface of the substrate 904 in the first film formation zone 960 and the second film formation zone 961. The rolled substrate 904 having the film formed thereon is set to the supply roll 903 again, and the same operation is performed on the surface of the substrate 904 on which no vapor deposition film has been formed. Specifically, as shown in FIG. 32, the substrate 904 of a long strip type fed from the supply roll 903 in the vacuum tank 902 is guided along the transportation rollers 905a and 905b, the first can 912, the second can 913, the transportation rollers 5c, 5d and 5e, the fourth can 915, the third can 914, and the transportation rollers 905g, 905f and 905h in this order, and then is taken up by the take-up roll 909.

Figure 33:
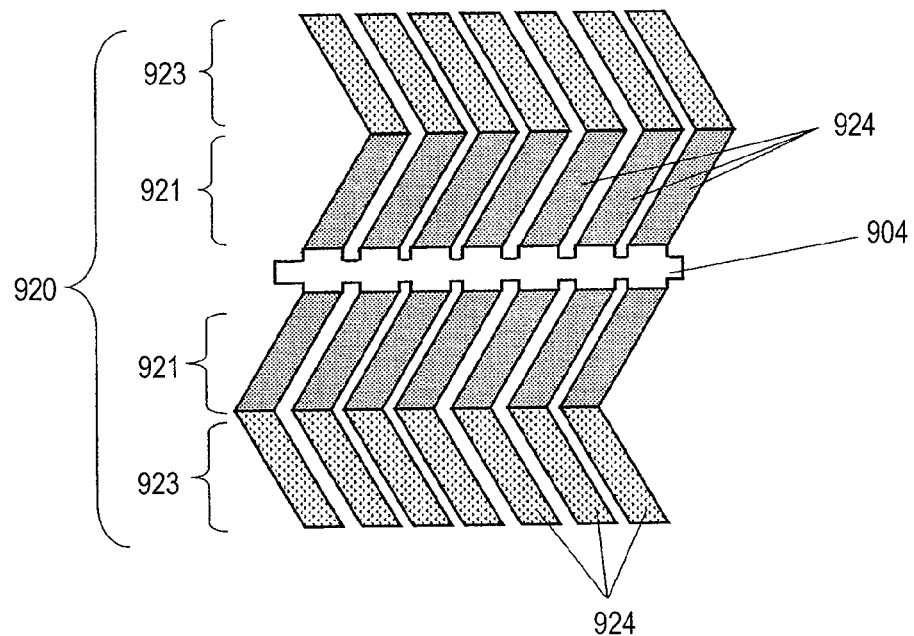
FIG. 33 is a schematic cross-sectional view of a vapor deposition film formed by the vapor deposition device in Reference Embodiment D.

FIG. 33 is a cross-sectional view of a vapor deposition film formed by the vapor deposition device 1000D in Embodiment D. While the incidence direction of the evaporated vapor-depositing material particles on the substrate 904 is changed, the film is formed on the same surface of the substrate 904 in the first film formation zone 960 and the second film formation zone 961. Therefore, the first active material layer 921 and the second active material layer 923 can be formed zigzag as shown in FIG. 33. Like in Embodiment C, in Embodiment D also, the first curved running section 964 and the first straight running section 965 are provided in the first vapor deposition zone 960, and the second curved running section 966 and the second straight running section 967 are provided in the second vapor deposition zone 961. Thus, the relative distance between the vapor deposition zones in which the vapor deposition particles are vapor-deposited on the substrate 904 obliquely and the evaporation source 909 is shortened. Therefore, needless to say, the utilization factor of the material can be improved.

The shape of an electrode 20 after the vapor deposition film is formed in each of Embodiments C and 2 is not limited to the above shape, and may be appropriately selected in accordance with the designed capacitance of the cell.

Using the electrode 920 produced by each of the vapor deposition devices 1000C and 200, a nonaqueous electrolytic secondary cell can be easily produced as follows. The electrode 920 is used together with a positive electrode plate containing a positive electrode active material generally usable for a lithium ion secondary cell such as $LiCoO_2$, LiNiO$_2$, LiMn$_2$O$_4$ or the like, a separator formed of a microporous film or the like, and an electrolytic solution having a generally known composition and having lithium ion conductivity obtained by dissolving lithium hexafluorophosphate or the like in a cyclic carbonate such as ethylene carbonate, propylene carbonate or the like.

According to Embodiments C and D, the vapor deposition zone can be enlarged without increasing the size of the vacuum tank of the vapor deposition device. Thus, a vapor deposition film can be formed at a higher efficiency. In addition, the distance from the substrate in the vicinity of a zone, where the incidence angle from the evaporation source on the surface of the substrate is 75°, to the evaporation source can be shortened. Accordingly, the deposition speed of the vapor deposition particles on the substrate can be increased. Thus, the utilization factor of the evaporated material can be improved, and a film which is not easily deteriorated can be continuously formed by a highly productive vapor deposition method.

INDUSTRIAL APPLICABILITY

A vapor deposition device according to the present invention is usable for producing various devices using vapor deposition films, for example, electrochemical devices such as cells and the like; optical devices such as photonic elements, optical circuit components and the like; and various other devices such as sensors and the like. The present invention is generally applicable to electrochemical elements, and is especially advantageously applicable to production of electrode plates for cells using active materials which are largely expanded and contracted by charge/discharge. When being applied to production of such elements, the present invention provides an electrode plate having a high energy density with deformation or generation of wrinkles caused by expansion of the active material being suppressed.

The invention claimed is:

1. A method for continuously producing a film containing a vapor-depositing material on a substrate, using a roll-to-roll system vapor deposition device including a chamber, an evaporation source located in the chamber for evaporating the vapor-depositing material, and a transportation section located in the chamber for transporting the substrate of a sheet type, by moving the substrate by the transportation section, the method comprising:
  a step (A) of transporting the substrate to a first zone, a second zone, a third zone and a fourth zone in this order, the first to fourth zones being provided in the chamber so as not to overlap with one another with respect to the evaporation source; wherein:
  the vapor-depositing material is an active material for battery electrodes,
  the step (A) includes steps of:
    (a) while moving the substrate in the first zone in a direction toward the evaporation source, allowing the vapor-depositing material evaporated from the evaporation source to be incident on a surface of the substrate in a first direction inclined with respect to the normal to the surface of the substrate, thereby depositing the vapor-depositing material on the surface of the substrate;
    (b) while moving the substrate in the second zone in a direction away from the evaporation source, allowing the vapor-depositing material evaporated from the evaporation source to be incident on the surface of the substrate in a second direction inclined oppositely to the first direction with respect to the normal to the surface of the substrate, thereby depositing the vapor-depositing material on the surface of the substrate;
    (c) while moving the substrate in the third zone in the direction toward the evaporation source, allowing the vapor-depositing material evaporated from the evaporation source to be incident on the surface of the substrate in a third direction inclined on the same side as the first direction with respect to the normal to the surface of the substrate, thereby depositing the vapor-depositing material on the surface of the substrate; and
    (d) while moving the substrate in the fourth zone in the direction away from the evaporation source, allowing the vapor-depositing material evaporated from the evaporation source to be incident on the surface of the substrate in a fourth direction inclined oppositely to the first direction with respect to the normal to the surface of the substrate, thereby depositing the vapor-depositing material on the surface of the substrate, and
  a ratio of vapor-depositing material deposition amounts in the first, second, third and fourth vapor deposition zones is 1:2:2:1.

2. The method of claim 1, further comprising a step (B) of transporting the substrate to the fourth zone, the third zone, the second zone and the first zone in this order, after the step (A), wherein:
  the step (B) includes steps of:
    (e) while moving the substrate in the fourth zone in the direction toward the evaporation source, allowing the vapor-depositing material evaporated from the evaporation source to be incident on the surface of the substrate in the fourth direction with respect to the normal to the surface of the substrate, thereby depositing the vapor-depositing material on the surface of the substrate;
    (f) while moving the substrate in the third zone in the direction away from the evaporation source, allowing the vapor-depositing material evaporated from the evaporation source to be incident on the surface of the substrate in the third direction with respect to the normal to the surface of the substrate, thereby depositing the vapor-depositing material on the surface of the substrate;
    (g) while moving the substrate in the second zone in the direction toward the evaporation source, allowing the vapor-depositing material evaporated from the evaporation source to be incident on the surface of the substrate in the second direction with respect to the normal to the surface of the substrate, thereby depositing the vapor-depositing material on the surface of the substrate; and
    (h) while moving the substrate in the first zone in the direction away from the evaporation source, allowing the vapor-depositing material evaporated from the evaporation source to be incident on the surface of the substrate in the first direction with respect to the normal to the surface of the substrate, thereby depositing the vapor-depositing material on the surface of the substrate.

3. The method of claim 2, wherein the step (A) and the step (B) are alternately performed a plurality of times.

4. The method of claim 2, further comprising, between the step (A) and the step (B):
  a step (A') of inverting the surface of the substrate to be subjected to the vapor-depositing material and transporting the substrate to a fifth zone, a sixth zone, a seventh zone and an eighth zone in this order, the fifth to eight zones being provided in the chamber so as not to overlap with one another with respect to the evaporation source; and a step (B') of transporting the substrate to the eighth zone, the seventh zone, the sixth zone and the fifth zone in this order after the step (A'), and then inverting the surface of the substrate to be subjected to the vapor-depositing material, wherein:

the step (A') includes steps of:
  (a') while moving the substrate in the fifth zone in the direction toward the evaporation source, allowing the vapor-depositing material evaporated from the evaporation source to be incident an opposite surface to the surface of the substrate in a fifth direction inclined with respect to the normal to the surface of the substrate, thereby depositing the vapor-depositing material on the opposite surface of the substrate;
  (b') while moving the substrate in the sixth zone in the direction away from the evaporation source, allowing the vapor-depositing material evaporated from the evaporation source to be incident on the opposite surface of the substrate in a sixth direction inclined oppositely to the fifth direction with respect to the normal to the surface of the substrate, thereby depositing the vapor-depositing material on the opposite surface of the substrate;
  (c') while moving the substrate in the seventh zone in the direction toward the evaporation source, allowing the vapor-depositing material evaporated from the evaporation source to be incident on the opposite surface of the substrate in a seventh direction inclined on the same side as the fifth direction with respect to the normal to the surface of the substrate, thereby depositing the vapor-depositing material on the opposite surface of the substrate; and
  (d') while moving the substrate in the eighth zone in the direction away from the evaporation source, allowing the vapor-depositing material evaporated from the evaporation source to be incident on the opposite surface of the substrate in an eighth direction inclined oppositely to the fifth direction with respect to the normal to the surface of the substrate, thereby depositing the vapor-depositing material on the opposite surface of the substrate, the step (B') includes steps of:
  (e') while moving the substrate in the eighth zone in the direction toward the evaporation source, allowing the vapor-depositing material evaporated from the evaporation source to be incident on the opposite surface of the substrate in the eighth direction with respect to the normal to the surface of the substrate, thereby depositing the vapor-depositing material on the opposite surface of the substrate;
  (f') while moving the substrate in the seventh zone in the direction away from the evaporation source, allowing the vapor-depositing material evaporated from the evaporation source to be incident on the opposite surface of the substrate in the seventh direction with respect to the normal to the surface of the substrate, thereby depositing the vapor-depositing material on the opposite surface of the substrate;
  (g') while moving the substrate in the sixth zone in the direction toward the evaporation source, allowing the vapor-depositing material evaporated from the evaporation source to be incident on the opposite surface of the substrate in the sixth direction with respect to the normal to the surface of the substrate, thereby depositing the vapor-depositing material on the opposite surface of the substrate; and
  (h') while moving the substrate in the fifth zone in the direction away from the evaporation source, allowing the vapor-depositing material evaporated from the evaporation source to be incident on the opposite surface of the substrate in the fifth direction with respect to the normal to the surface of the substrate, thereby depositing the vapor-depositing material on the opposite surface of the substrate, and a ratio of vapor-depositing material deposition amounts in the fifth, sixth, seventh and eighth vapor deposition zones is 1:2:2:1.

5. The method of claim 1, wherein the active material includes silicon.

6. The method of claim 1, wherein the substrate is a metal foil.

7. A method for continuously producing a film containing a vapor-depositing material on a substrate, using a roll-to-roll system vapor deposition device including a chamber, an evaporation source located in the chamber for evaporating the vapor-depositing material, and a transportation section located in the chamber for transporting the substrate having a sheet shape, by moving the substrate by the transportation section, the method comprising:

a step (A) of transporting the substrate to a first zone and a second zone in this order, and then transporting the substrate to a third zone and a fourth zone in this order, the first to fourth zones being provided in the chamber so as not to overlap with one another with respect to the evaporation source; wherein:

the step (A) includes steps of:
  (a) while moving the substrate in the first zone in a direction toward the evaporation source, allowing the vapor-depositing material evaporated from the evaporation source to be incident on a surface of the substrate in a first direction inclined with respect to the normal to the surface of the substrate, thereby depositing the vapor-depositing material on the surface of the substrate;
  (b) while moving the substrate in the second zone in a direction away from the evaporation source, allowing the vapor-depositing material evaporated from the evaporation source to be incident on the surface of the substrate in a second direction inclined oppositely to the first direction with respect to the normal to the surface of the substrate, thereby depositing the vapor-depositing material on the surface of the substrate;
  (c) while moving the substrate in the third zone in the direction toward the evaporation source, allowing the vapor-depositing material evaporated from the evaporation source to be incident on the surface of the substrate in a third direction inclined on the same side as the first direction with respect to the normal to the surface of the substrate, thereby depositing the vapor-depositing material on the surface of the substrate; and
  (d) while moving the substrate in the fourth zone in the direction away from the evaporation source, allowing the vapor-depositing material evaporated from the evaporation source to be incident on the surface of the substrate in a fourth direction inclined oppositely to the first direction with respect to the normal to the surface of the substrate, thereby depositing the vapor-depositing material on the surface of the substrate, a first guide member for guiding the substrate is disposed between the first zone and the second zone so that the first zone and the second zone form a V-shape or a U-shape with the first guide member as a apex, the first and second zones including portions not contacting the first guide member, and a first shielding member is disposed between the first zone and the second zone for covering the first guide member from the evaporation source, the first shielding member being configured to prevent the vapor-depositing material evaporated from the evaporation surface from being incident along the normal direction to the substrate.

8. The method of claim 7, wherein the first shielding member is disposed so that deposition of the vapor-depositing material on the substrate is prevented between the first zone and the second zone.

9. The method of claim 7, wherein:
a second guide member for guiding the substrate is disposed between the third zone and the fourth zone so that the third zone and the fourth zone form a V-shape or a U-shape with the second guide member as a apex, the third and fourth zones including portions not contacting the second guide member and a second shielding member is disposed between the third zone and the fourth zone for covering the second guide member from the evaporation source, the second shielding member being configured to prevent the vapor-depositing material evaporated from the evaporation surface from being incident along the normal direction to the substrate.

10. The method of claim 7, further comprising a step (B) of transporting the substrate to the fourth zone, the third zone, the second zone and the first zone in this order, after the step (A), wherein:
the step (B) includes steps of:
(e) while moving the substrate in the fourth zone in the direction toward the evaporation source, allowing the vapor-depositing material evaporated from the evaporation source to be incident on the surface of the substrate in the fourth direction with respect to the normal to the surface of the substrate, thereby depositing the vapor-depositing material on the surface of the substrate;
(f) while moving the substrate in the third zone in the direction away from the evaporation source, allowing the vapor-depositing material evaporated from the evaporation source to be incident on the surface of the substrate in the third direction with respect to the normal to the surface of the substrate, thereby depositing the vapor-depositing material on the surface of the substrate;
(g) while moving the substrate in the second zone in the direction toward the evaporation source, allowing the vapor-depositing material evaporated from the evaporation source to be incident on the surface of the substrate in the second direction with respect to the normal to the surface of the substrate, thereby depositing the vapor-depositing material on the surface of the substrate; and
(h) while moving the substrate in the first zone in the direction away from the evaporation source, allowing the vapor-depositing material evaporated from the evaporation source to be incident on the surface of the substrate in the first direction with respect to the normal to the surface of the substrate, thereby depositing the vapor-depositing material on the surface of the substrate, and a ratio of vapor-depositing material deposition amounts in the first, second, third and fourth vapor deposition zones is adjusted so that a deposited body of the vapor-depositing material on the substrate is grown substantially in the normal direction to the surface of the substrate, as a whole.

11. The method of claim 10, wherein the ratio of vapor-depositing material deposition amounts in the first, second, third and fourth vapor deposition zones is 1:2:2:1.

12. The method of claim 10, wherein the step (A) and the step (B) are alternately performed a plurality of times.

13. The method of claim 10, further comprising, between the step (A) and the step (B):
a step (A') of inverting the surface of the substrate to be subjected to the vapor-depositing material and transporting the substrate to a fifth zone, a sixth zone, a seventh zone and an eighth zone in this order, the fifth to eighth zones being provided in the chamber so as not to overlap with one another with respect to the evaporation source; and a step (B') of transporting the substrate to the eighth zone, the seventh zone, the sixth zone and the fifth zone in this order after the step (A'), and then inverting the surface of the substrate to be subjected to the vapor-depositing material, wherein:
the step (A') includes steps of:
(a') while moving the substrate in the fifth zone in the direction toward the evaporation source, allowing the vapor-depositing material evaporated from the evaporation source to be incident an opposite surface to the surface of the substrate in a fifth direction inclined with respect to the normal to the surface of the substrate, thereby depositing the vapor-depositing material on the opposite surface of the substrate;
(b') while moving the substrate in the sixth zone in the direction away from the evaporation source, allowing the vapor-depositing material evaporated from the evaporation source to be incident on the opposite surface of the substrate in a sixth direction inclined oppositely to the fifth direction with respect to the normal to the surface of the substrate, thereby depositing the vapor-depositing material on the opposite surface of the substrate;
(c') while moving the substrate in the seventh zone in the direction toward the evaporation source, allowing the vapor-depositing material evaporated from the evaporation source to be incident on the opposite surface of the substrate in a seventh direction inclined on the same side as the fifth direction with respect to the normal to the surface of the substrate, thereby depositing the vapor-depositing material on the opposite surface of the substrate; and
(d') while moving the substrate in the eighth zone in the direction away from the evaporation source, allowing the vapor-depositing material evaporated from the evaporation source to be incident on the opposite surface of the substrate in an eighth direction inclined oppositely to the fifth direction with respect to the normal to the surface of the substrate, thereby depositing the vapor-depositing material on the opposite surface of the substrate,
the step (B') includes steps of:
(e') while moving the substrate in the eighth zone in the direction toward the evaporation source, allowing the vapor-depositing material evaporated from the evaporation source to be incident on the opposite surface of the substrate in the eighth direction with respect to the normal to the surface of the substrate, thereby depositing the vapor-depositing material on the opposite surface of the substrate;

(f') while moving the substrate in the seventh zone in the direction away from the evaporation source, allowing the vapor-depositing material evaporated from the evaporation source to be incident on the opposite surface of the substrate in the seventh direction with respect to the normal to the surface of the substrate, thereby depositing the vapor-depositing material on the opposite surface of the substrate;

(g') while moving the substrate in the sixth zone in the direction toward the evaporation source, allowing the vapor-depositing material evaporated from the evaporation source to be incident on the opposite surface of the substrate in the sixth direction with respect to the normal to the surface of the substrate, thereby depositing the vapor-depositing material on the opposite surface of the substrate; and (h') while moving the substrate in the fifth zone in the direction away from the evaporation source, allowing the vapor-depositing material evaporated from the evaporation source to be incident on the opposite surface of the substrate in the fifth direction with respect to the normal to the surface of the substrate, thereby depositing the vapor-depositing material on the opposite surface of the substrate.

14. The method of claim 13, wherein a ratio of vapor-depositing material deposition amounts in the fifth, sixth, seventh and eighth vapor deposition zones is adjusted so that the deposited body of the vapor-depositing material on the substrate is grown substantially in the normal direction to the surface of the substrate, as a whole.

15. The method of claim 14, wherein the ratio of vapor-depositing material deposition amounts in the fifth, sixth, seventh and eighth vapor deposition zones is 1:2:2:1.

16. The method of claim 7, wherein the vapor-depositing material is an active material for battery electrodes.

17. The method of claim 16, wherein the substrate is a metal foil.

18. A method for continuously producing a film containing a vapor-depositing material on a substrate, using a roll-to-roll system vapor deposition device including a chamber, an evaporation source located in the chamber for evaporating the vapor-depositing material, and a transportation section located in the chamber for transporting the substrate of a sheet type, by moving the substrate by the transportation section, the method comprising:

a step (A) of transporting the substrate to a first zone and a second zone in this order, and then transporting the substrate to a third zone and a fourth zone in this order, the first to fourth zones being provided in the chamber so as not to overlap with one another with respect to the evaporation source; wherein:

the vapor-depositing material is an active material for battery electrodes, the step (A) includes steps of:

(a) while moving the substrate in the first zone in a direction toward the evaporation source, allowing the vapor-depositing material evaporated from the evaporation source to be incident on a surface of the substrate in a first direction inclined with respect to the normal to the surface of the substrate, thereby depositing the vapor-depositing material on the surface of the substrate;

(b) while moving the substrate in the second zone in a direction away from the evaporation source, allowing the vapor-depositing material evaporated from the evaporation source to be incident on the surface of the substrate in a second direction inclined oppositely to the first direction with respect to the normal to the surface of the substrate, thereby depositing the vapor-depositing material on the surface of the substrate;

(c) while moving the substrate in the third zone in the direction toward the evaporation source, allowing the vapor-depositing material evaporated from the evaporation source to be incident on the surface of the substrate in a third direction inclined on the same side as the first direction with respect to the normal to the surface of the substrate, thereby depositing the vapor-depositing material on the surface of the substrate; and (d) while moving the substrate in the fourth zone in the direction away from the evaporation source, allowing the vapor-depositing material evaporated from the evaporation source to be incident on the surface of the substrate in a fourth direction inclined oppositely to the first direction with respect to the normal to the surface of the substrate, thereby depositing the vapor-depositing material on the surface of the substrate.

19. The method of claim 18, further comprising a step (B) of transporting the substrate to the fourth zone, the third zone, the second zone and the first zone in this order, after the step (A), wherein:

the step (B) includes steps of:

(e) while moving the substrate in the fourth zone in the direction toward the evaporation source, allowing the vapor-depositing material evaporated from the evaporation source to be incident on the surface of the substrate in the fourth direction with respect to the normal to the surface of the substrate, thereby depositing the vapor-depositing material on the surface of the substrate;

(f) while moving the substrate in the third zone in the direction away from the evaporation source, allowing the vapor-depositing material evaporated from the evaporation source to be incident on the surface of the substrate in the third direction with respect to the normal to the surface of the substrate, thereby depositing the vapor-depositing material on the surface of the substrate;

(g) while moving the substrate in the second zone in the direction toward the evaporation source, allowing the vapor-depositing material evaporated from the evaporation source to be incident on the surface of the substrate in the second direction with respect to the normal to the surface of the substrate, thereby depositing the vapor-depositing material on the surface of the substrate; and (h) while moving the substrate in the first zone in the direction away from the evaporation source, allowing the vapor-depositing material evaporated from the evaporation source to be incident on the surface of the substrate in the first direction with respect to the normal to the surface of the substrate, thereby depositing the vapor-depositing material on the surface of the substrate, and a ratio of vapor-depositing material deposition amounts in the first, second, third and fourth vapor deposition zones is adjusted so that a deposited body of the vapor-depositing material on the substrate is grown substantially in the normal direction to the surface of the substrate, as a whole.

20. The method of claim 19, wherein the ratio of vapor-depositing material deposition amounts in the first, second, third and fourth vapor deposition zones is 1:2:2:1.

21. The method of claim 19, wherein the step (A) and the step (B) are alternately performed a plurality of times.

22. The method of claim 19, further comprising, between the step (A) and the step (B):
- a step (A') of inverting the surface of the substrate to be subjected to the vapor-depositing material and transporting the substrate to a fifth zone, a sixth zone, a seventh zone and an eighth zone in this order, the fifth to eighth zones being provided in the chamber so as not to overlap with one another with respect to the evaporation source; and
- a step (B') of transporting the substrate to the eighth zone, the seventh zone, the sixth zone and the fifth zone in this order after the step (A'), and then inverting the surface of the substrate to be subjected to the vapor-depositing material, wherein:

the step (A') includes steps of:
- (a') while moving the substrate in the fifth zone in the direction toward the evaporation source, allowing the vapor-depositing material evaporated from the evaporation source to be incident an opposite surface to the surface of the substrate in a fifth direction inclined with respect to the normal to the surface of the substrate, thereby depositing the vapor-depositing material on the opposite surface of the substrate;
- (b') while moving the substrate in the sixth zone in the direction away from the evaporation source, allowing the vapor-depositing material evaporated from the evaporation source to be incident on the opposite surface of the substrate in a sixth direction inclined oppositely to the fifth direction with respect to the normal to the surface of the substrate, thereby depositing the vapor-depositing material on the opposite surface of the substrate;
- (c') while moving the substrate in the seventh zone in the direction toward the evaporation source, allowing the vapor-depositing material evaporated from the evaporation source to be incident on the opposite surface of the substrate in a seventh direction inclined on the same side as the fifth direction with respect to the normal to the surface of the substrate, thereby depositing the vapor-depositing material on the opposite surface of the substrate; and
- (d') while moving the substrate in the eighth zone in the direction away from the evaporation source, allowing the vapor-depositing material evaporated from the evaporation source to be incident on the opposite surface of the substrate in an eighth direction inclined oppositely to the fifth direction with respect to the normal to the surface of the substrate, thereby depositing the vapor-depositing material on the opposite surface of the substrate, and the step (B') includes steps of:
- (e') while moving the substrate in the eighth zone in the direction toward the evaporation source, allowing the vapor-depositing material evaporated from the evaporation source to be incident on the opposite surface of the substrate in the eighth direction with respect to the normal to the surface of the substrate, thereby depositing the vapor-depositing material on the opposite surface of the substrate;
- (f') while moving the substrate in the seventh zone in the direction away from the evaporation source, allowing the vapor-depositing material evaporated from the evaporation source to be incident on the opposite surface of the substrate in the seventh direction with respect to the normal to the surface of the substrate, thereby depositing the vapor-depositing material on the opposite surface of the substrate;
- (g') while moving the substrate in the sixth zone in the direction toward the evaporation source, allowing the vapor-depositing material evaporated from the evaporation source to be incident on the opposite surface of the substrate in the sixth direction with respect to the normal to the surface of the substrate, thereby depositing the vapor-depositing material on the opposite surface of the substrate; and
- (h') while moving the substrate in the fifth zone in the direction away from the evaporation source, allowing the vapor-depositing material evaporated from the evaporation source to be incident on the opposite surface of the substrate in the fifth direction with respect to the normal to the surface of the substrate, thereby depositing the vapor-depositing material on the opposite surface of the substrate.

23. The method of claim 22, wherein a ratio of vapor-depositing material deposition amounts in the fifth, sixth, seventh and eighth vapor deposition zones is adjusted so that the deposited body of the vapor-depositing material on the substrate is grown substantially in the normal direction to the surface of the substrate, as a whole.

24. The method of claim 23, wherein the ratio of vapor-depositing material deposition amounts in the fifth, sixth, seventh and eighth vapor deposition zones is 1:2:2:1.

25. The method of claim 18, wherein the substrate is a metal foil.

* * * * *